(12) United States Patent
Hsu et al.

(10) Patent No.: US 12,519,067 B2
(45) Date of Patent: Jan. 6, 2026

(54) TWO-PIECE TYPE STIFFENER STRUCTURE WITH BEVELED SURFACE FOR DELAMINATION REDUCTION AND METHODS FOR FORMING THE SAME

(71) Applicant: Taiwan Semiconductor Manufacturing Company Limited, Hsinchu (TW)

(72) Inventors: Chia-Kuei Hsu, Hsinchu (TW); Ming-Chih Yew, Hsinchu (TW); Li-Ling Liao, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 644 days.

(21) Appl. No.: 17/895,306

(22) Filed: Aug. 25, 2022

(65) Prior Publication Data
US 2024/0071949 A1    Feb. 29, 2024

(51) Int. Cl.
*H01L 23/00* (2006.01)
*H01L 23/498* (2006.01)
*H01L 25/065* (2023.01)

(52) U.S. Cl.
CPC ...... *H01L 23/562* (2013.01); *H01L 23/49816* (2013.01); *H01L 23/49833* (2013.01); *H01L 23/49838* (2013.01); *H01L 24/16* (2013.01); *H01L 24/32* (2013.01); *H01L 24/73* (2013.01); *H01L 24/96* (2013.01); *H01L 24/97* (2013.01); *H01L 25/0652* (2013.01); *H01L 23/49822* (2013.01); *H01L 2224/16145* (2013.01);
(Continued)

(58) Field of Classification Search
CPC ............ H01L 23/562; H01L 23/49816; H01L 23/49833; H01L 23/49838
See application file for complete search history.

(56) References Cited

U.S. PATENT DOCUMENTS 5,173,766 A * 12/1992 Long ...................... H01L 23/24
257/668
7,585,702 B1 * 9/2009 Wang .................. H01L 23/3128
257/706
(Continued)

FOREIGN PATENT DOCUMENTS

CN        114284250 A * 4/2022 ............. H01L 25/50
CN        115565961 A * 1/2023 ......... H01L 25/0655
(Continued)

*Primary Examiner* — Laura M Menz
(74) *Attorney, Agent, or Firm* — The Marbury Law Group, PLLC

(57) ABSTRACT

Devices and methods for forming a chip package structure including a package substrate, a first adhesive layer attached to a top surface of the package substrate, and a beveled stiffener structure attached to the package substrate. The beveled stiffener structure may include a bottom portion including a tapered top surface, in which a bottom surface of the bottom portion is in contact with the first adhesive layer, a second adhesive layer attached to the tapered top surface, and a top portion including a tapered bottom surface, in which the tapered bottom surface is in contact with the second adhesive layer. The tapered top surface and the tapered bottom surface have a taper angle between 5 degrees and 60 degrees with respect to a top surface of the package substrate.

20 Claims, 46 Drawing Sheets

(52) U.S. Cl.
CPC .............. *H01L 2224/16227* (2013.01); *H01L 2224/16238* (2013.01); *H01L 2224/32225* (2013.01); *H01L 2224/73204* (2013.01); *H01L 2224/95001* (2013.01); *H01L 2924/1432* (2013.01); *H01L 2924/1437* (2013.01); *H01L 2924/3511* (2013.01); *H01L 2924/35121* (2013.01)

(56) References Cited

U.S. PATENT DOCUMENTS

| | | | | |
|---|---|---|---|---|
| 7,741,160 | B1 * | 6/2010 | Wang | H01L 21/50 438/122 |
| 8,212,353 | B1 * | 7/2012 | Wang | H01L 23/3128 257/E23.101 |
| 8,614,502 | B2 * | 12/2013 | Lin | H01L 23/5389 257/676 |
| 10,424,527 | B2 * | 9/2019 | Sikka | H01L 24/32 |
| 10,764,996 | B1 * | 9/2020 | Boja | H01L 25/0652 |
| 11,302,592 | B2 * | 4/2022 | Pan | H01L 23/3672 |
| 11,476,205 | B2 * | 10/2022 | Tsai | H01L 21/561 |
| 11,521,939 | B2 * | 12/2022 | Chen | H01L 23/4334 |
| 11,742,322 | B2 * | 8/2023 | Yew | H01L 23/3128 257/777 |
| 11,784,130 | B2 * | 10/2023 | Lin | H01L 23/5386 257/668 |
| 11,824,032 | B2 * | 11/2023 | Chen | H01L 21/568 |
| 12,027,471 | B2 * | 7/2024 | Choi | H01L 25/105 |
| 12,170,236 | B2 * | 12/2024 | Chen | H01L 23/18 |
| 12,255,156 | B2 * | 3/2025 | Chen | H01L 23/562 |
| 2002/0135065 | A1 * | 9/2002 | Zhao | H01L 23/16 257/E23.105 |
| 2003/0057550 | A1 * | 3/2003 | Zhao | H01L 23/49833 257/734 |
| 2005/0280127 | A1 * | 12/2005 | Zhao | H01L 24/49 257/E23.105 |
| 2005/0280139 | A1 * | 12/2005 | Zhao | H01L 23/24 257/E23.092 |
| 2013/0032938 | A1 * | 2/2013 | Lin | H01L 23/49827 257/737 |
| 2017/0179043 | A1 * | 6/2017 | Xu | H01L 23/16 |
| 2019/0109122 | A1 * | 4/2019 | Ong | H01L 25/16 |
| 2019/0148260 | A1 * | 5/2019 | Sikka | H01L 23/3675 257/713 |
| 2020/0105640 | A1 * | 4/2020 | Chiu | H01L 23/40 |
| 2022/0028800 | A1 * | 1/2022 | Chen | H01L 23/16 |
| 2022/0302064 | A1 * | 9/2022 | Chen | H01L 25/0655 |
| 2022/0367301 | A1 * | 11/2022 | Lo | H01L 21/4846 |
| 2023/0046098 | A1 * | 2/2023 | Kim | H01L 23/562 |
| 2023/0063295 | A1 * | 3/2023 | Yang | H01L 23/36 |
| 2023/0064957 | A1 * | 3/2023 | Lin | H01L 21/4857 |
| 2023/0070053 | A1 * | 3/2023 | Chen | H01L 23/49822 |
| 2023/0148220 | A1 * | 5/2023 | Verhaverbeke | H01L 25/105 257/690 |
| 2023/0307379 | A1 * | 9/2023 | Geng | H01L 23/16 |
| 2023/0307381 | A1 * | 9/2023 | Chen | H01L 21/563 |
| 2023/0317577 | A1 * | 10/2023 | Hsu | H01L 25/50 |
| 2023/0326881 | A1 * | 10/2023 | Chen | H01L 21/4853 257/730 |
| 2023/0352447 | A1 * | 11/2023 | Yew | H01L 21/561 |
| 2023/0378036 | A1 * | 11/2023 | Wang | H01L 23/562 |
| 2023/0387061 | A1 * | 11/2023 | Chen | H01L 24/92 |
| 2023/0395492 | A1 * | 12/2023 | Lai | H01L 23/3128 |
| 2023/0395563 | A1 * | 12/2023 | Hsu | H01L 23/562 |
| 2023/0402404 | A1 * | 12/2023 | Hsu | H01L 23/16 |
| 2024/0021529 | A1 * | 1/2024 | Lin | H01L 23/5383 |
| 2024/0063087 | A1 * | 2/2024 | Kuo | H01L 23/42 |
| 2024/0063208 | A1 * | 2/2024 | Lee | H01L 23/562 |
| 2024/0071890 | A1 * | 2/2024 | Lin | H01L 23/49816 |
| 2024/0071947 | A1 * | 2/2024 | Tsai | H01L 23/053 |
| 2024/0071949 | A1 * | 2/2024 | Hsu | H01L 24/73 |
| 2024/0096820 | A1 * | 3/2024 | Kim | H01L 23/562 |
| 2024/0113030 | A1 * | 4/2024 | Noguchi | H01L 23/481 |
| 2024/0274503 | A1 * | 8/2024 | Lin | H01L 25/0657 |
| 2024/0297087 | A1 * | 9/2024 | Chang | H01L 21/568 |
| 2024/0297089 | A1 * | 9/2024 | Lai | H01L 23/5385 |
| 2025/0070072 | A1 * | 2/2025 | Kim | H01L 21/561 |
| 2025/0070084 | A1 * | 2/2025 | Lee | H01L 25/0655 |
| 2025/0149524 | A1 * | 5/2025 | Fan | H01L 25/105 |

FOREIGN PATENT DOCUMENTS

| | | | | |
|---|---|---|---|---|
| CN | 115588662 A | * | 1/2023 | ......... H01L 25/0655 |
| CN | 115732424 A | * | 3/2023 | ......... H01L 25/0655 |
| JP | WO2019069707 A1 | * | 11/2020 | ............ C12M 1/34 |
| KR | 20160004106 A | * | 1/2016 | ........ H01L 23/49811 |
| KR | 102339021 B1 | * | 12/2021 | .......... H10H 20/856 |
| KR | 20230025132 A | * | 2/2023 | ........... H01L 25/165 |
| KR | 20240038851 A | * | 3/2024 | ............ H10B 80/00 |
| TW | 202401685 A | * | 1/2024 | ............ H01L 24/20 |
| TW | 202410337 A | * | 3/2024 | ........ H01L 21/6835 |
| WO | WO-0022674 A1 | * | 4/2000 | ........ H01L 23/4985 |
| WO | WO-2022040052 A1 | * | 2/2022 | .......... C23C 16/4585 |

* cited by examiner

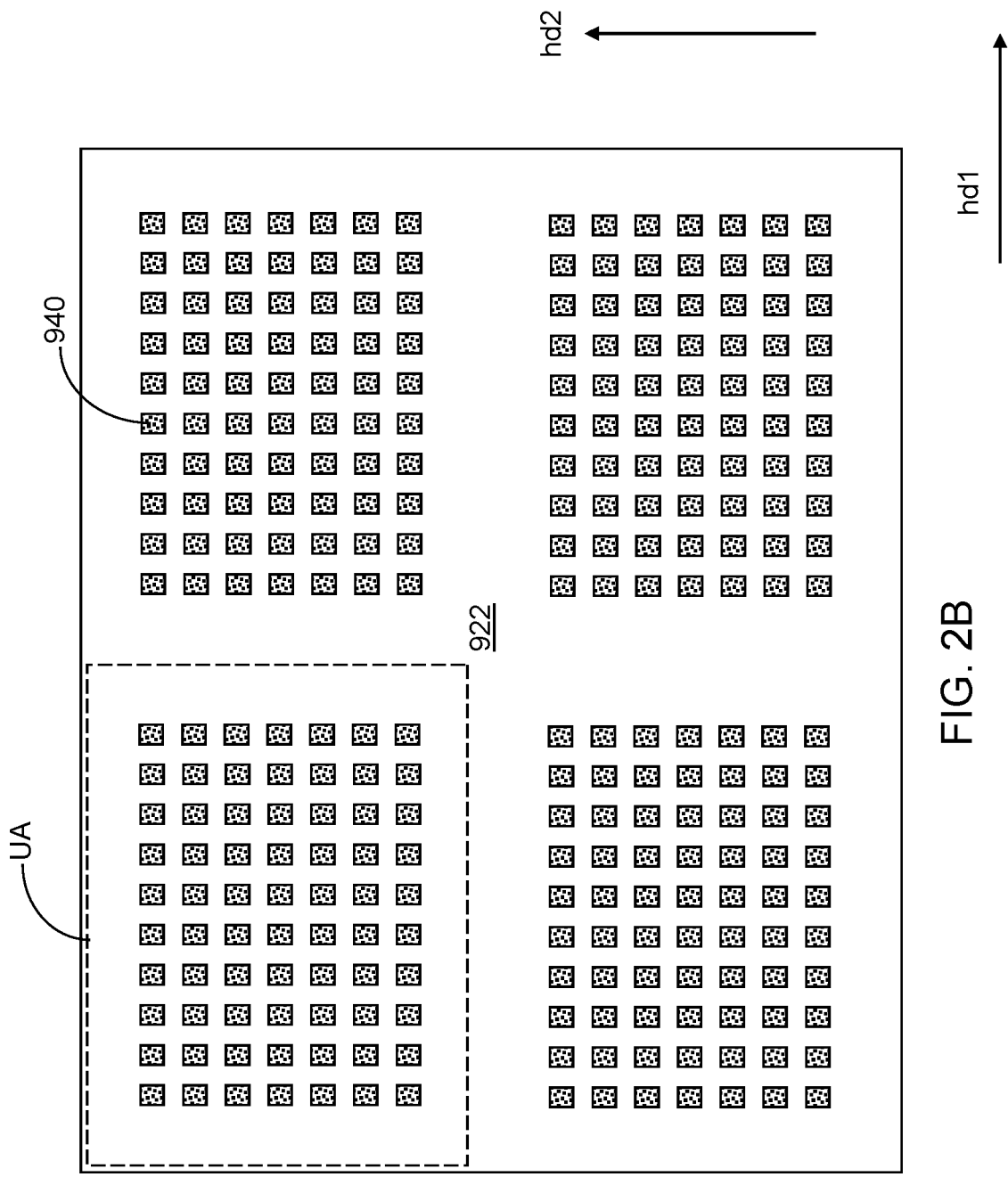

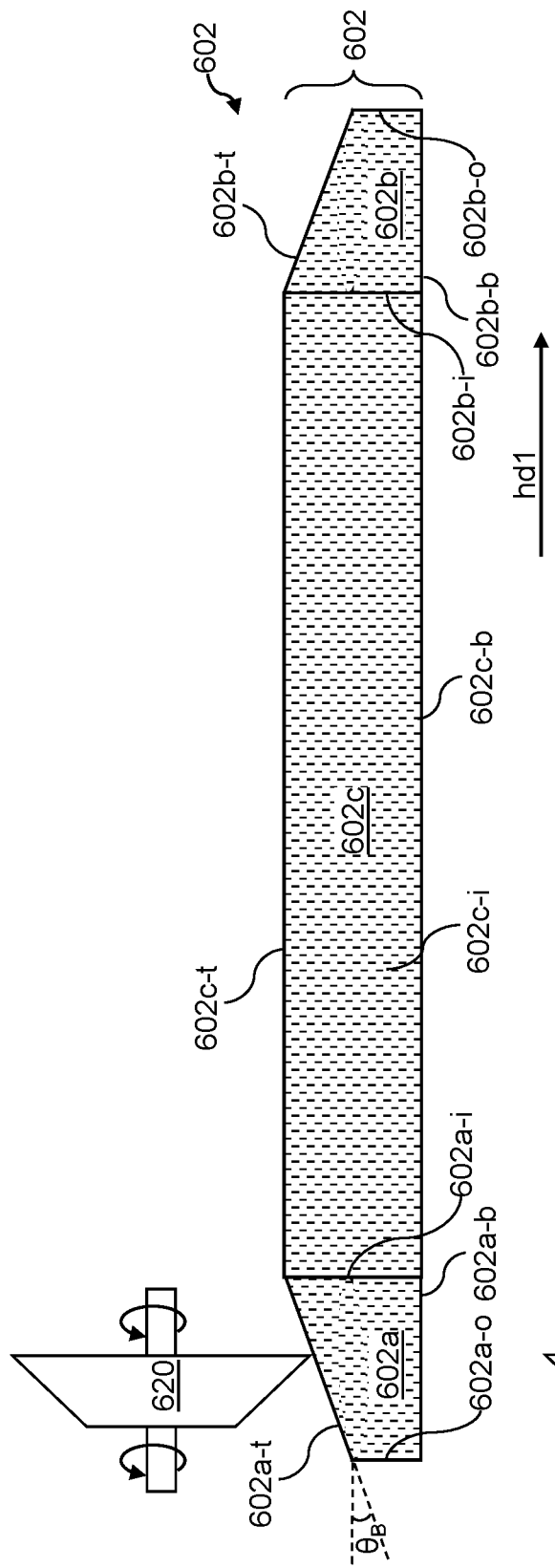
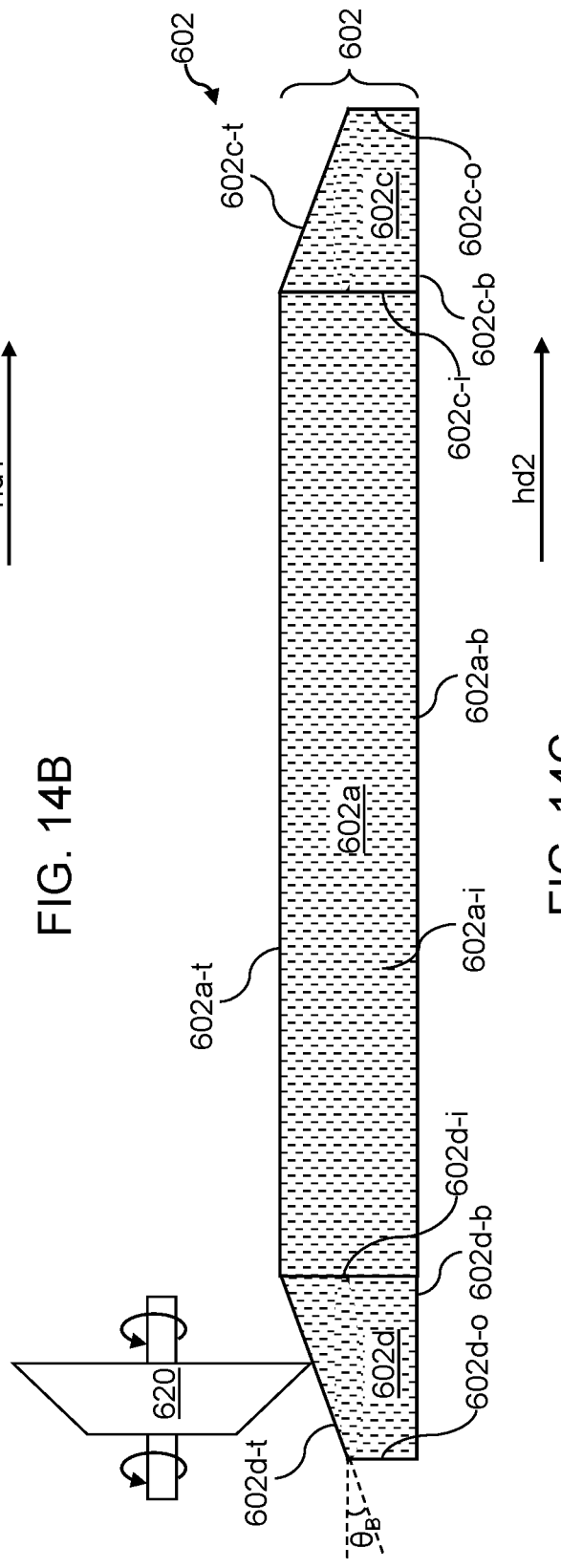
FIG. 14B
FIG. 14C

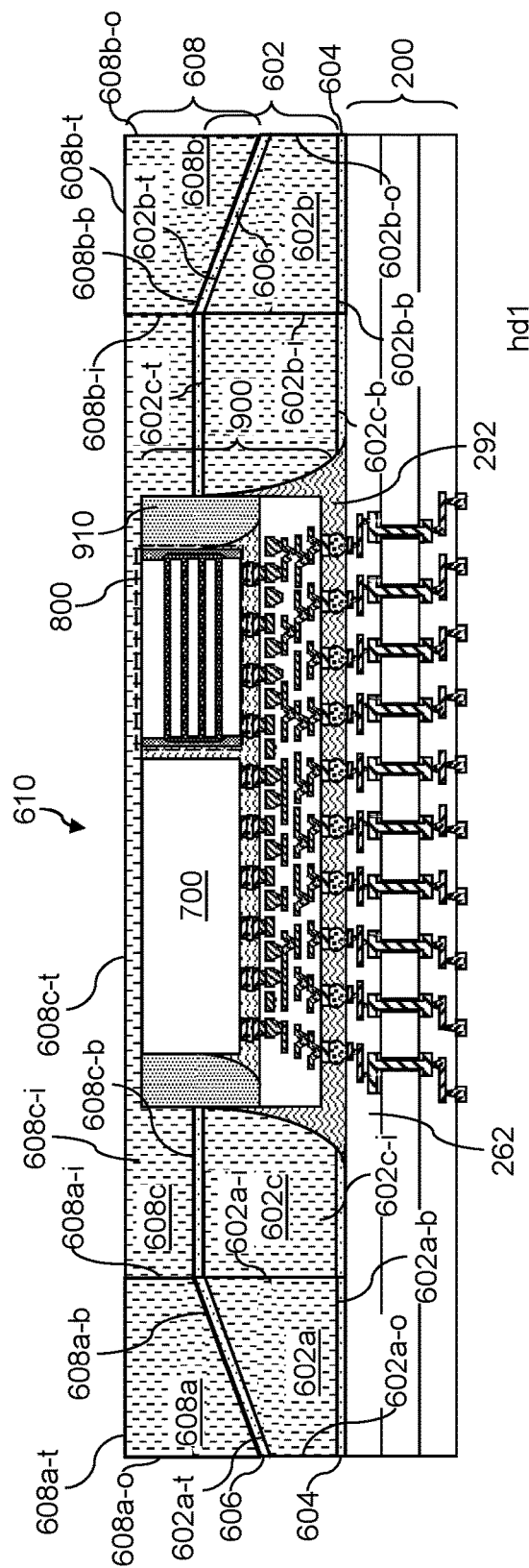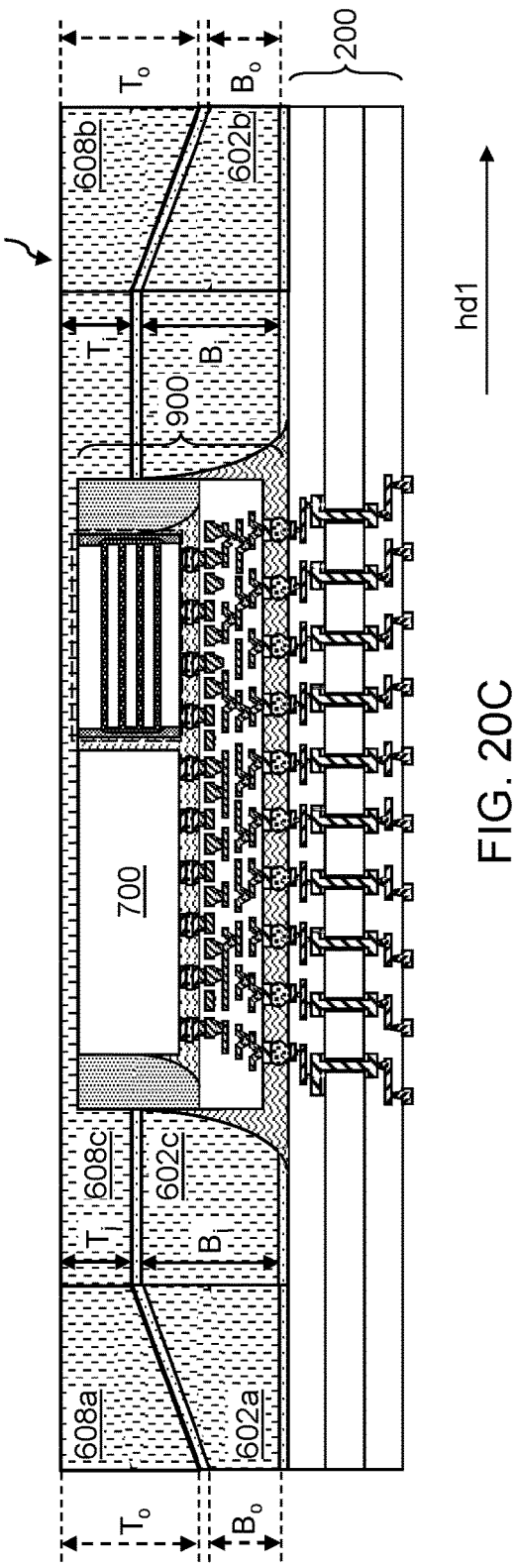
FIG. 20B
FIG. 20C

TWO-PIECE TYPE STIFFENER STRUCTURE WITH BEVELED SURFACE FOR DELAMINATION REDUCTION AND METHODS FOR FORMING THE SAME

BACKGROUND

Semiconductor dies within chip package structures are becoming increasingly complex, requiring more power and increased thermal regulation mechanisms to operate efficiently and at higher frequencies. The increasing power consumption of semiconductor dies within chip package structures may cause operating temperatures to rise, thereby increasing temperatures in and around proximate components within the chip package structure. The increased temperatures create greater risk for warping and delamination, which may cause cracks, breaks, and/or disconnects within wiring interconnect layers, semiconductor dies, and accompanying components within a fan-out package and package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a top-down view of the intermediate structure of FIG. 2A.

FIG. 14B is a vertical cross-sectional view of the bottom portion of the stiffener structure along the vertical plane B-B' of FIG. 14A according to an embodiment of the present disclosure.

FIG. 14C is a vertical cross-sectional view of the bottom portion of the stiffener structure along the vertical plane C-C' of FIG. 14A according to an embodiment of the present disclosure.

FIGS. 20B and 20C are vertical cross-sectional views of the intermediate structure along the vertical plane B-B' of FIG. 20A according to an embodiment of the present disclosure.

FIG. 26A is a top-down view of a bottom portion of a stiffener structure according to an embodiment of the present disclosure. FIG. 26B is a vertical cross-sectional view of the bottom portion of the stiffener structure along the vertical plane B-B' of FIG. 26A according to an embodiment of the present disclosure.

FIG. 27A is a bottom-up view of a top portion of a stiffener structure according to an embodiment of the present disclosure. FIG. 27B is a vertical cross-sectional view of the top portion of the stiffener structure along the vertical plane B-B' of FIG. 27A according to an embodiment of the present disclosure.

DETAILED DESCRIPTION

Figure 1A:
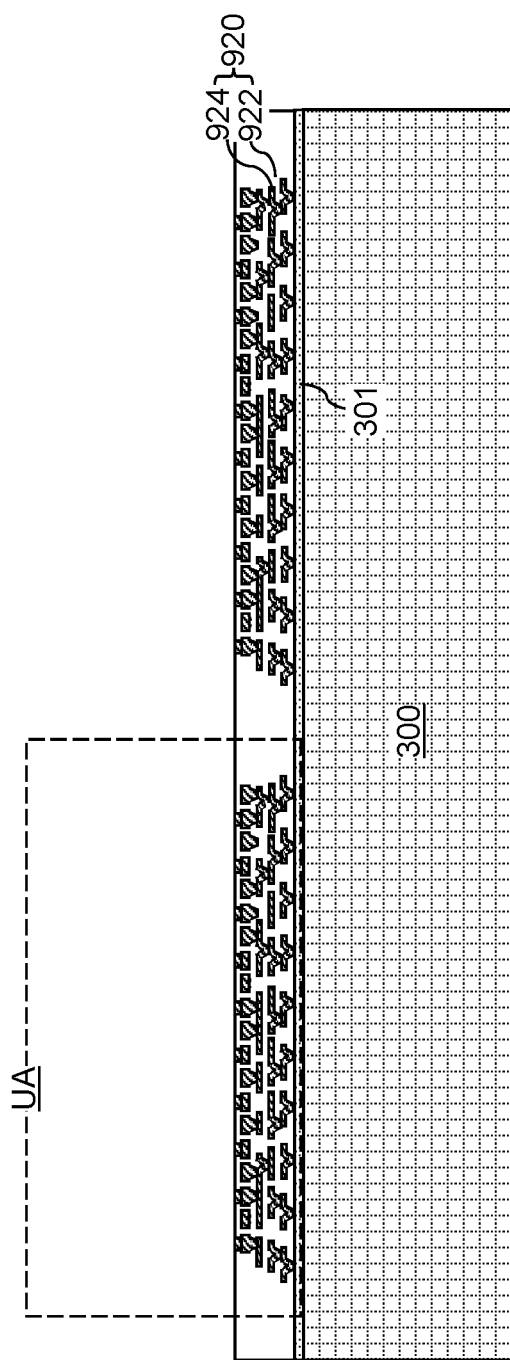
FIG. 1A is a vertical cross-sectional view of a region of an intermediate structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of the present disclosure are directed to chip package structures, and particularly to beveled stiffener structures within chip package structures. Generally, the various embodiment methods and structures may be used to provide a chip package structure such as a fan-out wafer level package (FOWLP) and fan-out panel level package (FOPLP). While the various embodiments of the present disclosure are described using an FOWLP configuration, implementation of the various embodiment methods and structures in an FOPLP configuration or any other fan-out package configuration are within the contemplated scope of disclosure. The various embodiment chip package structures may have a beveled stiffener structure attached to a package substrate and surrounding a fan-out package or chip-on-wafer (CoW).

A stiffener structure may be implemented on a package substrate to control warpage and reduce delamination risk. In various embodiments, the beveled stiffener structure may include a bottom portion including a tapered top surface, an adhesive layer attached to the tapered top surface, and a top portion including a tapered bottom surface, in which the tapered bottom surface is in contact with a top surface of the second adhesive layer. The resulting pairing of the bottom portion and top portion of the beveled stiffener structure creates an angled, or tapered, region, thereby increasing the surface area upon which the adhesive layer may be applied. The increased surface area allows more adhesive material to be deposited, therefore increasing the strength of the bond between the bottom portion and the top portion and reducing the risk of delamination. In some embodiments, the bottom portion may have a different coefficient of thermal expansion (CTE) than the top portion. For example, a CTE of the bottom portion may be less than a CTE of the top portion. Optimizing the CTE of the bottom portion with respect to the CTE of the top portion may reduce risk of delamination of the adhesive layers attached to the stiffener structure, thereby allowing the stiffener structure to provide increased structural support for the fan-out package and the package substrate. Furthermore, the angled tapered surfaces of the bottom portion and top portion may decrease shear stress in a lateral, and therefore decrease delamination risk, by providing an angled surface upon which shear stress may be partially exerted.

Figure 1B:
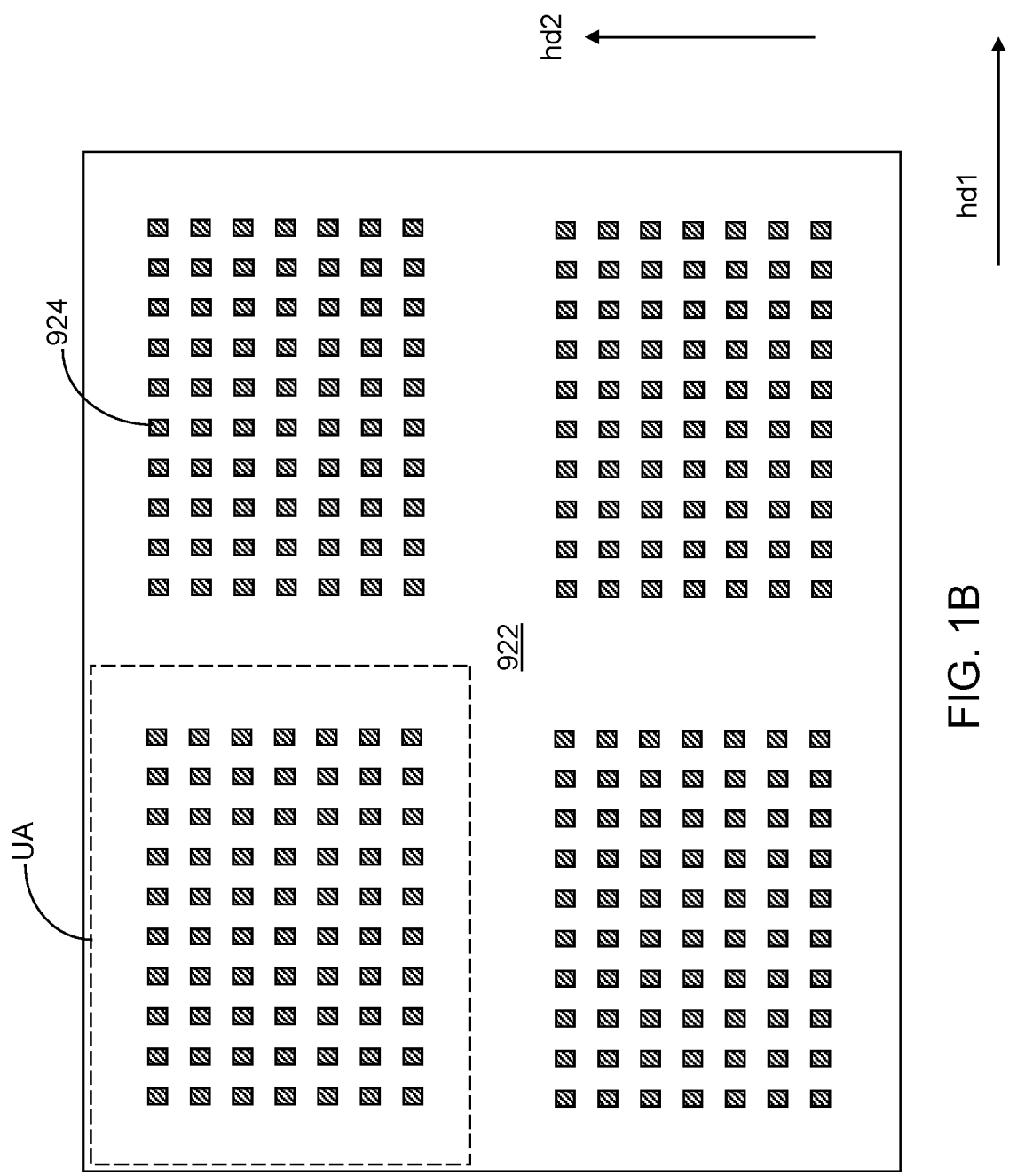
FIG. 1B is a top-down view of the structure of FIG. 1A.

FIG. 1A is a vertical cross-sectional view of a region of a structure that includes a first carrier substrate and redistribution structures according to an embodiment of the present disclosure. FIG. 1B is a top-down view of the structure of FIG. 1A. Referring to FIGS. 1A and 1B, an intermediate structure according to an embodiment of the present disclosure includes a first carrier substrate 300 and redistribution structures 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion Release Coating (LTHC) Ink™ that is commercially available. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, a redistribution structure 920 may be formed within each unit area UA, which is the area of a repetition unit that is repeated in a two-dimensional array over the first carrier substrate 300. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. A periodic two-dimensional array (such as a rectangular array) of redistribution structures 920 may be formed over the first carrier substrate 300. Each redistribution structure 920 may be formed within a unit area UA, which is a unit of repetition for a two-dimensional array of redistribution structures 920. The layer including all redistribution structures 920 is herein referred to as a redistribution structure layer. The redistribution structure layer includes a two-dimensional array of redistribution structures 920. In one embodiment, the two-dimensional array of redistribution structures 920 may be a rectangular periodic two-dimensional array of redistribution structures 920 having a first periodicity along a first horizontal direction hd1 and having a second periodicity along a second horizontal direction hd2 that is perpendicular to the first horizontal direction hd1. In some embodiments, the redistribution wiring interconnects 924 may include alternately stacked wiring portions and via structures.

Figure 2A:
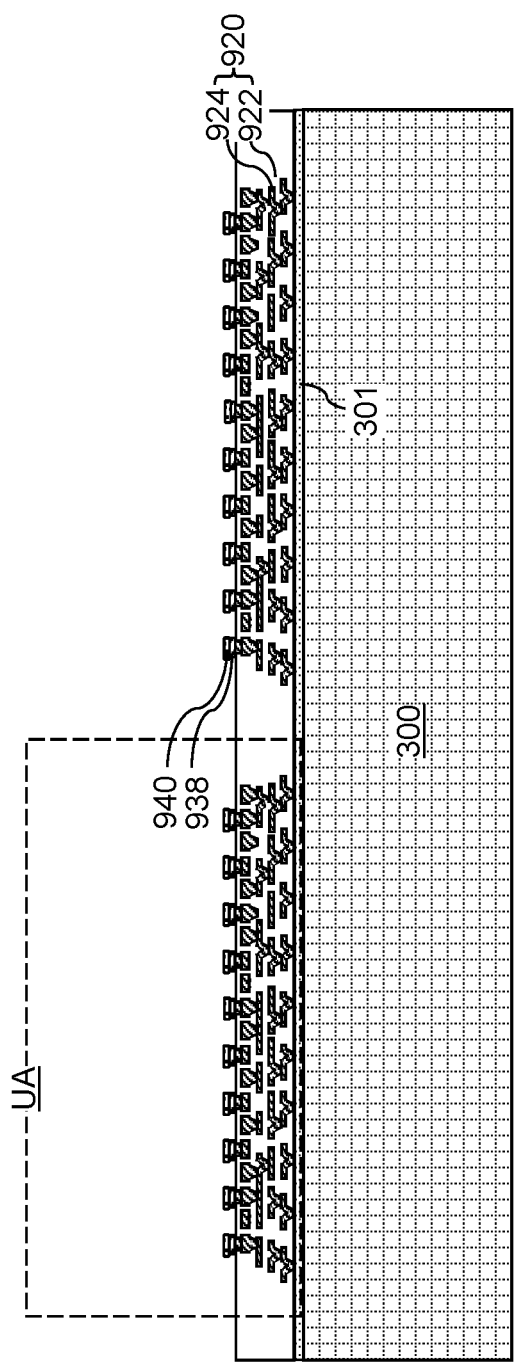
FIG. 2A is vertical cross-sectional view of a region of the intermediate structure after formation of redistribution-side metal pad structures and first solder material portions according to an embodiment of the present disclosure.

FIG. 2A is vertical cross-sectional view of a region of the structure after formation of redistribution-side metal pad structures and first solder material portions according to an embodiment of the present disclosure. FIG. 2B is a top-down view of the structure of FIG. 2A. Referring to FIGS. 2A and 2B, at least one metallic material and a first material may be sequentially deposited over the front-side surface of the redistribution structures 920. The at least one metallic material comprises a material that may be used for metallic pads, such as copper. The thickness of the at least one metallic material may be in a range from 5 microns to 60 microns, such as from 10 microns to 30 microns, although lesser and greater thicknesses may also be used. The first material may comprise a first material suitable for C2 bonding, i.e., for microbump bonding. The thickness of the first material may be in a range from 2 microns to 30 microns, such as from 4 microns to 15 microns, although lesser and greater thicknesses may also be used.

The first material and the at least one metallic material may be patterned into discrete arrays of first solder material portions 940 and arrays of metal pad structures, which are herein referred to as arrays of redistribution-side metal pad structures 938. Each array of redistribution-side metal pad structures 938 is formed within a respective unit area UA. Each array of first solder material portions 940 is formed within a respective unit area UA. Each first solder material portion 940 may have a same horizontal cross-sectional shape as an underlying redistribution-side metal pad structures 938.

In one embodiment, the redistribution-side metal pad structures 938 may include, and/or may consist essentially of, copper or a copper-containing alloy. Other suitable materials are within the contemplated scope of disclosure. The thickness of the redistribution-side metal pad structures 938 may be in a range from 5 microns to 60 microns, although lesser or greater thicknesses may also be used. The redistribution-side metal pad structures 938 may have horizontal cross-sectional shapes of rectangles, rounded rectangles, circles, regular polygons, irregular polygons, or any other two-dimensional curvilinear shape having a closed periphery. In one embodiment, redistribution-side metal pad structures 938 may be configured for microbump bonding (i.e., C2 bonding), and may have a thickness in a range from 10 microns to 30 microns, although lesser or greater thicknesses may also be used. In this embodiment, each array of redistribution-side metal pad structures 938, such as copper pillars or under bump metallurgies (UBM), may be portions of an array of microbumps having a lateral dimension in a range from 10 microns to 25 microns, and having a pitch in a range from 20 microns to 50 microns.

Figure 3A:
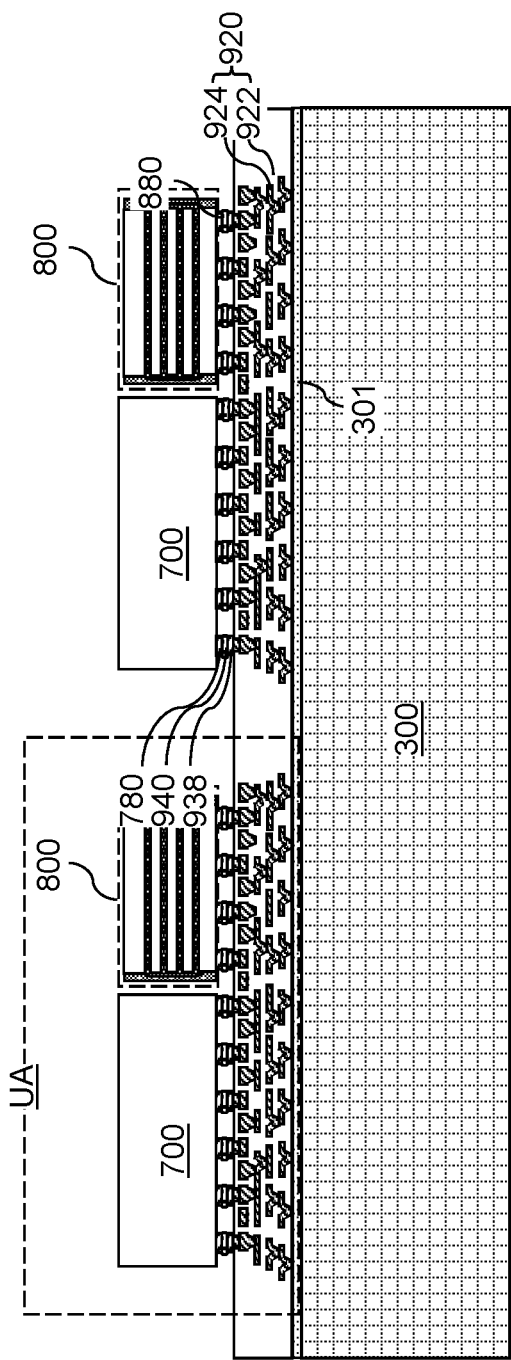
FIG. 3A is a vertical cross-sectional view of a region the intermediate structure after attaching semiconductor dies according to an embodiment of the present disclosure.
Figure 3B:
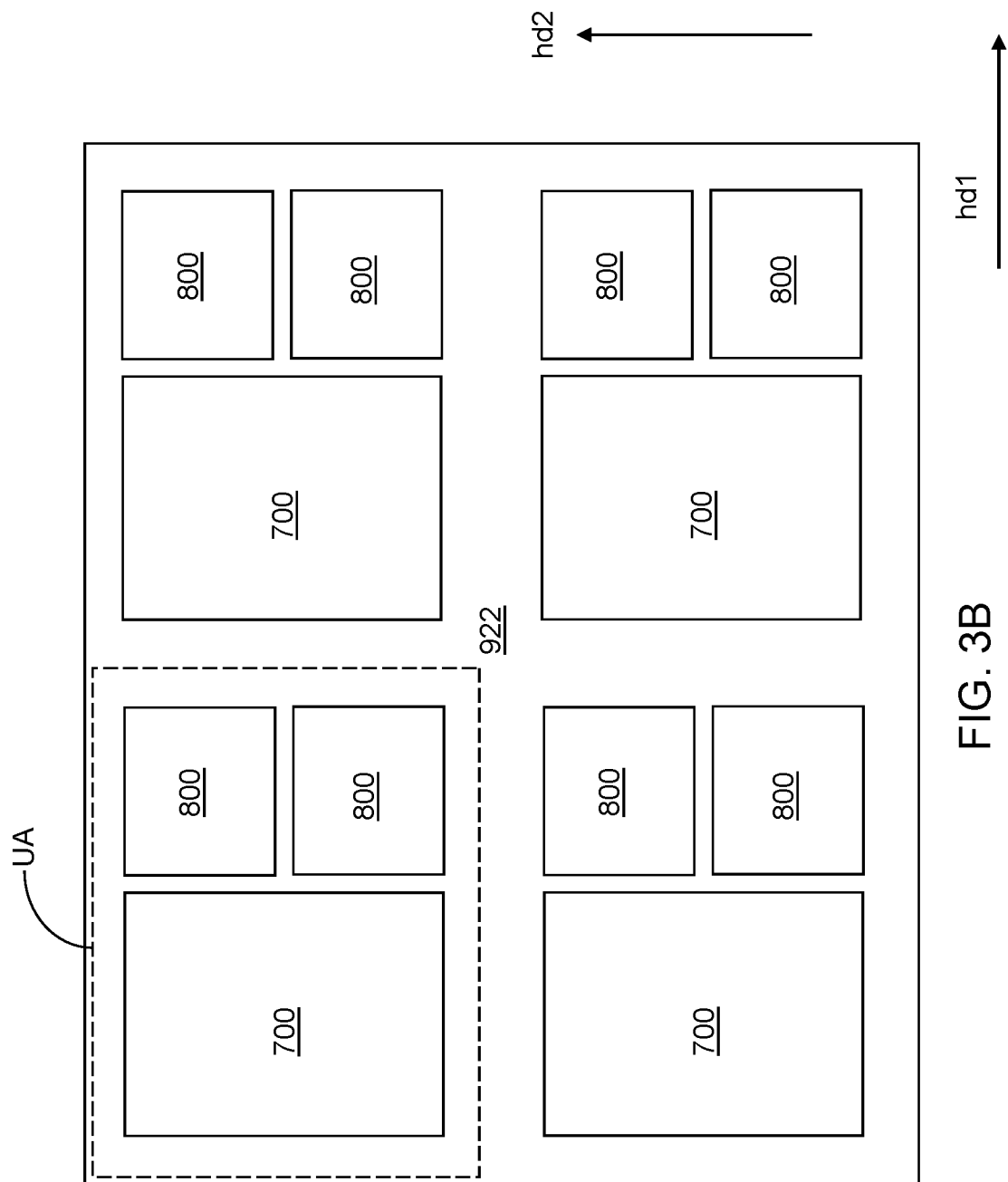
FIG. 3B is a top-down view of the intermediate structure of FIG. 3A.
Figure 3C:
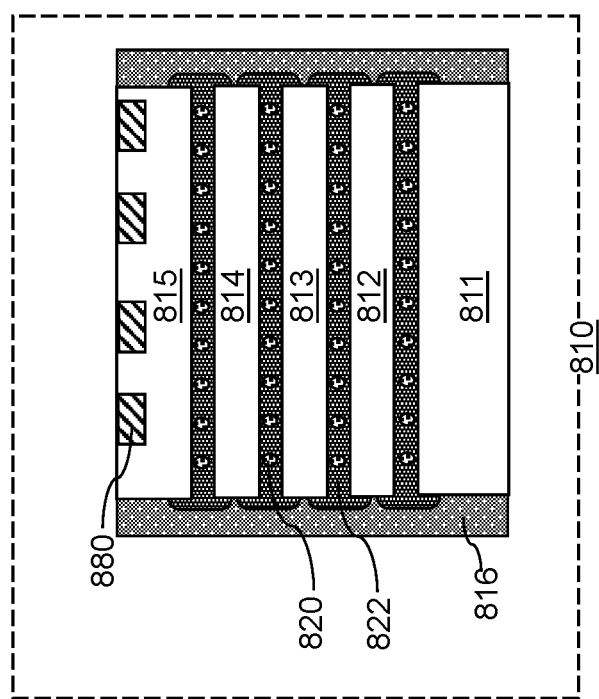
FIG. 3C is a magnified vertical cross-sectional view of a high bandwidth memory die.

FIG. 3A is a vertical cross-sectional view of a region the structure after attaching semiconductor dies according to an embodiment of the present disclosure. FIG. 3B is a top-down view of the structure of FIG. 3A. FIG. 3C is a magnified vertical cross-sectional view of a high bandwidth memory die.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random-access memory dies. In one embodiment, the at least one semiconductor die (700, 800) may include at least one system-on-chip (SoC) die and a high bandwidth memory (HBM) die including a vertical stack of static random-access memory (SRAM) dies that are interconnected to one another through microbumps and are laterally surrounded by an epoxy molding material enclosure frame.

Referring to FIGS. 3A and 3C, each semiconductor die (700, 800) may comprise a respective array of die-side metal pad structures (780, 880). For example, each SoC die 700 may comprise an array of SoC metal pad structures 780, and each memory die 800 may comprise an array of memory-die metal pad structures 880. Each of the semiconductor dies (700, 800) may be positioned in a face-down position such that die-side metal pad structures (780, 880) face the first solder material portions 940. Each set of at least one semiconductor die (700, 800) may be placed within a respective unit area UA. Placement of the semiconductor dies (700, 800) may be performed using a pick and place apparatus so that each of the die-side metal pad structures (780, 880) is placed on a top surface of a respective one of the first solder material portions 940.

Generally, a redistribution structure 920 including redistribution-side metal pad structures 938 thereupon may be provided, and at least one semiconductor die (700, 800) including a respective set of die-side metal pad structures (780, 880) may be provided. The at least one semiconductor die (700, 800) may be bonded to the redistribution structure 920 using first solder material portions 940 that are bonded to a respective redistribution-side metal pad structure 938 and to a respective one of the die-side metal pad structures (780, 880). Generally, a first array of metallic joint structures may be formed. Each metallic joint structure may comprise a first metal pad structure (such as a redistribution-side metal pad structure 938), a second metal pad structure (such as a die-side metal pad structure (780, 880)), and a bump material portion (such as a first solder material portion 940).

Figure 4A:
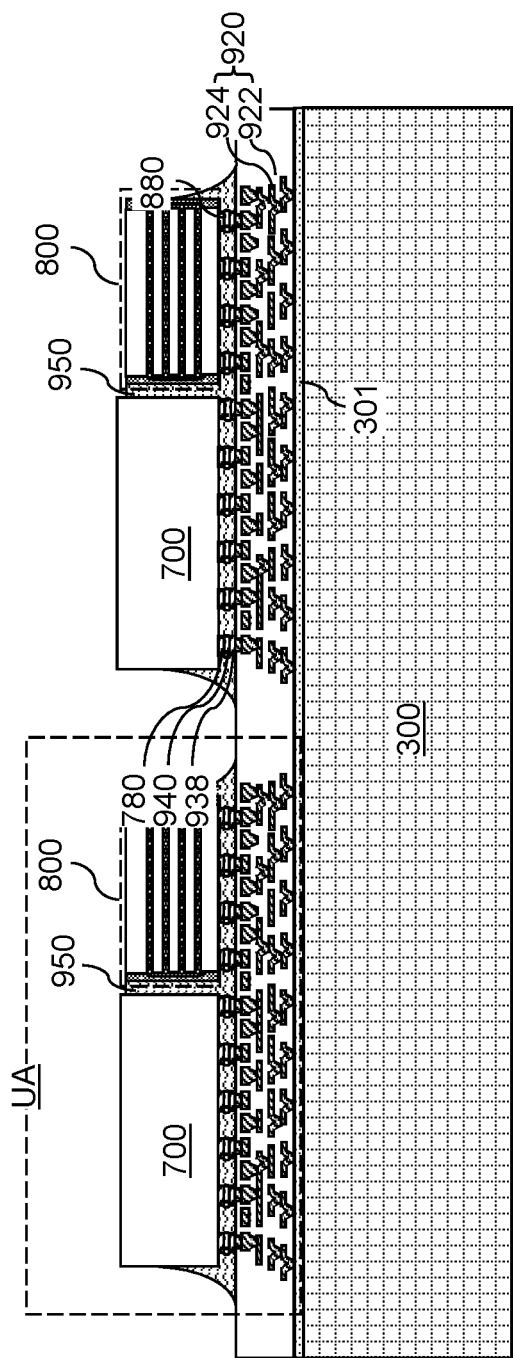
FIG. 4A is a vertical cross-sectional view of a region of the intermediate structure after formation of first underfill material portions according to an embodiment of the present disclosure.
Figure 4B:
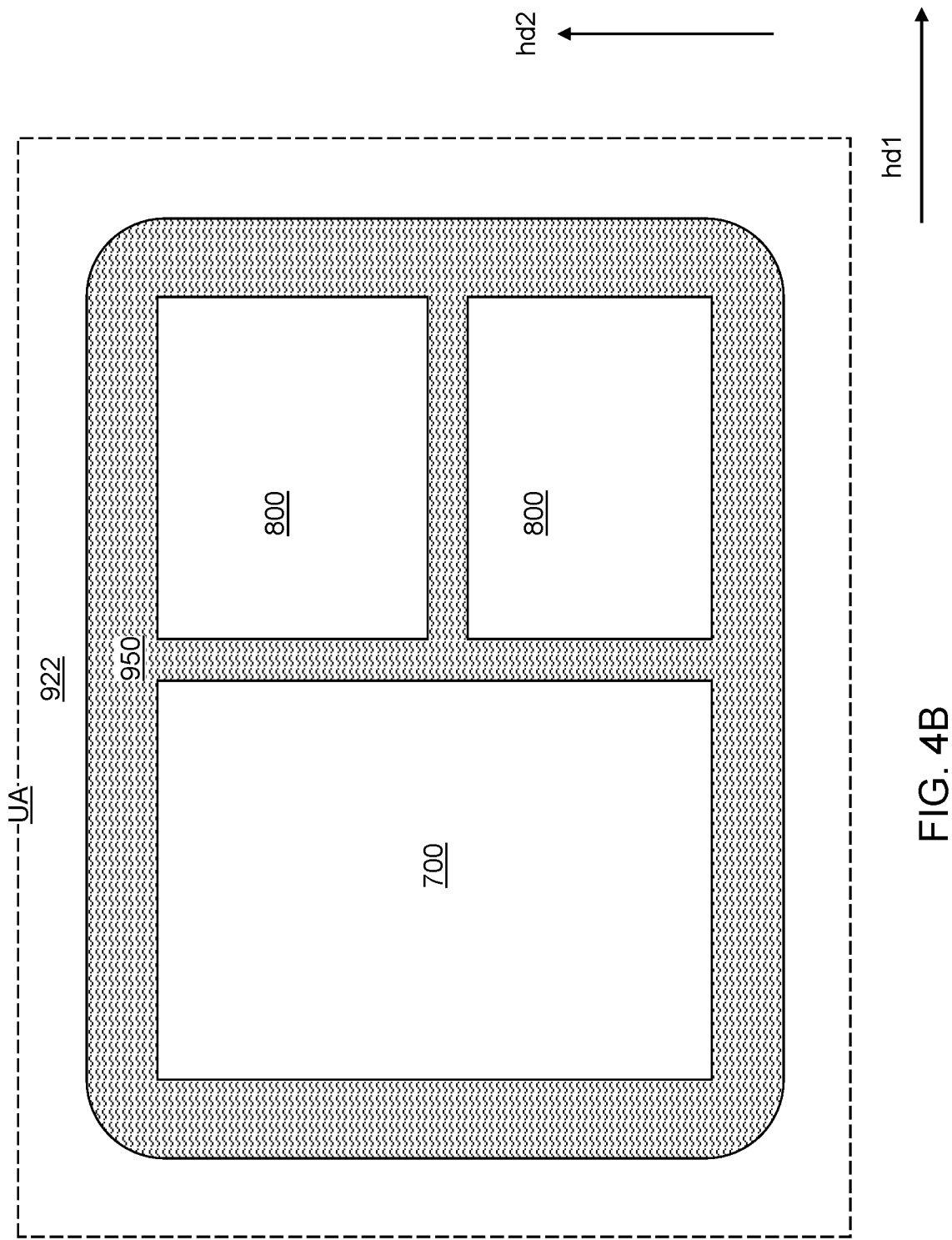
FIG. 4B a top-down view of the intermediate structure of FIG. 4A according to an embodiment of the present disclosure.

Referring to FIG. 3C, a high bandwidth memory (HBM) die 810 is illustrated, which may be used as a memory die 800 within the structures of FIGS. 4A and 4B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random-access memory dies (811, 812, 813, 814, 815) may be filled with a HBM underfill material portions 822 that laterally surrounds a respective set of microbumps 820. The HBM die 810 may comprise an array of memory-die metal pad structures 880 configured to be bonded to a subset of an array of redistribution-side metal pad structures 938 within a unit area UA. The HBM die 810 may be configured to provide a high bandwidth as defined under JEDEC standards, i.e., standards defined by The JEDEC Solid State Technology Association.

FIG. 4A is a vertical cross-sectional view of a region of the structure after formation of first underfill material portions according to an embodiment of the present disclosure. FIG. 4B a top-down view of the structure of FIG. 4A according to an embodiment of the present disclosure. Referring to FIGS. 4A and 4B, a first underfill material may be applied into each gap between the redistribution structures 920 and sets of at least one semiconductor die (700, 800) that may be bonded to the redistribution structures 920. FIG. 4B a top-down view of the structure of FIG. 4A. The first underfill material may comprise any underfill material known in the art. A first underfill material portion 950 may be formed within each unit area UA between a redistribution structure 920 and an overlying set of at least one semiconductor die (700, 800). The first underfill material portions 950 may also be referred to as microbump underfill fillet portions or microbump underfill material portions. The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method. In some embodiments, the outer periphery of the first underfill material portion 950 may have rounded corners in a plan view. In some embodiments, the outer periphery of the first underfill material portion 950 may have squared, or perpendicular corners in a plan view.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side metal pad structures 938, and the die-side metal pad structures (780, 880) in the unit area UA. In some embodiments, the exposed outermost surfaces of the first underfill material portion 950 surrounding sidewalls of the at least one semiconductor die (700, 800) may have a curved or concave shape with varying taper angles formed as a result of the deposition process. In other embodiments, the exposed outermost surfaces of the first underfill material portion 950 surrounding sidewalls of the at least one semiconductor die (700, 800) may have a straight taper or even a convex shape.

Each redistribution structure 920 in a unit area UA comprises redistribution-side metal pad structures 938. At least one semiconductor die (700, 800) comprising a respective set of die-side metal pad structures (780, 880) is attached to the redistribution-side metal pad structures 938 through a respective set of first solder material portions 940 within each unit area UA. Within each unit area UA, a first underfill material portion 950 laterally surrounds the redistribution-side metal pad structures 938 and the die-side metal pad structures (780, 880) of the at least one semiconductor die (700, 800).

Figure 5A:
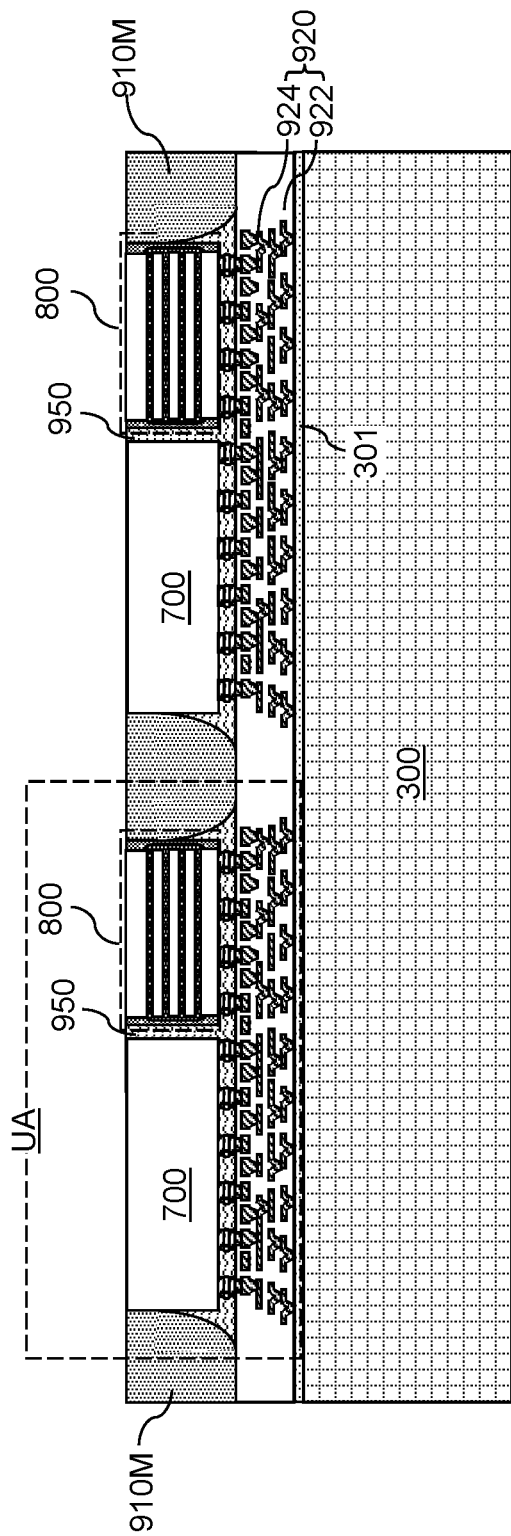
FIG. 5A is a vertical cross-sectional view of a region of the intermediate structure after formation of an epoxy molding compound (EMC) matrix according to an embodiment of the present disclosure.
Figure 5B:
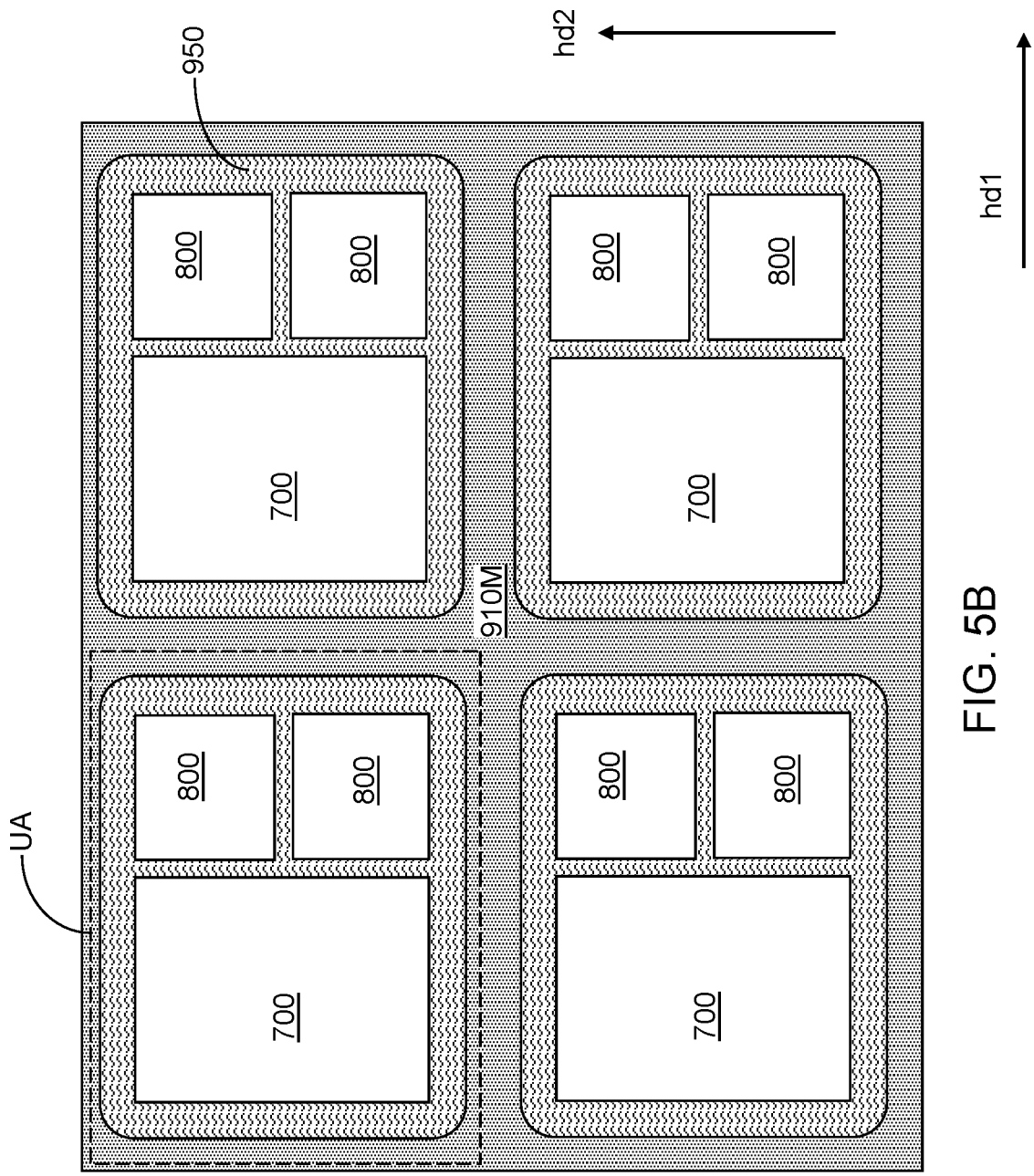
FIG. 5B is a top-down view of the intermediate structure of FIG. 5A according to an embodiment of the present disclosure.

FIG. 5A is a vertical cross-sectional view of a region of the structure after formation of an epoxy molding compound (EMC) matrix according to an embodiment of the present disclosure. FIG. 5B is a top-down view of the structure of FIG. 5A according to an embodiment of the present disclosure. Referring to FIGS. 5A and 5B, an epoxy molding compound (EMC) may be applied to the gaps between contiguous assemblies of a respective set of semiconductor dies (700, 800) and a first underfill material portion 950. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modules of EMC may be greater than 3.5 GPa.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization. The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
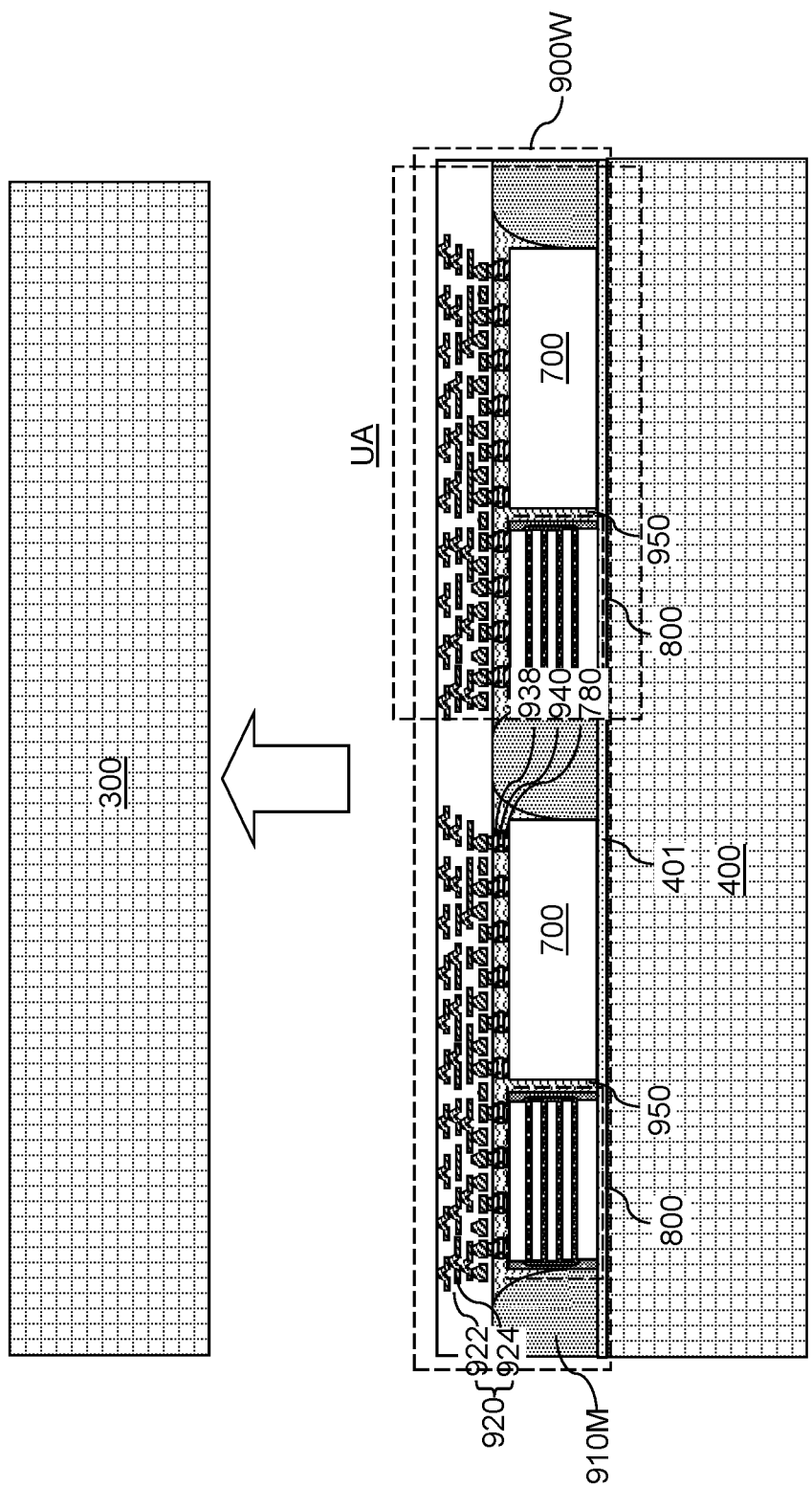
FIG. 6 is a vertical cross-sectional view of a region of an intermediate structure after attaching a second carrier substrate and detaching the first carrier substrate according to an embodiment of the present disclosure.

FIG. 6 is a vertical cross-sectional view of a region of an intermediate structure after attaching a second carrier substrate and detaching the first carrier substrate according to an embodiment of the present disclosure. Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. If the first adhesive layer 301 comprises a thermally decomposing adhesive material, the second adhesive layer 401 comprises another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
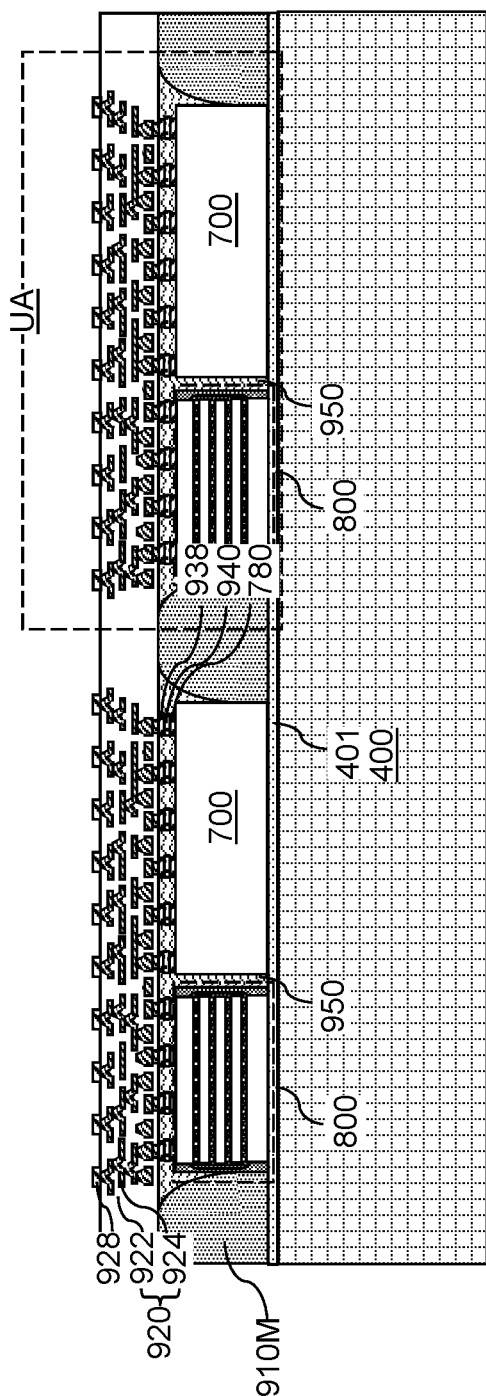
FIG. 7 is a vertical cross-sectional view of a region of the intermediate structure after formation of fan-out bonding pads according to an embodiment of the present disclosure.

FIG. 7 is a vertical cross-sectional view of a region of the intermediate structure after formation of fan-out bonding pads according to an embodiment of the present disclosure. Referring to FIG. 7, fan-out bonding pads 928 may be formed by depositing and patterning at least one metallic material that may function as bonding pads. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of micropads (such as copper pillars or UBMs) having a lateral dimension in a range from 10 microns to 25 microns, and having a pitch in a range from 20 microns to 50 microns.

The fan-out bonding pads 928 may be formed on the opposite side of the redistribution structure 920 from the EMC matrix 910M and the two-dimensional array of sets of semiconductor dies (700, 800) relative to the redistribution structure layer. The redistribution structure layer includes a two-dimensional array of redistribution structures 920. Each redistribution structure 920 may be located within a respective unit area UA. Each redistribution structure 920 may comprise redistribution dielectric layers 922, redistribution wiring interconnects 924 embedded in the redistribution dielectric layers 922, and fan-out bonding pads 928. The fan-out bonding pads 928 may be located on an opposite side of the redistribution structure 920 from the redistribution-side metal pad structures 938 relative to the redistribution dielectric layers 922.

Figure 8:
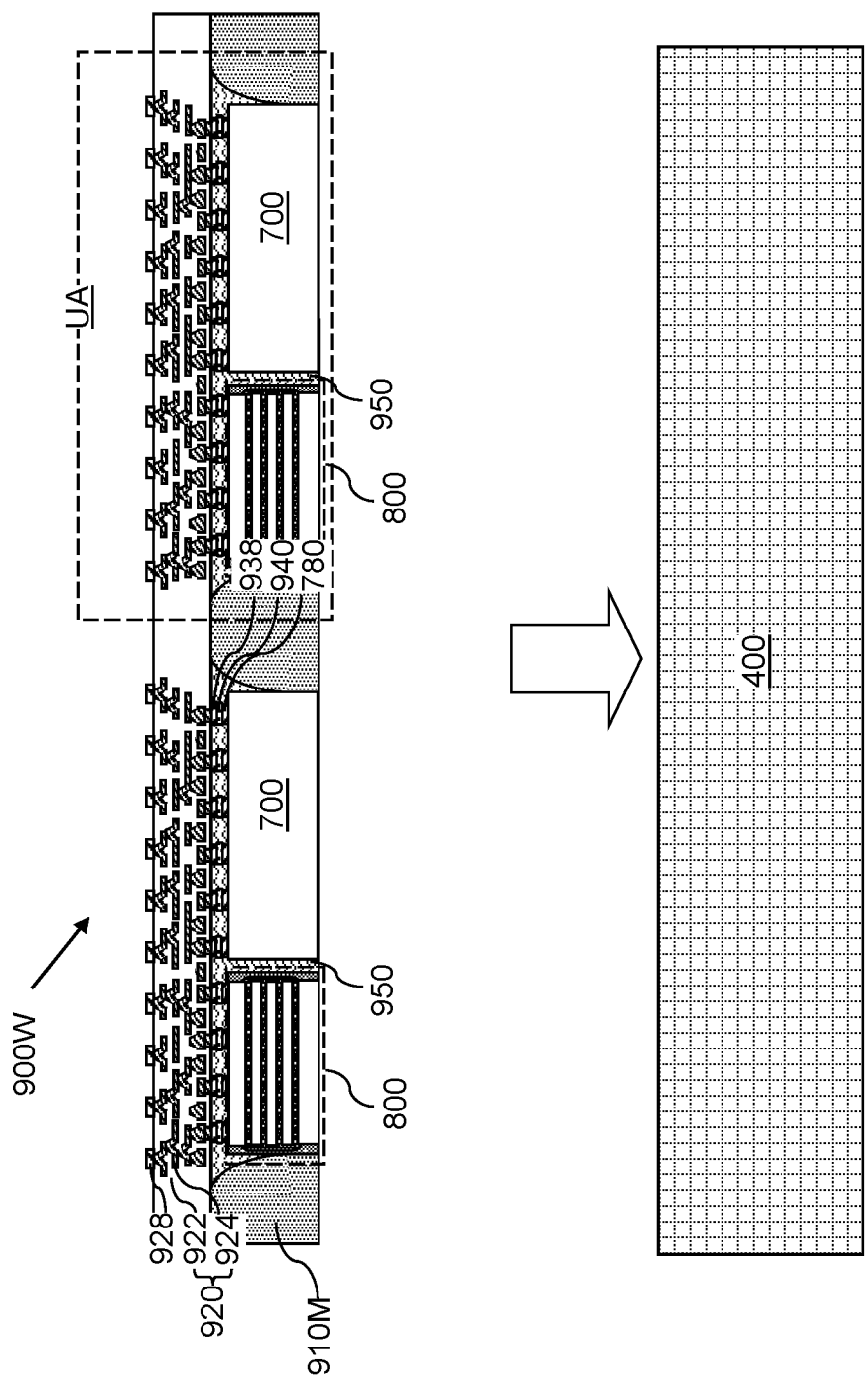
FIG. 8 is a vertical cross-sectional view of a region of the intermediate structure after detaching the second carrier substrate according to an embodiment of the present disclosure.

FIG. 8 is a vertical cross-sectional view of a region of the intermediate structure after detaching the second carrier substrate according to an embodiment of the present disclosure. Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
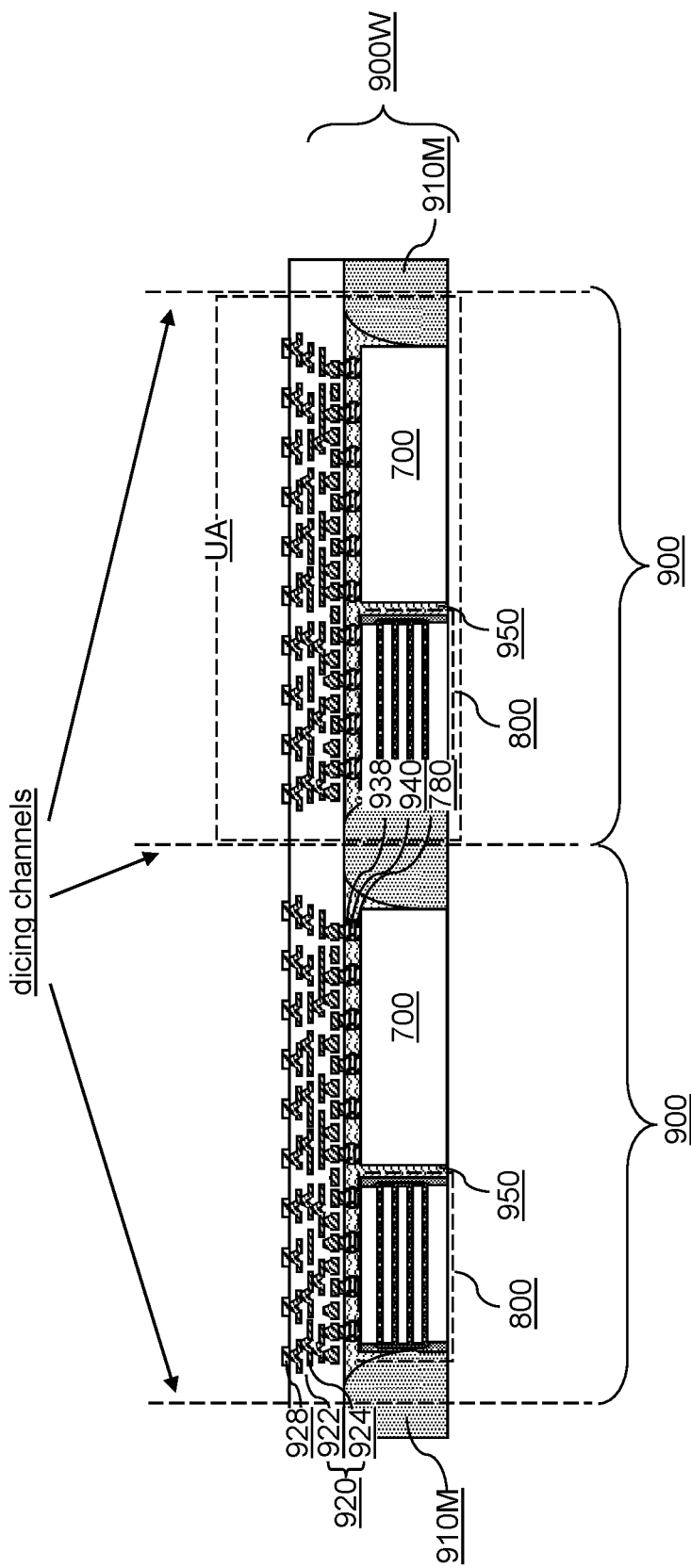
FIG. 9 is a vertical cross-sectional view of a region of the intermediate structure during dicing of a redistribution substrate and the EMC matrix according to an embodiment of the present disclosure.

FIG. 9 is a vertical cross-sectional view of a region of the intermediate structure during dicing of a redistribution substrate and the EMC matrix according to an embodiment of the present disclosure. Referring to FIG. 9, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W comprises a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 10A:
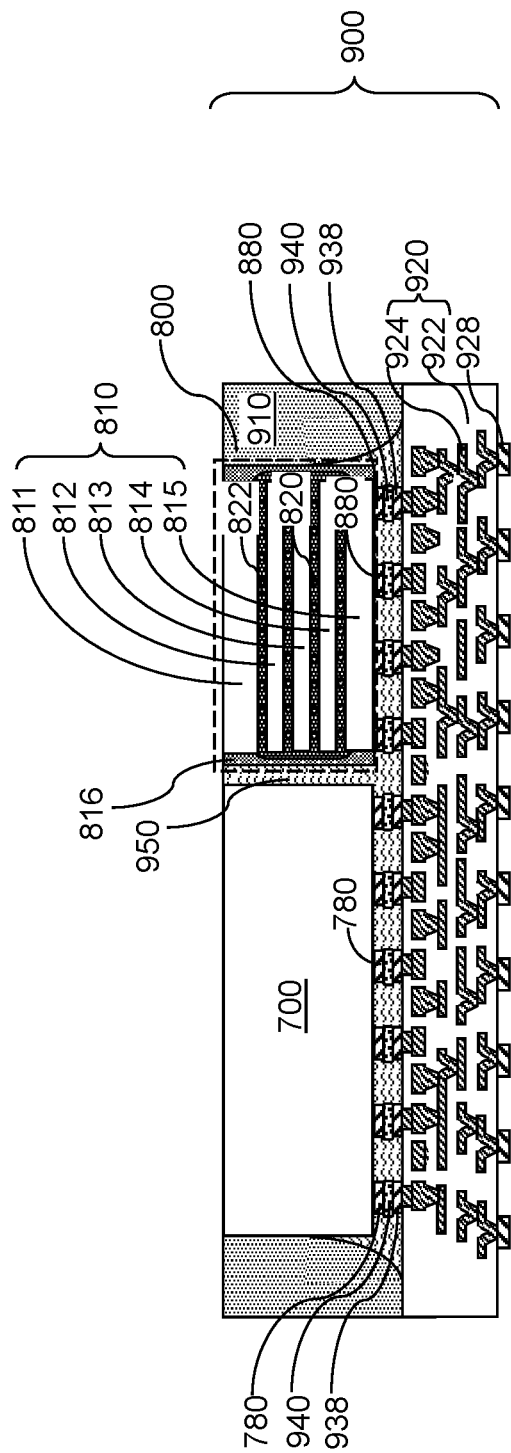
FIG. 10A is a vertical cross-sectional view of an intermediate structure according to an embodiment of the present disclosure.
Figure 10B:
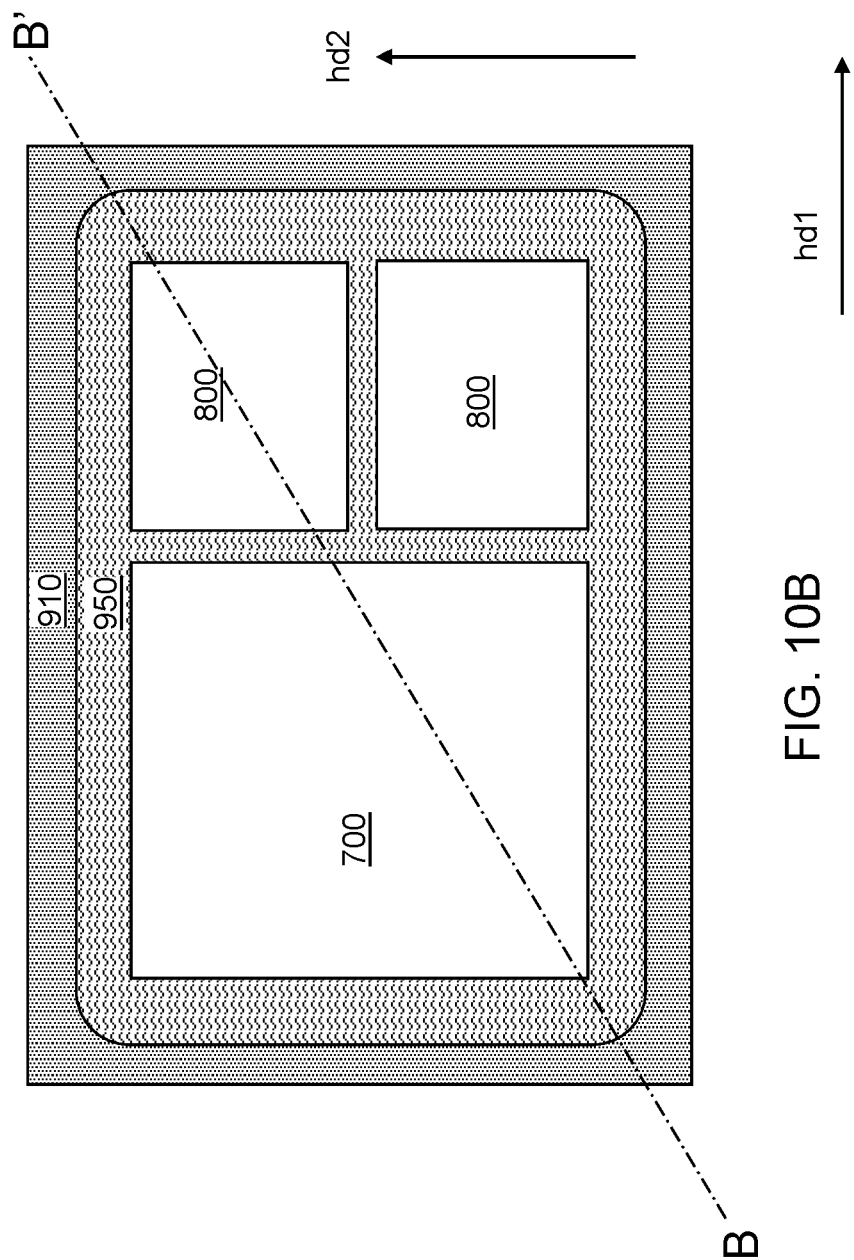
FIG. 10B is a top-down view of the intermediate structure along the horizontal plane B-B' of FIG. 10A according to an embodiment of the present disclosure.

FIG. 10A is a vertical cross-sectional view of an intermediate structure according to an embodiment of the present disclosure. FIG. 10B is a top-down view of the intermediate structure of FIG. 10A according to an embodiment of the present disclosure. The vertical cross section shown in FIG. 10A is along line BB' in FIG. 10B. Referring to FIGS. 10A and 10B, a fan-out package 900 obtained by dicing the structure at the processing steps of FIG. 9 is illustrated. The fan-out package 900 comprises a redistribution structure 920 including redistribution-side metal pad structures 938, at least one semiconductor die (700, 800) comprising a respective set of die-side metal pad structures (780, 880) that is attached to the redistribution-side metal pad structures 938 through a respective set of first solder material portions 940, a first underfill material portion 950 laterally surrounding the redistribution-side metal pad structures 938 and the die-side metal pad structures (780, 880) of the at least one semiconductor die (700, 800).

The fan-out package 900 may also comprise a molding compound die frame 910 laterally surrounding the at least one semiconductor die (700, 800) and comprising a molding compound material. In one embodiment, the molding compound die frame 910 comprises sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the redistribution structure 920.

Figure 11:
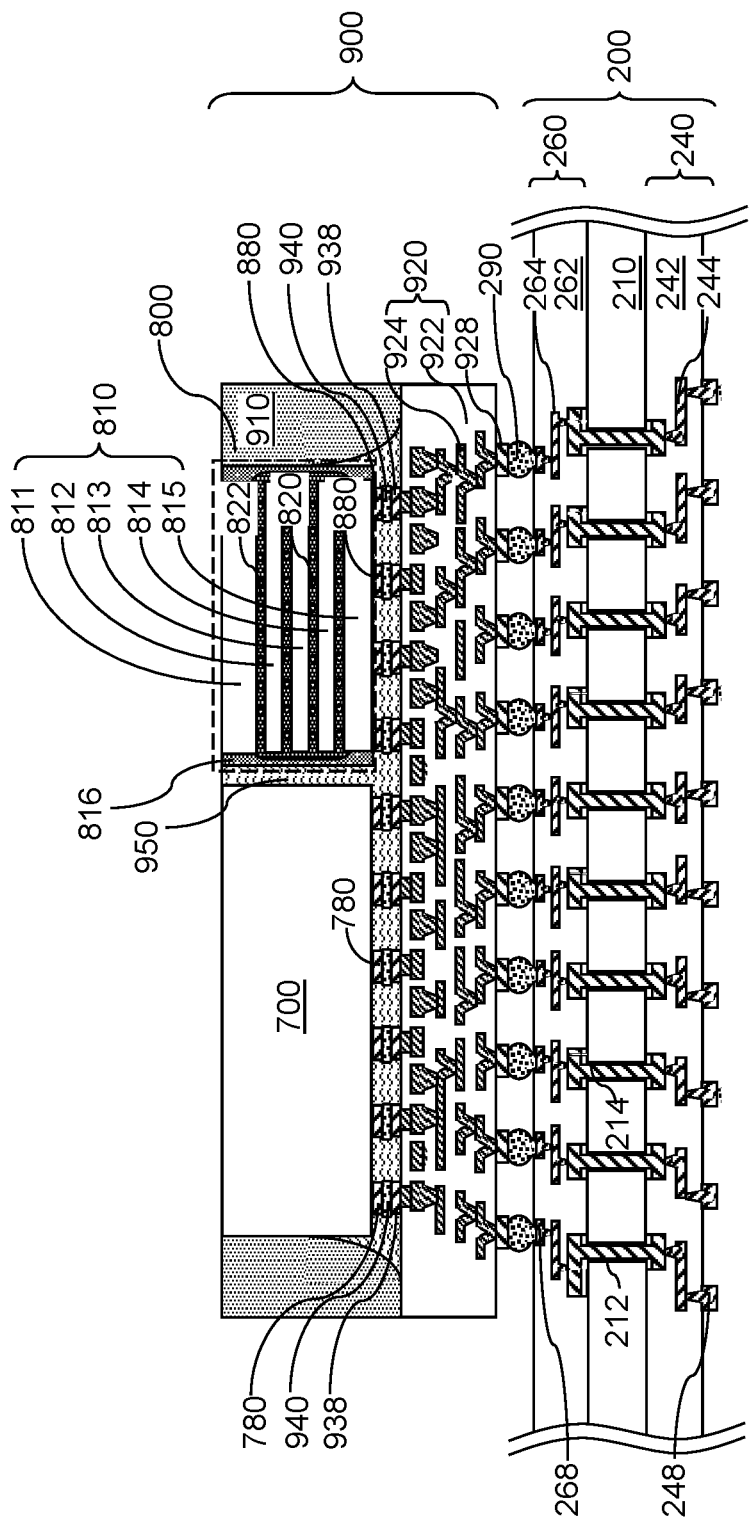
FIG. 11 is a vertical cross-sectional view of an intermediate structure after attaching the fan-out package to a package substrate according to an embodiment of the present disclosure.

FIG. 11 is a vertical cross-sectional view of an intermediate structure after attaching the fan-out package 900 to a package substrate according to an embodiment of the present disclosure. Referring to FIG. 11, second solder material portions 290 may be attached to the fan-out bonding pads 928. A package substrate 200 may be bonded to the fan-out package 900 through the second solder material portions 290. The package substrate 200 may be a cored package substrate including a core substrate 210, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using bonding material portions, underfill material portions (such as molded underfill material portions), and/or an optional adhesion film (not shown). While the present disclosure is described using a package substrate, it is understood that the scope of the present disclosure is not limited by any particular type of package substrate and may include an SoIS. Other package substrates are within the contemplated scope of disclosure. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 may be configured to allow bonding through solder balls. The array of chip-side bonding pads 268 may be configured to allow bonding through C4 solder balls. Generally, any type of package substrate 200 may be used. While the present disclosure is described using an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The second solder material portions 290 attached to the fan-out bonding pads 928 of the fan-out package 900 may be disposed on the array of the chip-side bonding pads 268 of the package substrate 200. A reflow process may be performed to reflow the second solder material portions 290, thereby inducing bonding between the fan-out package 900 and the package substrate 200. In one embodiment, the second solder material portions 290 may include C4 solder balls, and the fan-out package 900 may be attached to the package substrate 200 using an array of C4 solder balls. Generally, a second array of metallic joint structures may be formed. Each metallic joint structure may comprise a first metal pad structure (such as a chip-side bonding pad 268), a second metal pad structure (such as a fan-out bonding pad 928), and a bump material portion (such as a second solder material portion 290).

Figure 12A:
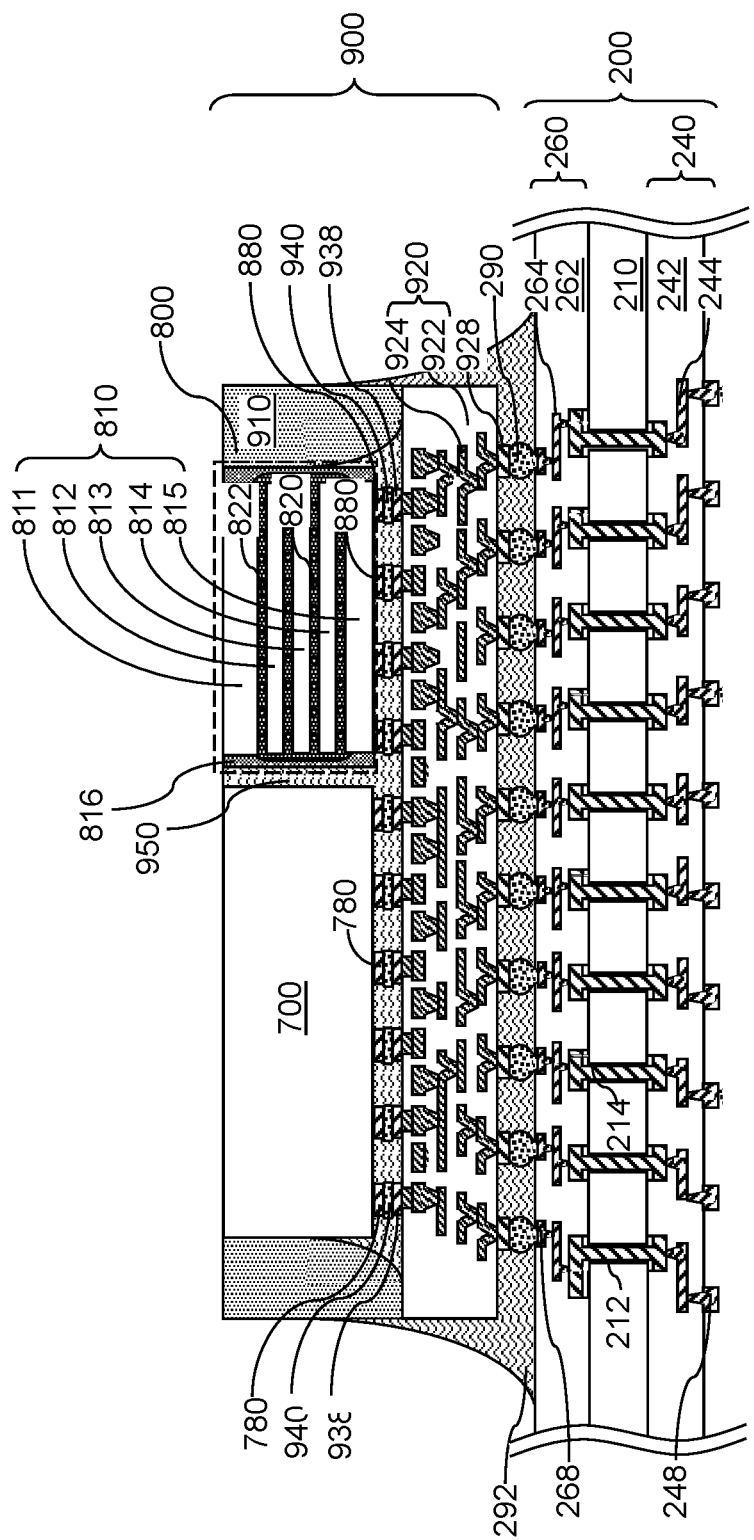
FIG. 12A is a vertical cross-sectional view of the intermediate structure after formation of a second underfill material portion according to an embodiment of the present disclosure.
Figure 12B:
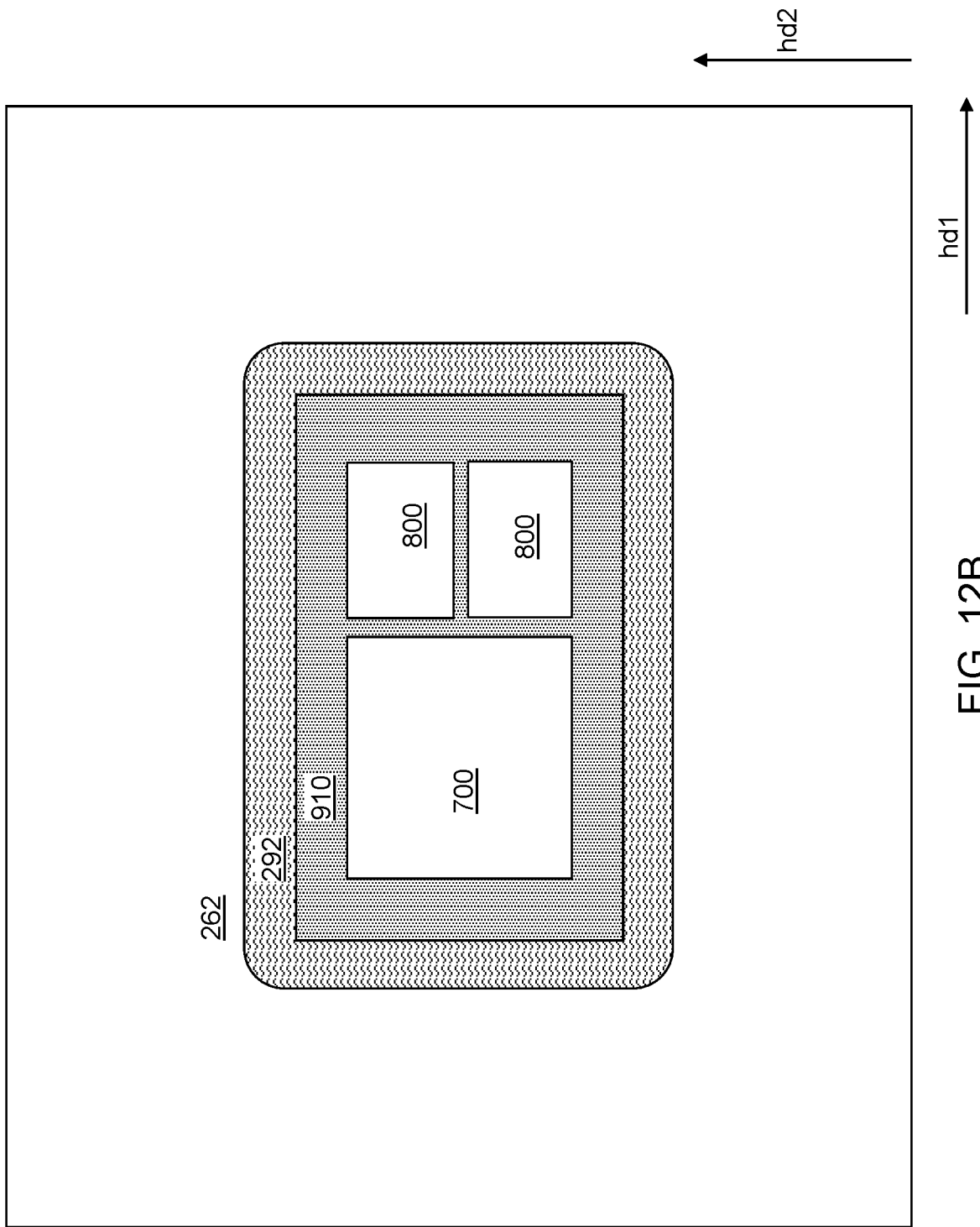
FIG. 12B is a top-down view of the structure of FIG. 12A according to an embodiment of the present disclosure.

FIG. 12A is a vertical cross-sectional view of the intermediate structure after formation of a second underfill material portion according to an embodiment of the present disclosure. FIG. 12B is a top-down view of the structure of FIG. 12A according to an embodiment of the present disclosure. Referring to FIG. 12, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the redistribution structure 920 and the package substrate 200. According to an aspect of the present disclosure, the second underfill material portion 292 may be formed directly on each sidewall of the molding compound die frame 910.

The second underfill material portion 292 may contact each of the second solder material portions 290 (which may be C4 solder balls or C2 solder caps), and may contact vertical sidewalls of the fan-out package 900. The second underfill material portion may be formed between the redistribution structure 920 and the package substrate 200. The second underfill material portion may laterally surround, and contact, the array of second solder material portions 290 and the fan-out package 900.

In one embodiment, the second underfill material portion 292 may include tapered sidewalls that extend continuously from a respective sidewall of the molding compound die frame 910 to a planar surface (such as the top surface) of the package substrate 200. The taper angle of the tapered sidewalls may be in a range from 10 degrees to 80 degrees, such as from 30 degrees to 60 degrees, although lesser and greater taper angles may also be used. The taper angle may, or may not, be uniform. For example, exposed outermost surfaces of the second underfill material portion 292 surrounding vertical sidewalls of the fan-out package 900 may have a curved or concave shape with varying taper angles formed as a result of the deposition process. In one embodiment, the tapered sidewalls may have a same taper angle (as measured from a vertical direction) throughout.

Figure 13A:
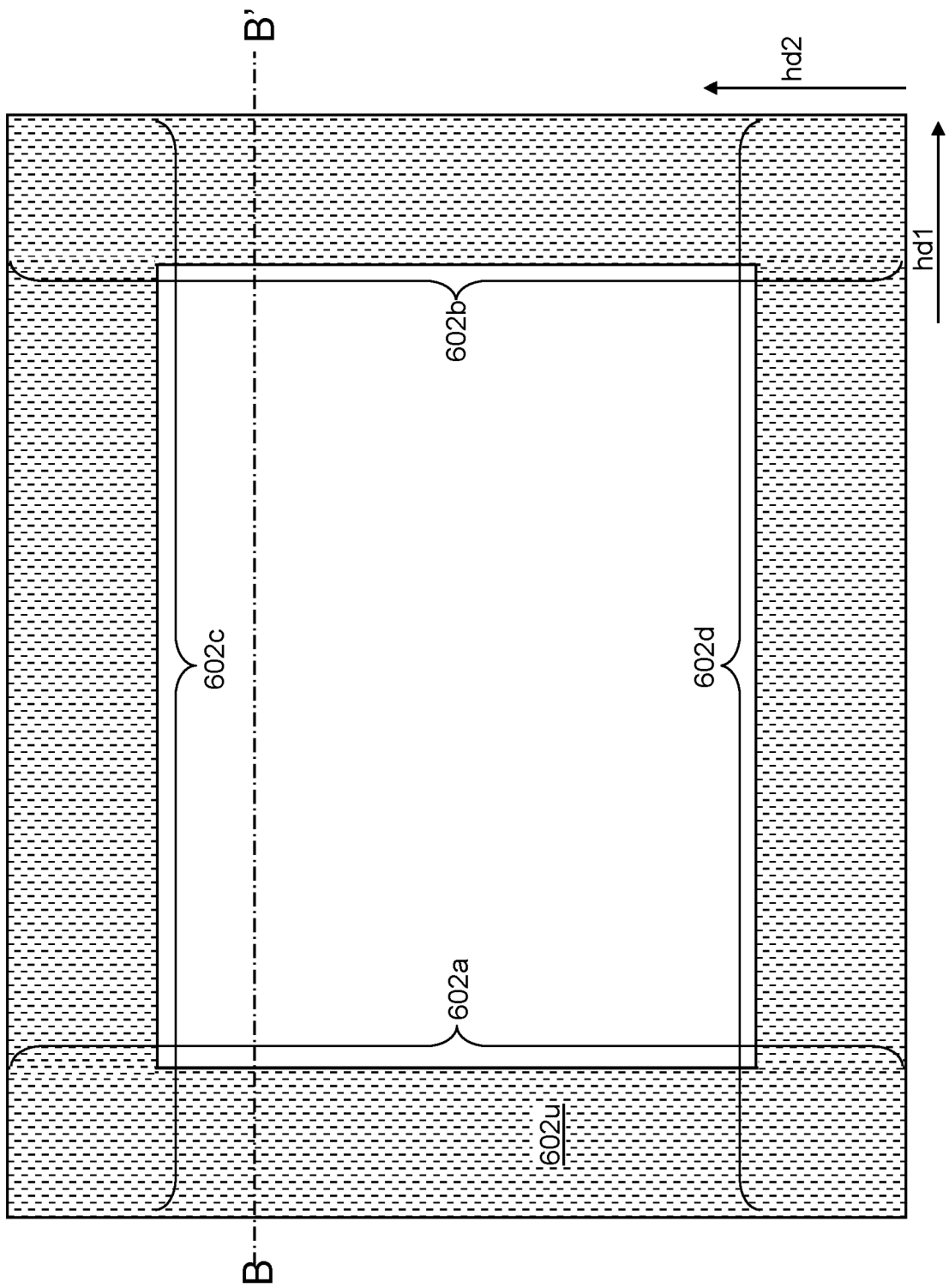
FIG. 13A is a top-down view of an intermediate structure according to an embodiment of the present disclosure.
Figure 13B:
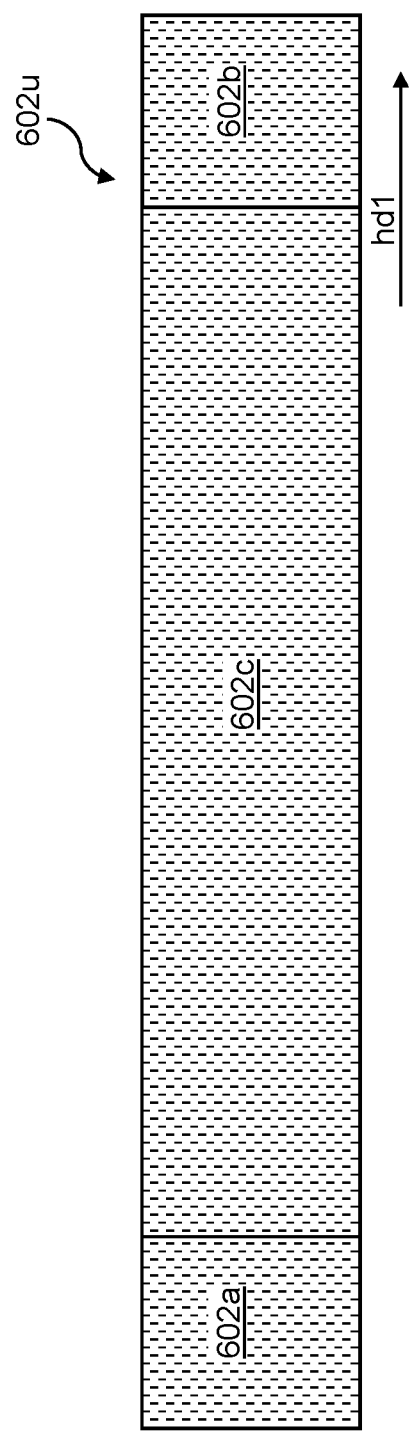
FIG. 13B is a vertical cross-sectional view of the intermediate structure along the vertical plane B-B' of FIG. 13A according to an embodiment of the present disclosure.

FIG. 13A is a top-down view of an intermediate structure according to an embodiment of the present disclosure. FIG. 13B is a vertical cross-sectional view of the intermediate structure along the vertical plane B-B' of FIG. 13A according to an embodiment of the present disclosure. Referring to FIGS. 13A and 13B, an unbeveled stiffener structure 602u is illustrated. The unbeveled stiffener structure 602u may be formed to have a first wall portion 602a, a second wall portion 602b, a third wall portion 602c, and a fourth wall portion 602d. The unbeveled stiffener structure 602u may be formed using a molding process. In some embodiments, the unbeveled stiffener structure 602u may be formed as a single piece without a hollowed-out center, and a beveling or drilling tool may be used to hollow out a middle area to form the first wall portion 602a, second wall portion 602b, third wall portion 602c, and fourth wall portion 602d. In some embodiments, the unbeveled stiffener structure 602u may be formed through a molding process to have a hollowed-out middle area. The unbeveled stiffener structure 602u may be formed using one or more materials. For example, the unbeveled stiffener structure 602u may be formed using copper with nickel coating or aluminum alloys, metals such as copper, brass, stainless steel, and aluminum, copper tungsten, ceramic materials, materials containing silicon, composite alloys, polymers, and plastics.

The first wall portion 602a may extend in a second horizontal direction hd2 to connect to ends of the third wall portion 602c and the fourth wall portion 602d. The second wall portion 602b may extend in the second horizontal direction hd2 to connect to ends of the third wall portion 602c and the fourth wall portion 602d. The third wall portion 602c may extend in a first horizontal direction hd1 to connect to ends of the first wall portion 602a and the second wall portion 602b. The fourth wall portion 602d may extend in the first horizontal direction hd1 to connect to ends of the first wall portion 602a and the second wall portion 602b. Thus, the wall portions 602a, 602b, 602c, 602d may be formed as a ring structure.

Figure 14A:
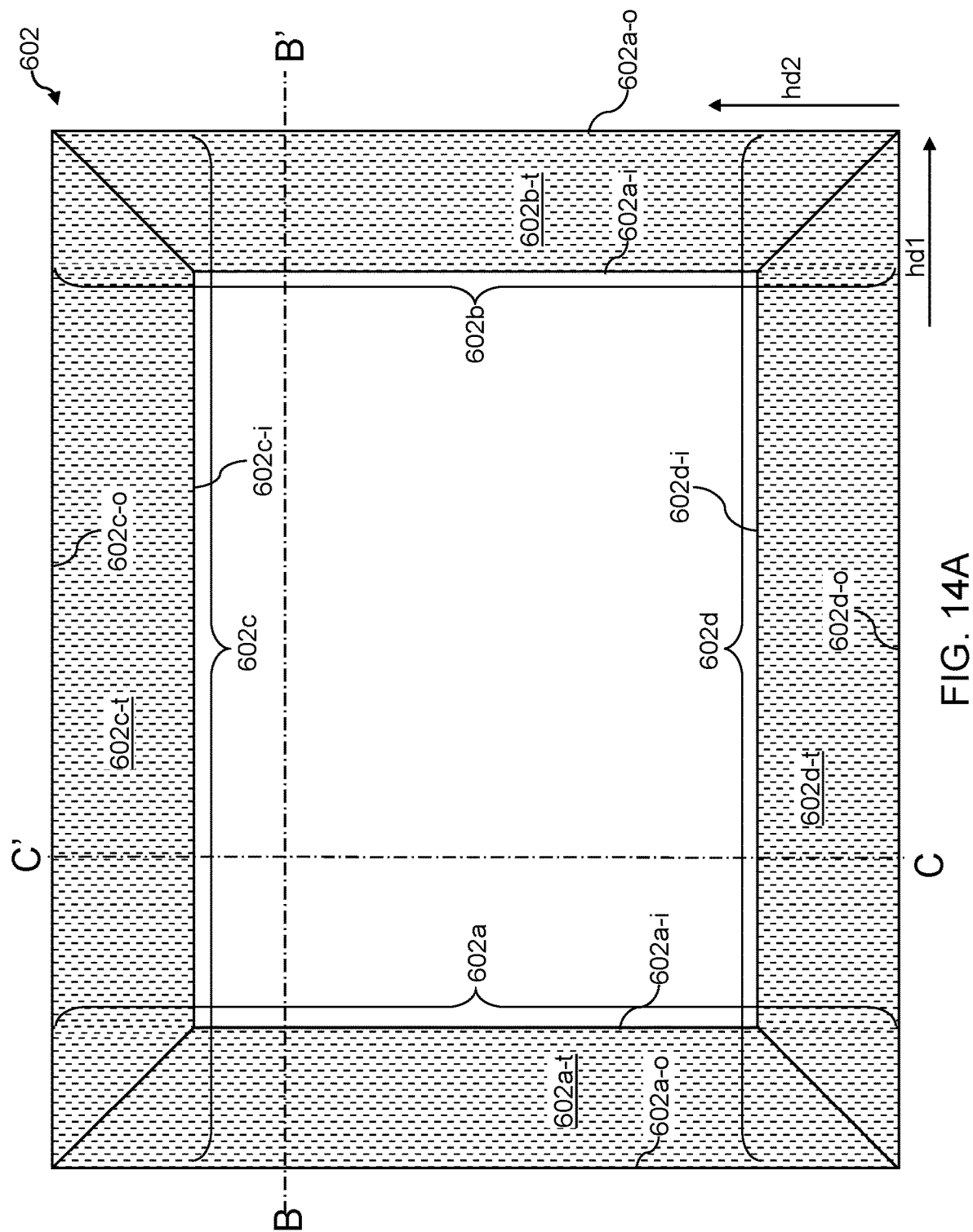
FIG. 14A is a top-down view of a bottom portion of a stiffener structure according to an embodiment of the present disclosure.

FIG. 14A is a top-down view of a bottom portion of a stiffener structure according to an embodiment of the present disclosure. FIG. 14B is a vertical cross-sectional view of the bottom portion of the stiffener structure along the vertical plane B-B' of FIG. 14A according to an embodiment of the present disclosure. FIG. 14C is a vertical cross-sectional view of the bottom portion of the stiffener structure along the vertical plane C-C' of FIG. 14A according to an embodiment of the present disclosure. Referring to FIGS. 14A-14C, a bottom portion 602 of a beveled stiffener structure is illustrated. Portions of the first wall portion 602a, second wall portion 602b, third wall portion 602c, and fourth wall portion 602d may be cut, drilled, beveled, or milled using a milling apparatus 620 to form at least one tapered top surface.

The milling apparatus 620 may be used to form at least one tapered top surface on at least one of the first wall portion 602a, second wall portion 602b, third wall portion 602c, and fourth wall portion 602d of the bottom portion 602. For illustrative purposes, the bottom portion 602 includes beveled top surfaces on wall portions 602a-602d. However, fewer top surfaces may be beveled depending on the application. For example, top surfaces of the wall portions 602a, 602b may be beveled (i.e., wall portions 602a, 602b are thinner than wall portions 602c, 602d, and/or may be positioned at critical stress areas), while the top surfaces of the wall portions 602c, 602d are beveled to be flat and parallel to the first horizontal direction hd1 and/or second horizontal direction hd2.

The bottom portion 602 may include the wall portions 602a-602d. The first wall portion 602a may include a bottom portion inner sidewall 602a-i, a bottom portion outer sidewall 602a-o, a tapered top surface 602a-t, and a bottom surface 602a-b. The second wall portion 602b may include a bottom portion inner sidewall 602b-i, a bottom portion outer sidewall 602b-o, a tapered top surface 602b-t, and a bottom surface 602b-b. The third wall portion 602c may include a bottom portion inner sidewall 602c-i, a bottom portion outer sidewall 602c-o, a tapered top surface 602c-t, and a bottom surface 602c-b. The fourth wall portion 602d may include a bottom portion inner sidewall 602d-i, a bottom portion outer sidewall 602d-o, a tapered top surface 602d-t, and a bottom surface 602d-b.

The bottom portion inner sidewall 602a-i, bottom portion inner sidewall 602b-i, bottom portion inner sidewall 602c-i, and bottom portion inner sidewall 602d-i may be collectively referred to as the bottom portion inner sidewalls 602a-i-602d-i, and may form an inner rectangular-shaped ring of the bottom portion 602 of a stiffener structure. The bottom portion outer sidewall 602a-o, bottom portion outer sidewall 602b-o, bottom portion outer sidewall 602c-o, and bottom portion outer sidewall 602d-o may be collectively referred to as the bottom portion outer sidewalls 602a-o-602d-o, and may form an outer rectangular-shaped ring of the bottom portion 602 of a stiffener structure that surrounds the bottom portion inner sidewalls 602a-i-602d-i. The bottom surface 602a-b, bottom surface 602b-b, bottom surface 602c-b, and bottom surface 602d-b may be collectively referred to as the bottom surfaces 602a-b-602d-b. The tapered top surface 602a-t, tapered top surface 602b-t, tapered top surface 602c-t, and tapered top surface 602d-t may be collectively referred to as the tapered top surfaces 602a-t-602d-t.

The tapered top surfaces 602a-t-602d-t may have a bottom portion taper angle "$\theta_B$" with respect to a horizontal plane (e.g., bottom surfaces 602a-b-602d-b) that may be in a range from 1 degree to 89 degrees, such as from 5 degrees to 60 degrees, although lesser and greater taper angles $\theta$ may also be used. The bottom portion taper angle $\theta_B$ may, or may not, be uniform across each and all tapered top surfaces 602a-t-602d-t. The bottom portion taper angles $\theta_B$ of the tapered top surfaces 602a-t-602d-t may be equivalent as illustrated. However, in some embodiments, the bottom portion taper angle $\theta_B$ of the tapered top surfaces 602a-t-602d-t may be different. For example, the bottom portion taper angle $\theta_B$ of the tapered top surfaces 602a-t, 602b-t may be a first taper angle, and the bottom portion taper angle $\theta_B$ of the tapered top surfaces 602c-t, 602d-t may be a second taper angle of a different degree amount. As another example, the tapered top surfaces 602a-t-602d-t may each have a different bottom portion taper angle $\theta_B$.

Figure 15A:
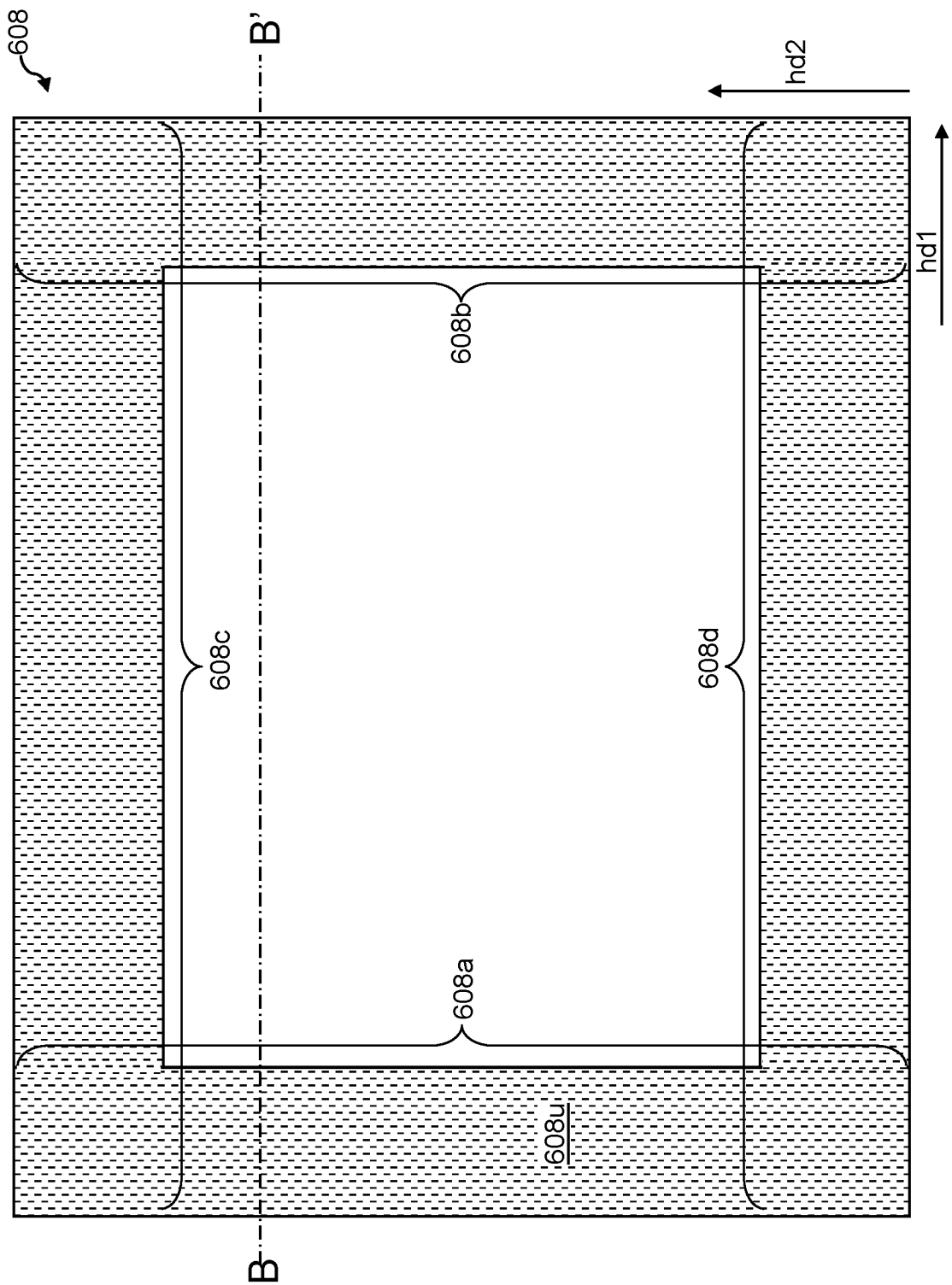
FIG. 15A is a top-down view of an intermediate structure according to an embodiment of the present disclosure.
Figure 15B:
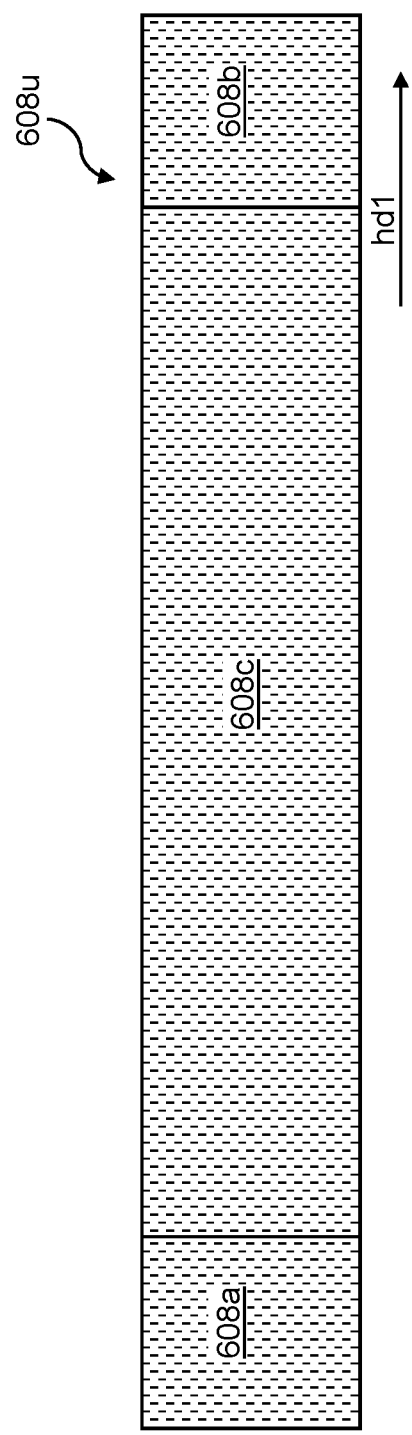
FIG. 15B is a vertical cross-sectional view of the intermediate structure along the vertical plane B-B' of FIG. 15A according to an embodiment of the present disclosure.

FIG. 15A is a top-down view of an intermediate structure according to an embodiment of the present disclosure. FIG. 15B is a vertical cross-sectional view of the intermediate structure along the vertical plane B-B' of FIG. 15A according to an embodiment of the present disclosure.

Referring to FIGS. 15A and 15B, an unbeveled stiffener structure 608u is illustrated. The unbeveled stiffener structure 608u may be formed to have a first wall portion 608a, a second wall portion 608b, a third wall portion 608c, and a fourth wall portion 608d. The unbeveled stiffener structure 608u may be formed using a molding process. In some embodiments, the unbeveled stiffener structure 608u may be formed as a single piece without a hollowed-out center, and a beveling or drilling tool may be used to hollow out a middle area to form the first wall portion 608a, second wall portion 608b, third wall portion 608c, and fourth wall portion 608d. In some embodiments, the unbeveled stiffener structure 608u may be formed through a molding process to have a hollowed-out middle area. The unbeveled stiffener structure 608u may be formed using one or more materials. For example, the unbeveled stiffener structure 608u may be formed using copper with nickel coating or aluminum alloys, metals such as copper, brass, stainless steel, and aluminum, copper tungsten, ceramic materials, materials containing silicon, composite alloys, polymers, and plastics.

The first wall portion 608a may extend in a second horizontal direction hd2 to connect to ends of the third wall portion 608c and the fourth wall portion 608d. The second wall portion 608b may extend in the second horizontal direction hd2 to connect to ends of the third wall portion 608c and the fourth wall portion 608d. The third wall portion 608c may extend in a first horizontal direction hd1 to connect to ends of the first wall portion 608a and the second wall portion 608b. The fourth wall portion 608d may extend in the first horizontal direction hd1 to connect to ends of the first wall portion 608a and the second wall portion 608b. Thus, the wall portions 608a, 608b, 608c, 608d may be formed as a ring structure.

Figure 16A:
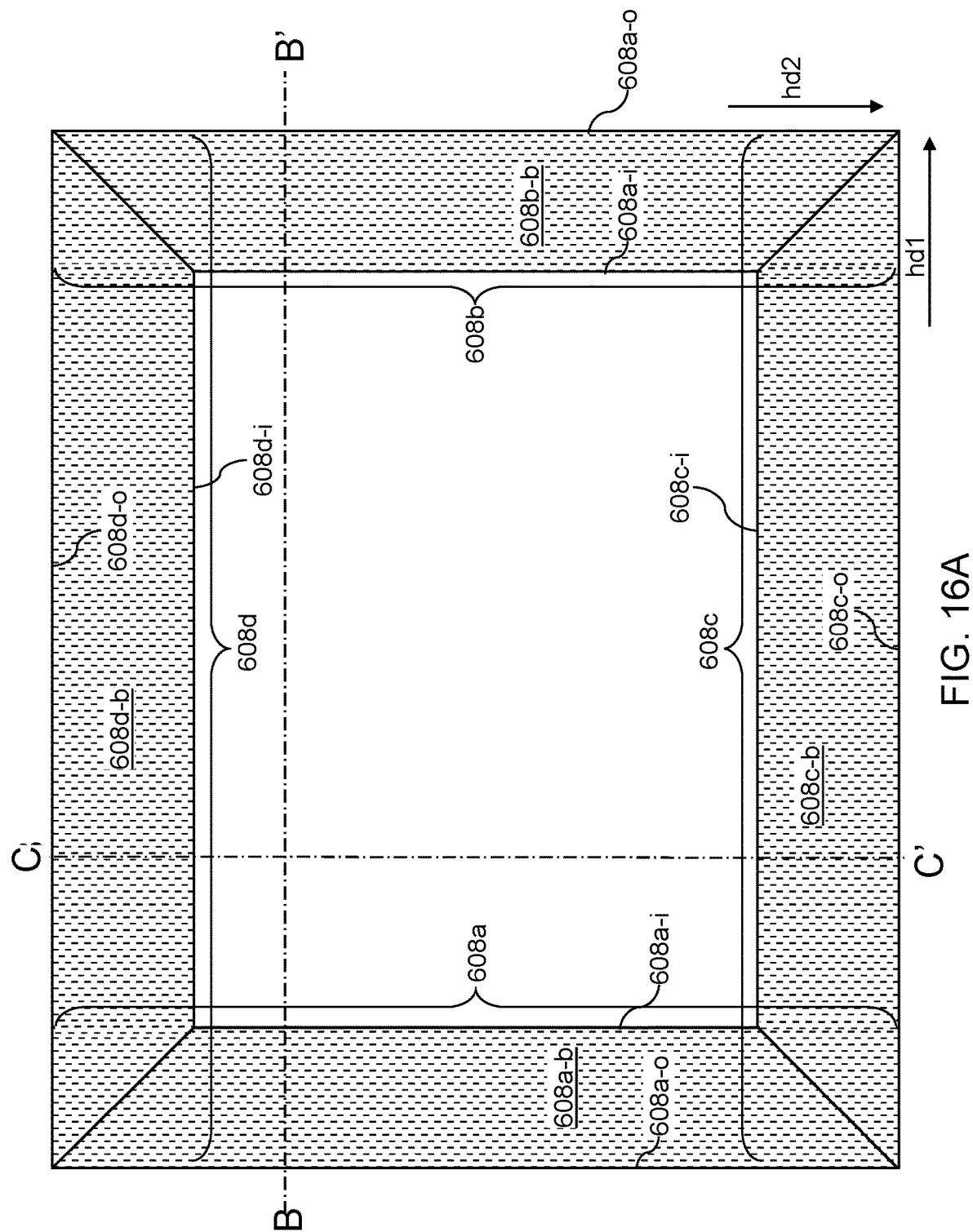
FIG. 16A is a bottom-up view of a top portion of a stiffener structure according to an embodiment of the present disclosure.
Figure 16B:
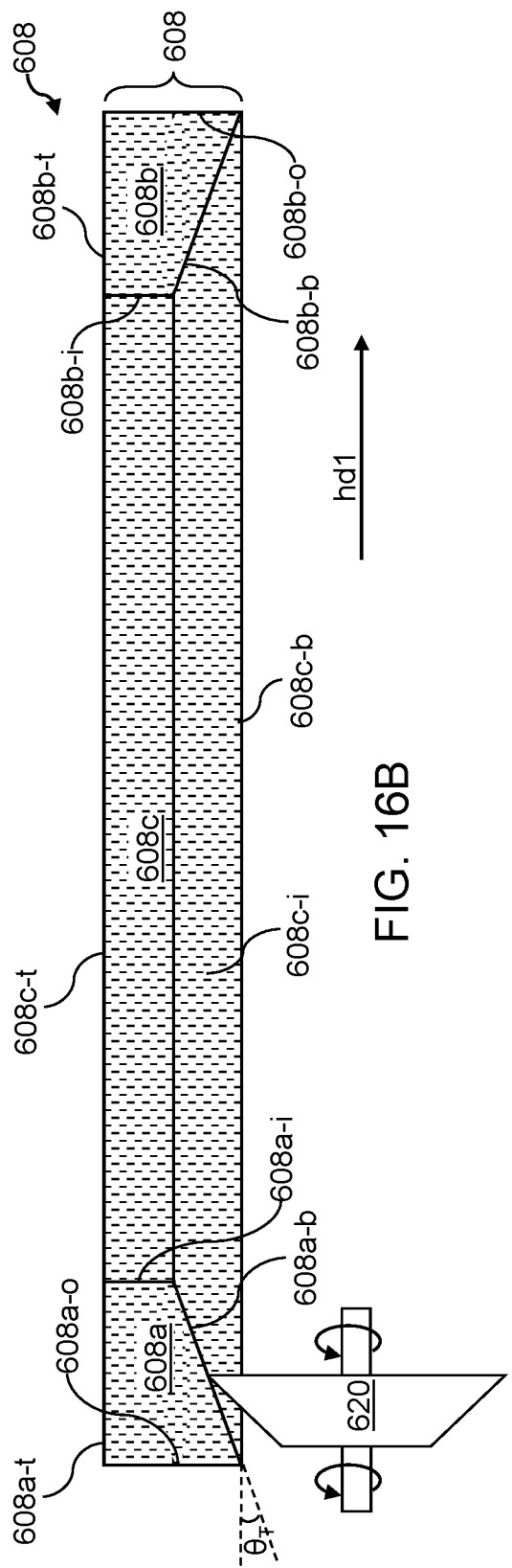
FIG. 16B is a vertical cross-sectional view of the top portion of the stiffener structure along the vertical plane B-B' of FIG. 16A according to an embodiment of the present disclosure.
Figure 16C:
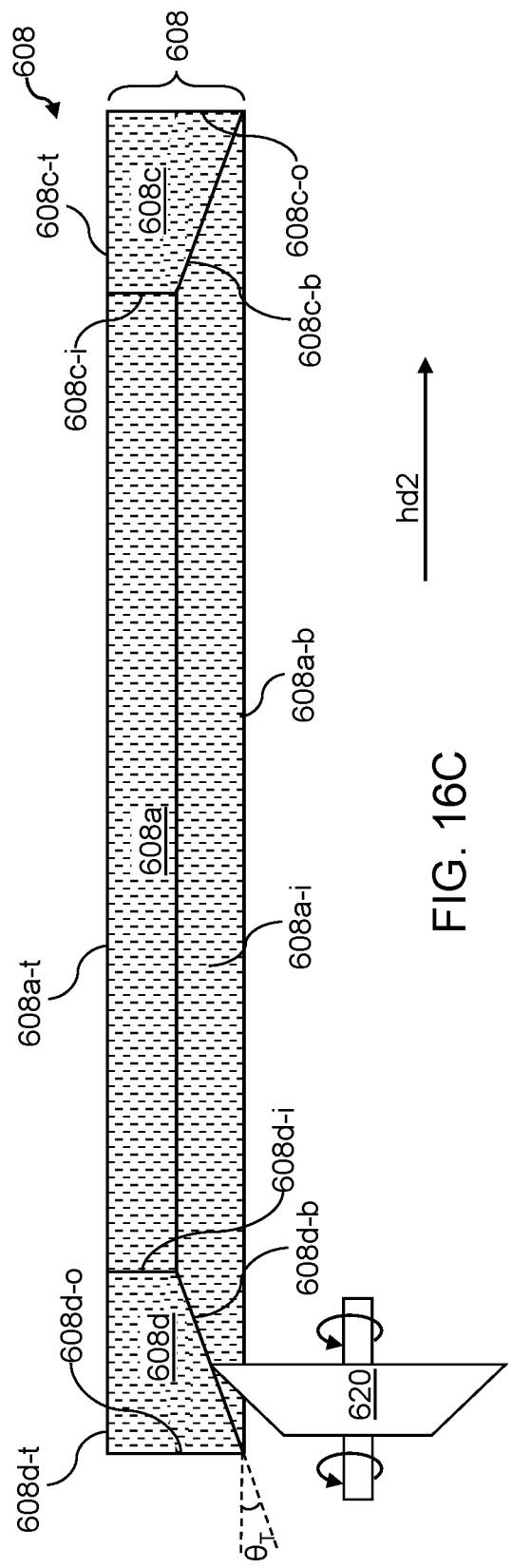
FIG. 16C is a vertical cross-sectional view of the top portion of the stiffener structure along the vertical plane C-C' of FIG. 16A according to an embodiment of the present disclosure.

FIG. 16A is a bottom-up view of a top portion of a stiffener structure according to an embodiment of the present disclosure. FIG. 16B is a vertical cross-sectional view of the top portion of the stiffener structure along the vertical plane B-B' of FIG. 16A according to an embodiment of the present disclosure. FIG. 16C is a vertical cross-sectional view of the top portion of the stiffener structure along the vertical plane C-C' of FIG. 16A according to an embodiment of the present disclosure. Referring to FIGS. 16A-16C, a top portion 608 of a beveled stiffener structure is illustrated. Portions of the first wall portion 608a, second wall portion 608b, third wall portion 608c, and fourth wall portion 608d may be cut, drilled, beveled, or milled using a milling apparatus 620 to form at least one tapered bottom surface.

The milling apparatus 620 may be used to form at least one tapered bottom surface on at least one of the first wall portion 608a, second wall portion 608b, third wall portion 608c, and fourth wall portion 608d of the top portion 608. For illustrative purposes, the top portion 608 includes beveled bottom surfaces on wall portions 608a-608d. However, fewer bottom surfaces may be beveled depending on the application. For example, bottom surfaces of the wall portions 608a, 608b may be beveled (i.e., wall portions 608a, 608b are thinner than wall portions 608c, 608d, and/or may be positioned at critical stress areas), while the bottom surfaces of the wall portions 608c, 608d are beveled or otherwise formed to be flat and parallel to the first horizontal direction hd1 and/or second horizontal direction hd2.

The top portion 608 may include the wall portions 608a-608d. The first wall portion 608a may include a top portion inner sidewall 608a-i, a top portion outer sidewall 608a-o, a top surface 608a-t, and a tapered bottom surface 608a-b. The second wall portion 608b may include a top portion inner sidewall 608b-i, a top portion outer sidewall 608b-o, a top surface 608b-t, and a tapered bottom surface 608b-b. The third wall portion 608c may include a top portion inner sidewall 608c-i, a top portion outer sidewall 608c-o, a top surface 608c-t, and a tapered bottom surface 608c-b. The fourth wall portion 608d may include a top portion inner sidewall 608d-i, a top portion outer sidewall 608d-o, a top surface 608d-t, and a tapered bottom surface 608d-b.

The top portion inner sidewall 608a-i, top portion inner sidewall 608b-i, top portion inner sidewall 608c-i, and top portion inner sidewall 608d-i may be collectively referred to as the top portion inner sidewalls 608a-i-608d-i, and may form an inner rectangular-shaped ring of the top portion 608 of a stiffener structure. The top portion outer sidewall 608a-o, top portion outer sidewall 608b-o, top portion outer sidewall 608c-o, and top portion outer sidewall 608d-o may be collectively referred to as the top portion outer sidewalls 608a-o-608d-o, and may form an outer rectangular-shaped ring of the top portion 608 of a stiffener structure that surrounds the top portion inner sidewalls 608a-i-608d-i. The tapered bottom surface 608a-b, tapered bottom surface 608b-b, tapered bottom surface 608c-b, and tapered bottom surface 608d-b may be collectively referred to as the tapered bottom surfaces 608a-b-608d-b. The top surface 608a-t, top surface 608b-t, top surface 608c-t, and top surface 608d-t may be collectively referred to as the top surfaces 608a-t-608d-t.

The tapered bottom surfaces 608a-b-608d-b may have a top portion taper angle "$\theta_T$" with respect to a horizontal plane (e.g., top surfaces 608a-t-608d-t) that may be in a range from 1 degree to 89 degrees, such as from 5 degrees to 60 degrees, although lesser and greater top portion taper angle $\theta_T$ may also be used. The top portion taper angle $\theta_T$ may, or may not, be uniform across each and all tapered bottom surfaces 608a-b-608d-b. The taper angles top portion taper angle $\theta_T$ of the tapered bottom surfaces 608a-b-608d-b may be equivalent as illustrated. However, in some embodiments, the top portion taper angle $\theta_T$ of the tapered bottom surfaces 608a-b-608d-b may be different. For example, the top portion taper angle $\theta_T$ of the tapered bottom surfaces 608a-b, 608b-b may be a first taper angle, and the top portion taper angle $\theta_T$ of the tapered bottom surfaces 608c-b, 608d-b may be a second taper angle of a different degree amount. As another example, the tapered bottom surfaces 608a-b-608d-b may each have a different top portion taper angle $\theta_T$.

The top portion taper angle $\theta_T$ of the tapered bottom surfaces 608a-b-608d-b of the top portion 608 may be beveled or otherwise formed to equal the corresponding bottom portion taper angles $\theta_B$ of the tapered top surfaces 602a-t-602d-t of the bottom portion 602, such that the ultimate combination or affixation of the bottom portion 602 to the top portion 608 (i.e., via an adhesive layer) may form a single stiffener structure. In other words, each tapered bottom surface 608a-b-608d-b may have a same bottom portion taper angles $\theta_B$ as each tapered top surface 602a-t-602d-t having a top portion taper angle $\theta_T$, respectively. Additionally, each tapered bottom surface 608a-b-608d-b may be a reflection of each tapered top surface 602a-t-602d-t respectively, such that each tapered bottom surface 608a-b-608d-b may parallel to each tapered top surface 602a-t-602d-t respectively. For example, the tapered top surface 602a-t may have a same bottom portion taper angles $\theta_B$ as and may be parallel to the tapered bottom surface 608a-b, the tapered top surface 602b-t may have a same bottom portion taper angles $\theta_B$ as and may be parallel to the tapered bottom surface 608b-b, the tapered top surface 602c-t may have a same bottom portion taper angles $\theta_B$ as and may be parallel to the tapered bottom surface 608c-b, and the tapered top surface 602d-t may have a same bottom portion taper angles $\theta_B$ as and may be parallel to the tapered bottom surface 608d-b. Put another way, a taper angle of the bottom portion with respect to the vertical sidewall 602a-o-602d-o (i.e., a taper angle formed between a bottom portion bevel surface (e.g., 602a-t) and a bottom portion sidewall (e.g., 602a-o) may be supplementary to a corresponding taper angle of the top portion with respect to the vertical sidewall 608a-o-608d-o (i.e., a taper angle formed between a top portion bevel surface (e.g., 608a-b) and a top portion sidewall (e.g., 608a-o)).

Figure 17A:
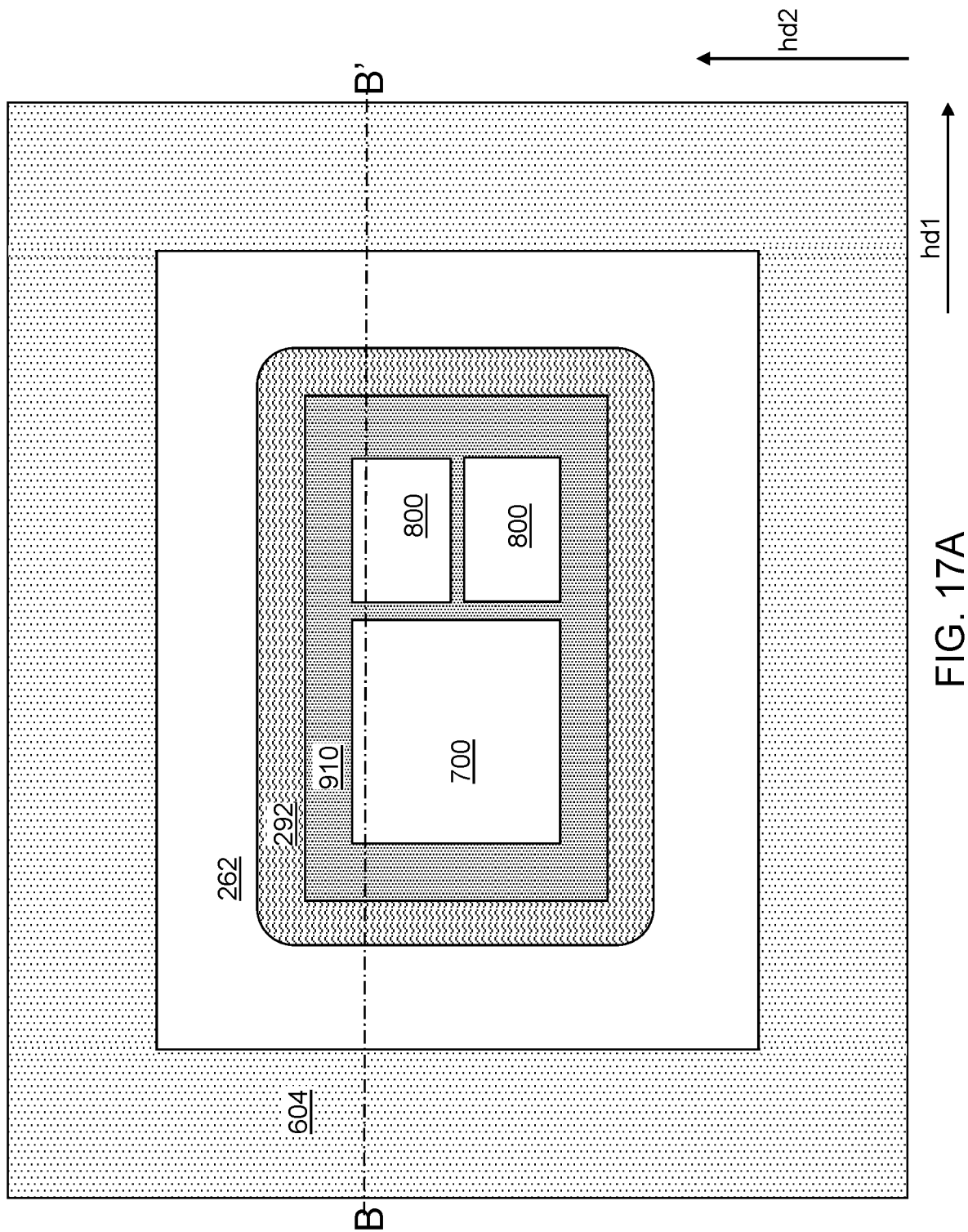
FIG. 17A is a top-down view of an intermediate structure after depositing a first adhesive layer according to an embodiment of the present disclosure.
Figure 17B:
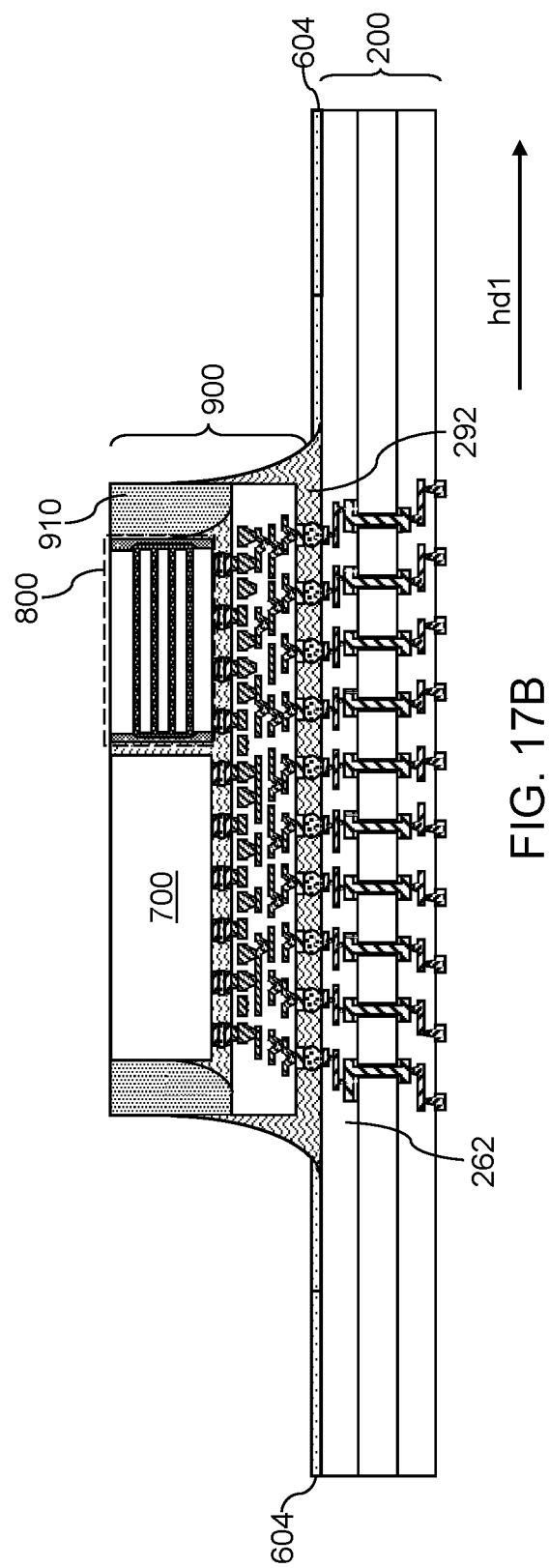
FIG. 17B is a vertical cross-sectional view of the intermediate structure along the vertical plane B-B' of FIG. 17A according to an embodiment of the present disclosure.

FIG. 17A is a top-down view of an intermediate structure after depositing a first adhesive layer according to an embodiment of the present disclosure. FIG. 17B is a vertical cross-sectional view of the intermediate structure along the vertical plane B-B' of FIG. 17A according to an embodiment of the present disclosure. Referring to FIGS. 17A and 17B, an adhesive layer 604 may be formed on a top surface of the package substrate 200 (e.g., on a top surface of the chip-side insulating layers 262). The adhesive layer 604 may be placed, deposited, or otherwise formed as a ring structure surrounding the fan-out package 900. In some embodiments, the adhesive layer 604 may include silicon-based materials. The adhesive layer 604 may be formed to attach the beveled stiffener structure 602 to the package substrate. The adhesive layer 604 may be deposited to form a ring that has a surface area with shape and dimensions equal to or similar to a surface area with shape and dimensions of the bottom surfaces 602a-b-602d-b of the bottom portion 602.

Figure 18A:
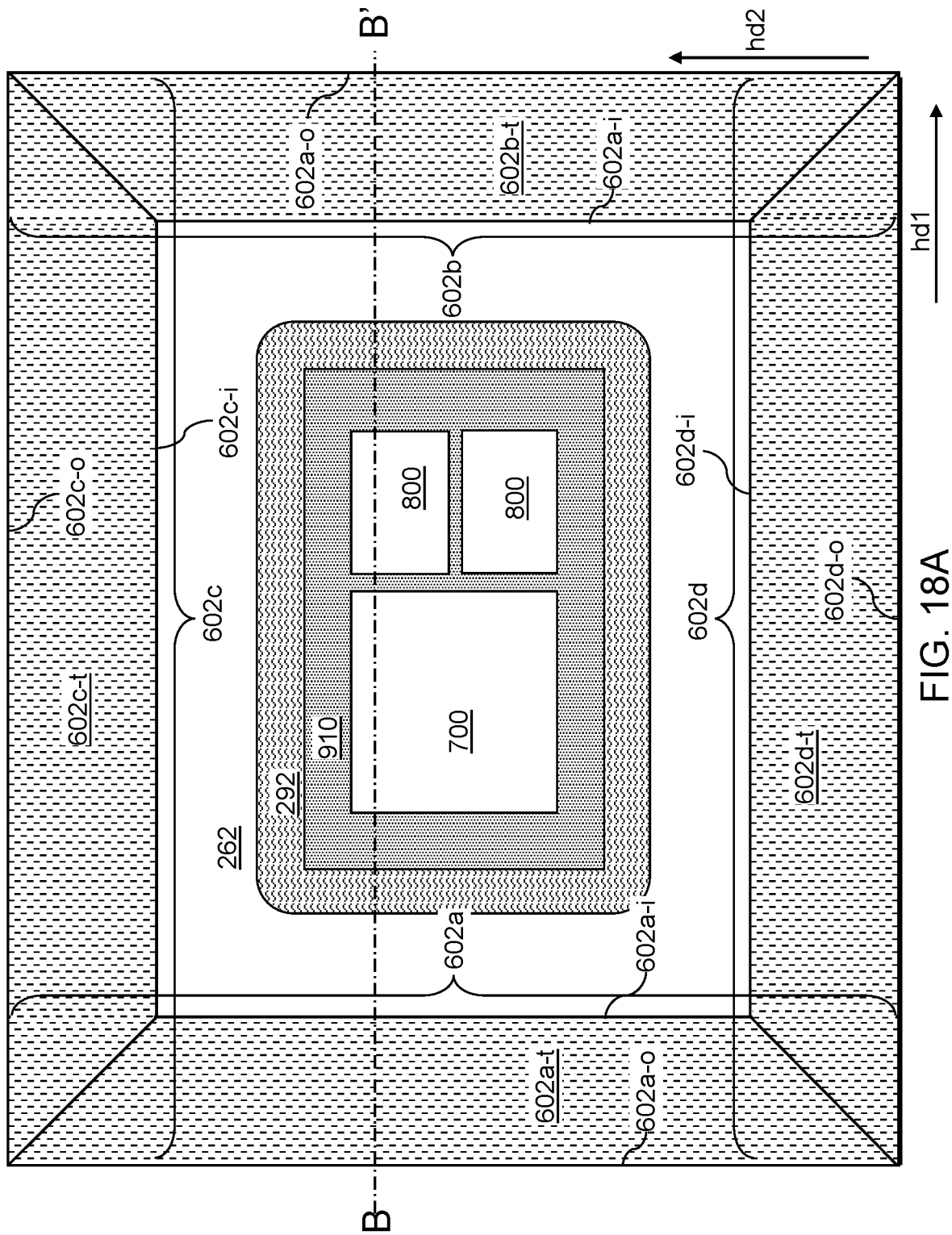
FIG. 18A is a top-down view of an intermediate structure after attaching the bottom portion of the stiffener structure according to an embodiment of the present disclosure.
Figure 18B:
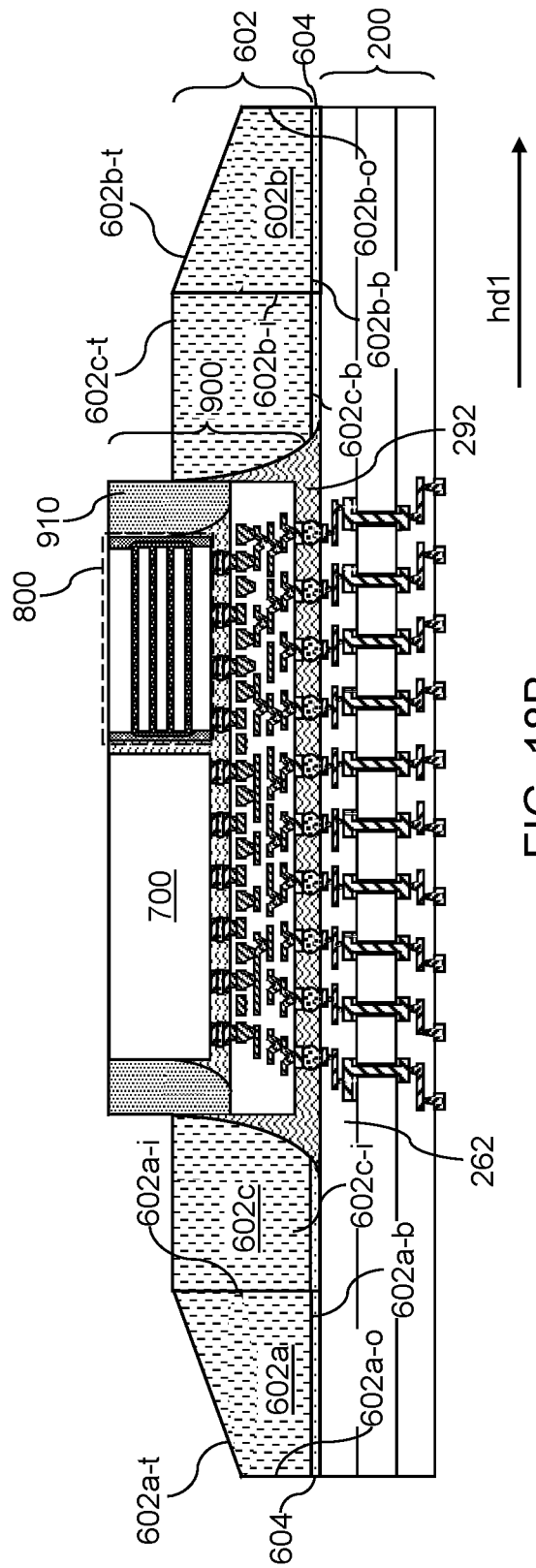
FIG. 18B is a vertical cross-sectional view of the intermediate structure along the vertical plane B-B' of FIG. 18A according to an embodiment of the present disclosure.

FIG. 18A is a top-down view of an intermediate structure after attaching the bottom portion of the stiffener structure according to an embodiment of the present disclosure. FIG. 18B is a vertical cross-sectional view of the intermediate structure along the vertical plane B-B' of FIG. 18A according to an embodiment of the present disclosure. Referring to FIGS. 18A and 18B, the bottom portion 602 may be affixed to or otherwise attached to the package substrate via the adhesive layer 604. Bottom surfaces 602a-b-602d-b of the bottom portion 602 may be attached to a top surface of the first adhesive layer 604.

The bottom portion 602 may include at least one inner sidewall proximate to at least one respective outer sidewall of the fan-out package 900. For example, the bottom portion inner sidewall 602a-i may be proximate to a first outer sidewall of the fan-out package 900, the bottom portion inner sidewall 602b-i may be proximate to a second outer sidewall of the fan-out package 900, the bottom portion inner sidewall 602c-i may be proximate to a third outer sidewall of the fan-out package 900, and the bottom portion inner sidewall 602d-i may be proximate to a fourth outer sidewall of the fan-out package 900. The bottom portion inner sidewalls 602a-i-602d-i may therefore surround the fan-out package 900.

The bottom portion 602 may include at least one outer sidewall proximate to at least one respective inner sidewall (i.e., on an opposite side of a respective inner sidewall along the wall portions 602a-602d distally located from sidewalls of the fan-out package 900). For example, the bottom portion outer sidewall 602a-o may be proximate to the bottom portion inner sidewall 602a-i, the bottom portion outer sidewall 602b-o may be proximate to the bottom portion inner sidewall 602b-i, the bottom portion outer sidewall 602c-o may be proximate to the bottom portion inner sidewall 602c-i, and the bottom portion outer sidewall 602d-o may be proximate to the bottom portion inner sidewall 602d-i.

Figure 19A:
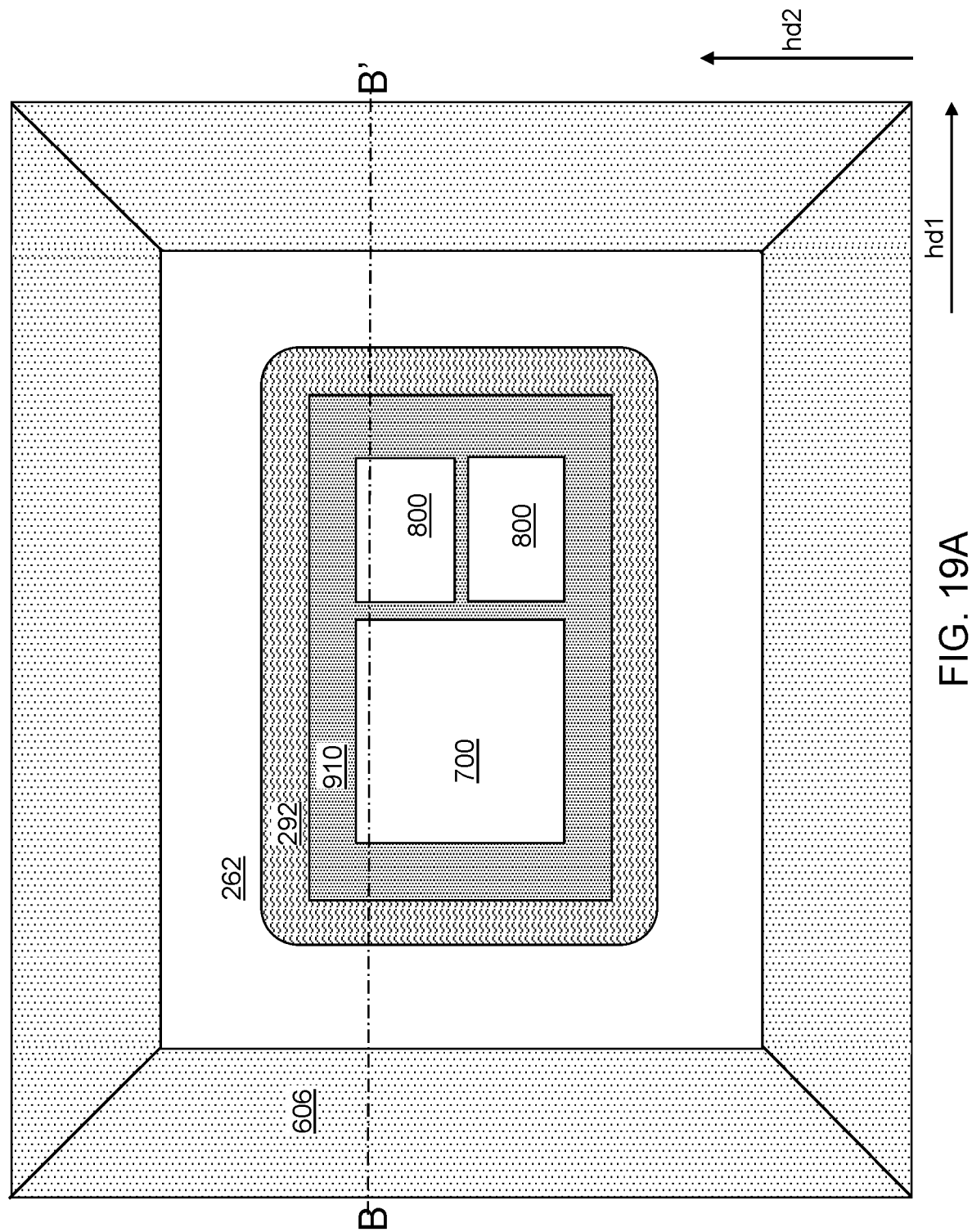
FIG. 19A is a top-down view of an intermediate structure after depositing a second adhesive layer according to an embodiment of the present disclosure.
Figure 19B:
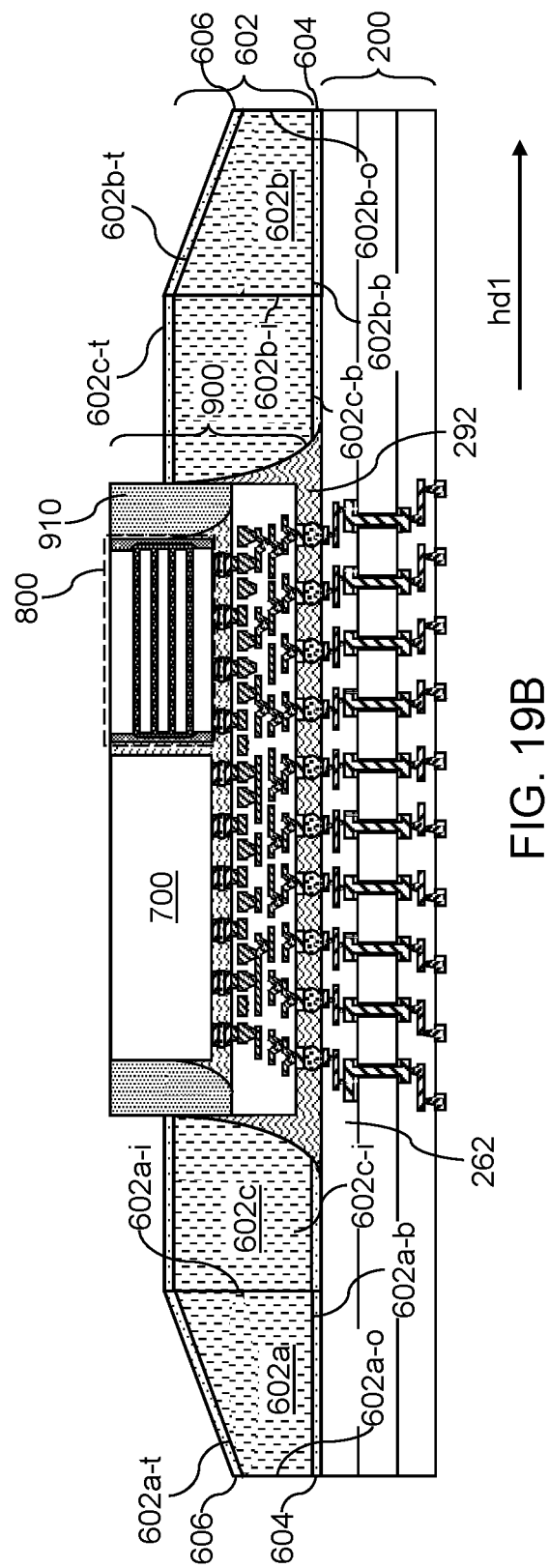
FIG. 19B is a vertical cross-sectional view of the intermediate structure along the vertical plane B-B' of FIG. 19A according to an embodiment of the present disclosure.

FIG. 19A is a top-down view of an intermediate structure after depositing a second adhesive layer according to an embodiment of the present disclosure. FIG. 19B is a vertical cross-sectional view of the intermediate structure along the vertical plane B-B' of FIG. 19A according to an embodiment of the present disclosure. Referring to FIGS. 19A and 19B, an adhesive layer 606 may be formed on tapered top surfaces 602a-t-602d-t of the bottom portion 602. The adhesive layer 606 may be placed, deposited, or otherwise formed as a ring structure surrounding the fan-out package 900. In some embodiments, the adhesive layer 606 may include silicon-based materials. The adhesive layer 606 may be formed to attach the top portion 608 to the bottom portion 602. The adhesive layer 606 may be deposited to form a ring that has a surface area with shape and dimensions equal to or similar to a surface area with shape and dimensions of the tapered top surfaces 602a-t-602d-t of the bottom portion 602.

Figure 20A:
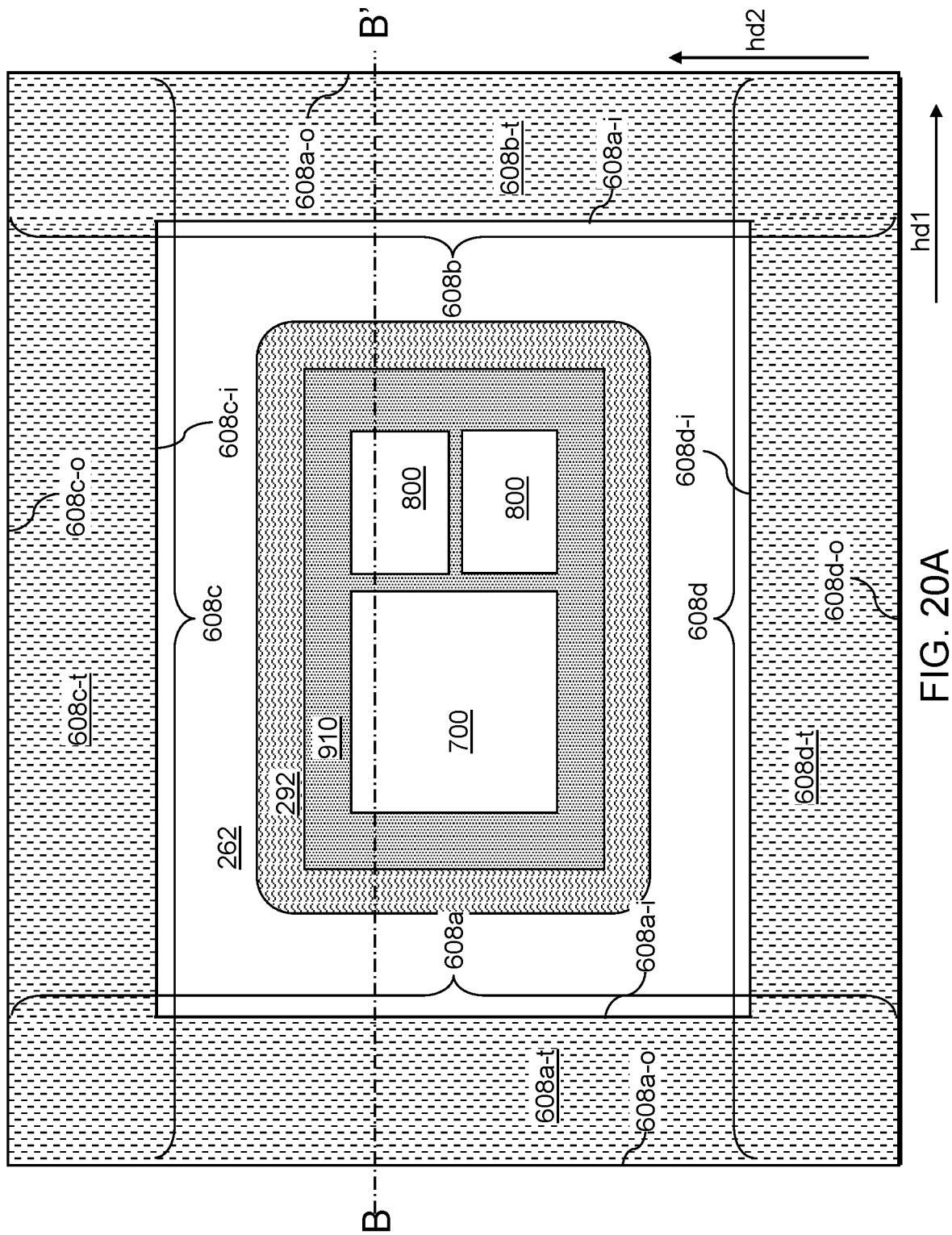
FIG. 20A is a top-down view of an intermediate structure after attaching the top portion of the stiffener structure according to an embodiment of the present disclosure.

FIG. 20A is a top-down view of an intermediate structure after attaching the top portion of the stiffener structure according to an embodiment of the present disclosure. FIGS. 20B and 20C are vertical cross-sectional views of the intermediate structure along the vertical plane B-B' of FIG. 20A according to an embodiment of the present disclosure. FIGS. 20B and 20C depict the same view of the intermediate structure, however, FIG. 20C has different labeling than FIG. 20B for illustrative purposes. Referring to FIGS. 20A-20C, the top portion 608 may be affixed to or otherwise attached to the bottom portion 602 via the adhesive layer 606 to form a composite stiffener structure 610.

The top portion 608 may include at least one inner sidewall proximate to at least one respective outer sidewall of the fan-out package 900. For example, the top portion inner sidewall 608a-i may be proximate to a first outer sidewall of the fan-out package 900, the top portion inner sidewall 608b-i may be proximate to a second outer sidewall of the fan-out package 900, the top portion inner sidewall 608c-i may be proximate to a third outer sidewall of the fan-out package 900, and the top portion inner sidewall 608d-i may be proximate to a fourth outer sidewall of the fan-out package 900. The top portion inner sidewalls 608a-i-608d-i may therefore surround the fan-out package 900.

The top portion 608 may include at least one outer sidewall proximate to at least one respective inner sidewall (i.e., on an opposite side of a respective inner sidewall along the wall portions 608a-608d distally located from sidewalls of the fan-out package 900). For example, the top portion outer sidewall 608a-o may be proximate to the top portion inner sidewall 608a-i, the top portion outer sidewall 608b-o may be proximate to the top portion inner sidewall 608b-i, the top portion outer sidewall 608c-o may be proximate to the top portion inner sidewall 608c-i, and the top portion outer sidewall 608d-o may be proximate to the top portion inner sidewall 608d-i.

Tapered bottom surfaces 608a-b-608d-b of the top portion 608 may be attached to a top surface of the second adhesive layer 606, such that top portion 608 is vertically aligned (i.e., in a same vertical plane) with the bottom portion 602. For example, the top portion inner sidewalls 608a-i-608d-i may be vertically aligned with the bottom portion inner sidewalls 602a-i-602d-i respectively, and the top portion outer sidewalls 608a-o-608d-o may be vertically aligned with the bottom portion outer sidewalls 602a-o-602d-o respectively.

The bottom portion taper angles $\theta_B$ of the tapered top surfaces 602a-t-602d-t of the bottom portion 602 that are respectively parallel with the tapered bottom surfaces 608a-b-608d-b of the top portion 608 may define various heights of the inner and outer sidewalls of the stiffener structure 610. For example, bottom portion inner sidewalls 602a-i-602d-i may have a height "$B_i$," bottom portion outer sidewalls 602a-o-602d-o may have a height "$B_o$," top portion inner sidewalls 608a-i-608d-i may have a height "$T_i$," and top portion outer sidewalls 608a-o-608d-o may have a height "$T_o$." In some embodiments, $B_i$ may be greater than $B_o$, and $T_i$ may be less than $T_o$. In some embodiments, $B_i$ plus $T_i$ may be equal to $B_o$ plus $T_o$, such that the total height of the inner sidewalls (i.e., 602a-i-602d-i, 608a-i-608d-i) of the stiffener structure 610 may be equal to roughly equal to the total height of the outer sidewalls (i.e., 602a-o-602d-o, 608a-o-608d-o) of the stiffener structure 610 (including the depth of the adhesive layer 606).

In some embodiments, the bottom portion 602 may have a different coefficient of thermal expansion (CTE) than the top portion 608. For example, a CTE of the bottom portion 602 may be less than a CTE of the top portion 608. Optimizing the CTE of the bottom portion 602 with respect to the CTE of the top portion 608 may reduce risk of delamination of the first adhesive layer 604 and the second adhesive layer 606, thereby allowing the stiffener structure to provide increased structural support for the fan-out package 900 and the package substrate 200. Delamination risk may further be reduced via the composite stiffener structure 610 by increasing the surface area upon which the second adhesive layer 606 may be applied (i.e., between tapered top surfaces 602a-t-602d-t and tapered bottom surfaces 608a-b-608d-b that are angled and tapered). The increased surface area allows more adhesive to be deposited, therefore increasing the strength of the bond between the bottom portion 602 and the top portion 608. Furthermore, the angled tapered surfaces of the bottom portion 602 and top portion 608 may decrease lateral (i.e., shear) stress in the first horizontal direction hd1 and the second horizontal direction hd2, and therefore decrease delamination risk, by providing a surface upon which shear stress may be partially exerted. For example, a shear stress or force exerted upon the top portion outer sidewall 608a-o in the first horizontal direction may be reduced, as compared to a conventional two-piece stiffener structure with flat non-tapered surfaces, by being indirectly and partially exerted upon and reduced by the tapered top surface 602a-t.

Figure 21:
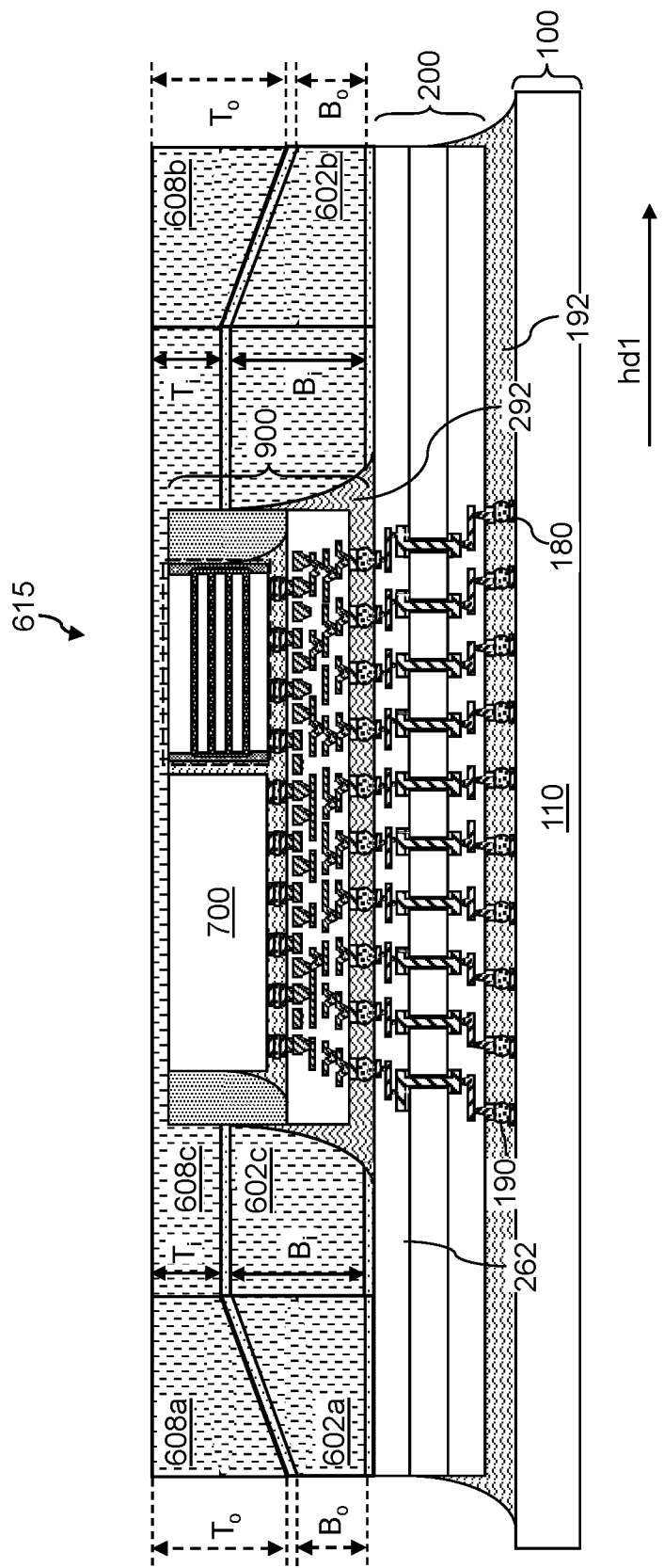
FIG. 21 is a vertical cross-sectional view of a chip package structure after the package substrate is attached to a printed circuit board (PCB) according to an embodiment of the present disclosure.

FIG. 21 is a vertical cross-sectional view of a chip package structure 615 after the package substrate is attached to a printed circuit board (PCB) according to an embodiment of the present disclosure. Referring to FIG. 21, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. Exposed outermost surfaces of the underfill material portion 192 surrounding vertical sidewalls of the package substrate 200 may have a curved or concave shape with varying taper angles formed as a result of the deposition process. The package substrate 200 is attached to the PCB 100 through the array of solder joints 190.

Figure 22:
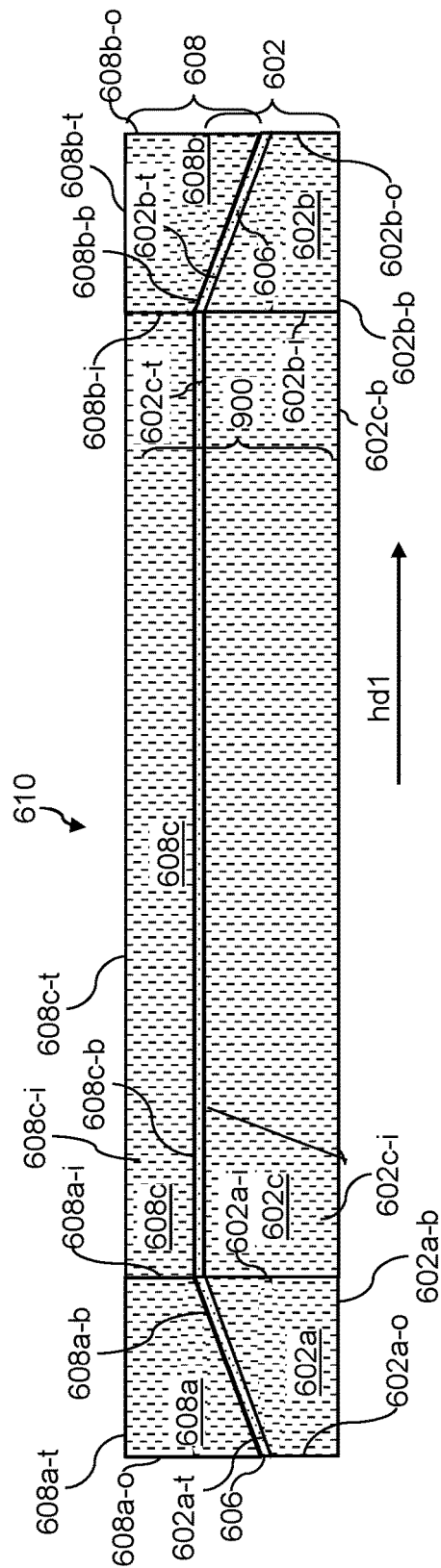
FIG. 22 is a vertical cross-sectional view of the first alternative structure after forming a stiffener structure according to an embodiment of the present disclosure.
Figure 23:
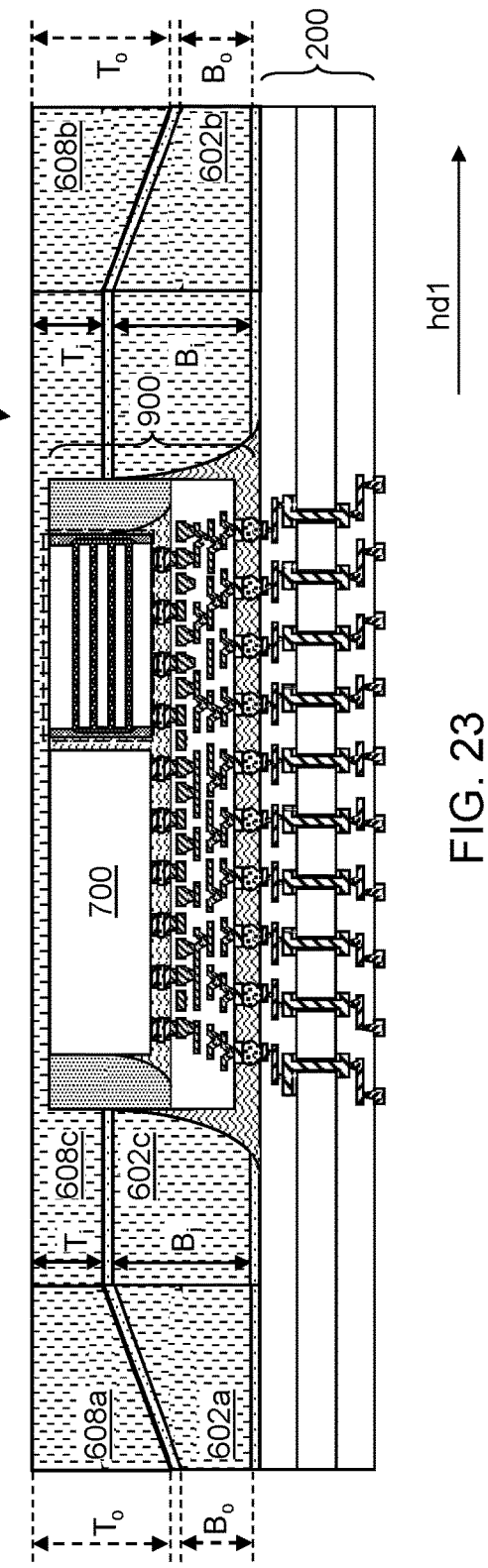
FIG. 23 is a vertical cross-sectional view of the first alternative structure after attaching a stiffener structure to a package substrate according to an embodiment of the present disclosure.

FIGS. 22 and 23 are various views of a first alternative structure according to an embodiment of the present disclosure. FIG. 22 is a vertical cross-sectional view of the first alternative structure after forming a stiffener structure according to an embodiment of the present disclosure. FIG. 23 is a vertical cross-sectional view of the first alternative structure after attaching a stiffener structure to a package substrate according to an embodiment of the present disclosure.

Referring to FIG. 22, a stiffener structure 610 may be formed in a similar manner as described with reference to FIGS. 1A-21. As described with reference to FIGS. 1A-21, a stiffener structure 610 may be formed by sequentially affixing the bottom portion 602 and the top portion 608 to the package substrate 200. For example, forming the stiffener structure 610 may include (i) beveling the bottom portion 602 to have a tapered top surface (e.g., 602a-t-602d-t), a bottom portion inner sidewall (e.g., 602a-i-602d-i), and a bottom portion outer sidewall (e.g., 602a-o-602d-o), (ii) attaching a bottom surface of the bottom portion 602 to the top surface of the first adhesive layer 604, in which the bottom portion inner sidewall may be proximate to the fan-out package 900 and the bottom portion outer sidewall may be distal from the fan-out package 900, (iii) depositing the second adhesive layer 606 on the tapered top surface, (iv) beveling the top portion 608 to have a tapered bottom surface (e.g., 608a-b-608d-b), a top portion inner sidewall (e.g., 608a-i-608d-i), and a top portion outer sidewall (e.g., 608a-o-608d-o), and (v) attaching the tapered bottom surface to the top surface of the second adhesive layer 606, in which the top portion inner sidewall is in a same vertical plane as the bottom portion inner sidewall and the top portion outer sidewall is in a same vertical plane as the bottom portion outer sidewall.

Alternatively, referring to FIGS. 22 and 23, the stiffener structure 610 may be formed from the bottom portion 602, the second adhesive layer 606, and the top portion 608 prior to attaching the bottom portion 602 to the package substrate 200. For example, forming the stiffener structure 610 may include (i) beveling the bottom portion 602 to have a tapered top surface (e.g., 602a-t-602d-t), a bottom portion inner sidewall (e.g., 602a-i-602d-i), and a bottom portion outer sidewall (e.g., 602a-o-602d-o), (ii) depositing the second adhesive layer 606 on the tapered top surface, (iii) beveling the top portion 608 to have a tapered bottom surface (e.g., 608a-b-608d-b), a top portion inner sidewall (e.g., 608a-i-608d-i), and a top portion outer sidewall (e.g., 608a-o-608d-o), (iv) attaching the tapered bottom surface to the top surface of the second adhesive layer 606, in which the top portion inner sidewall is in a same vertical plane as the bottom portion inner sidewall and the top portion outer sidewall is in a same vertical plane as the bottom portion outer sidewall, and (v) attaching a bottom surface of the bottom portion 602 to the top surface of the first adhesive layer 604, in which the bottom portion inner sidewall and top portion inner sidewall may be proximate to the fan-out package 900 and the bottom portion outer sidewall and top portion outer sidewall may be distal from the fan-out package 900.

Figure 24A:
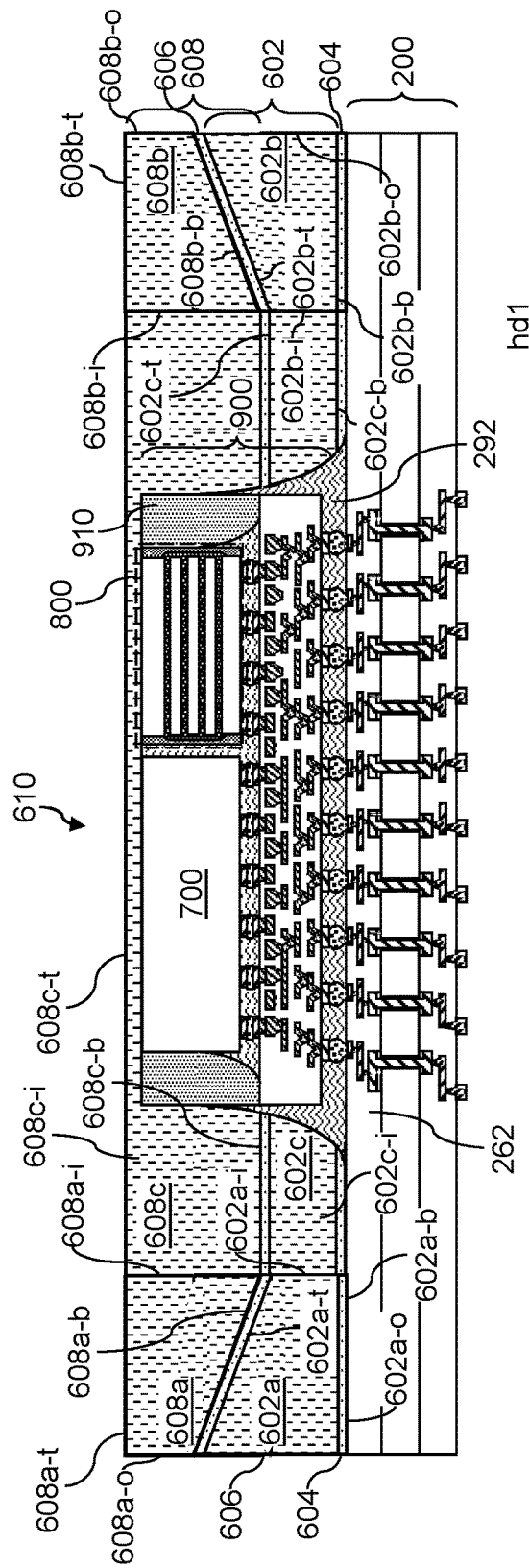
FIGS. 24A and 24B are vertical cross-sectional views of a second alternative structure after attaching the stiffener structure according to an embodiment of the present disclosure.
Figure 24B:
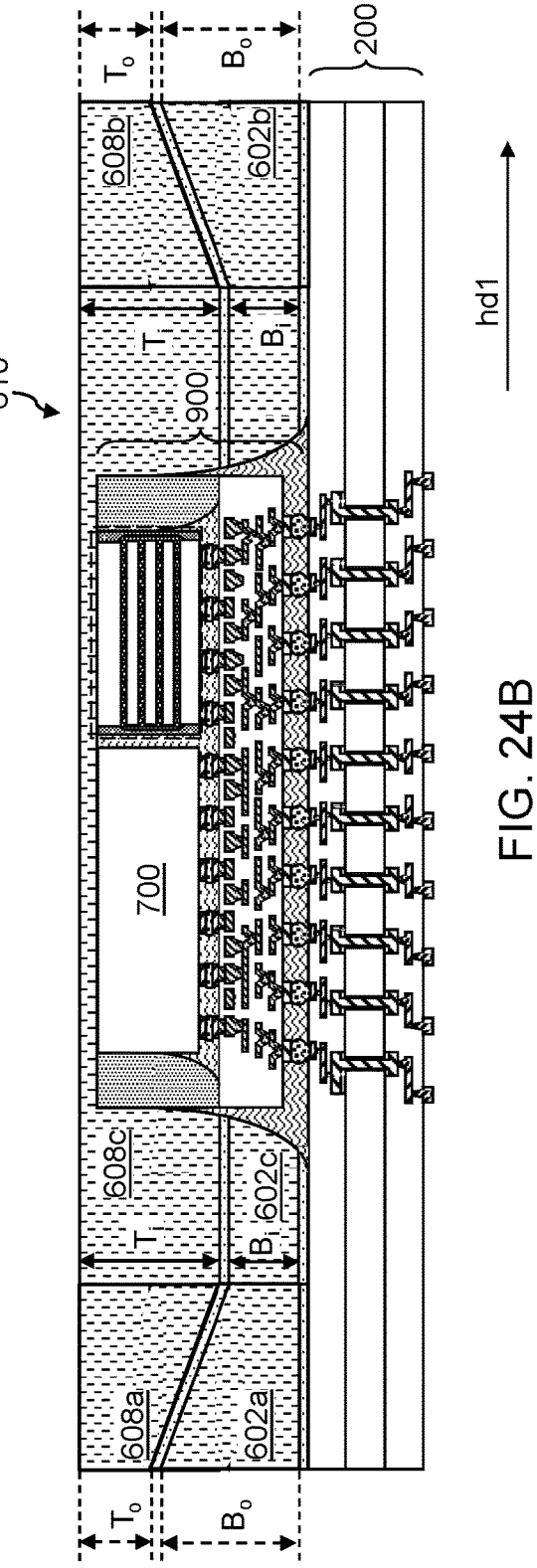

FIGS. 24A and 24B are various views of a second alternative structure according to an embodiment of the present disclosure. FIGS. 24A and 24B are vertical cross-sectional views of the second alternative structure after attaching the stiffener structure according to an embodiment of the present disclosure. FIGS. 24A and 24B depict the same view of the intermediate structure, however, FIG. 24B has different labeling than FIG. 24A for illustrative purposes. Referring to FIGS. 24A and 24B, the bottom portion taper angle $\theta_B$ and top portion taper angle $\theta_T$ may be inverted such that shape of the wall portions 602a-602d, 608a-608d are mirrored as compared to FIGS. 1A-21. For example, the bottom portion taper angles $\theta_B$ of the tapered top surfaces 602a-t-602d-t of the bottom portion 602 that are respectively parallel with the top portion taper angles $\theta_T$ tapered bottom surfaces 608a-b-608d-b of the top portion 608 may define various heights of the inner and outer sidewalls of the stiffener structure 610. For example, bottom portion inner sidewalls 602a-i-602d-i may have a height "$B_i$," bottom portion outer sidewalls 602a-o-602d-o may have a height "$B_o$," top portion inner sidewalls 608a-i-608d-i may have a height "$T_i$," and top portion outer sidewalls 608a-o-608d-o may have a height "$T_o$." In some embodiments, $B_i$ may be less than $B_o$, and $T_i$ may be greater than $T_o$. In some embodiments, $B_i$ plus $T_i$ may be equal to $B_o$ plus $T_o$, such that the total height of the inner sidewalls (i.e., 602a-i-602d-i, 608a-i-608d-i) of the stiffener structure 610 may be equal to roughly equal to the total height of the outer sidewalls (i.e., 602a-o-602d-0, 608a-o-608d-o) of the stiffener structure 610 (including the depth of the adhesive layer 606).

Figure 25:
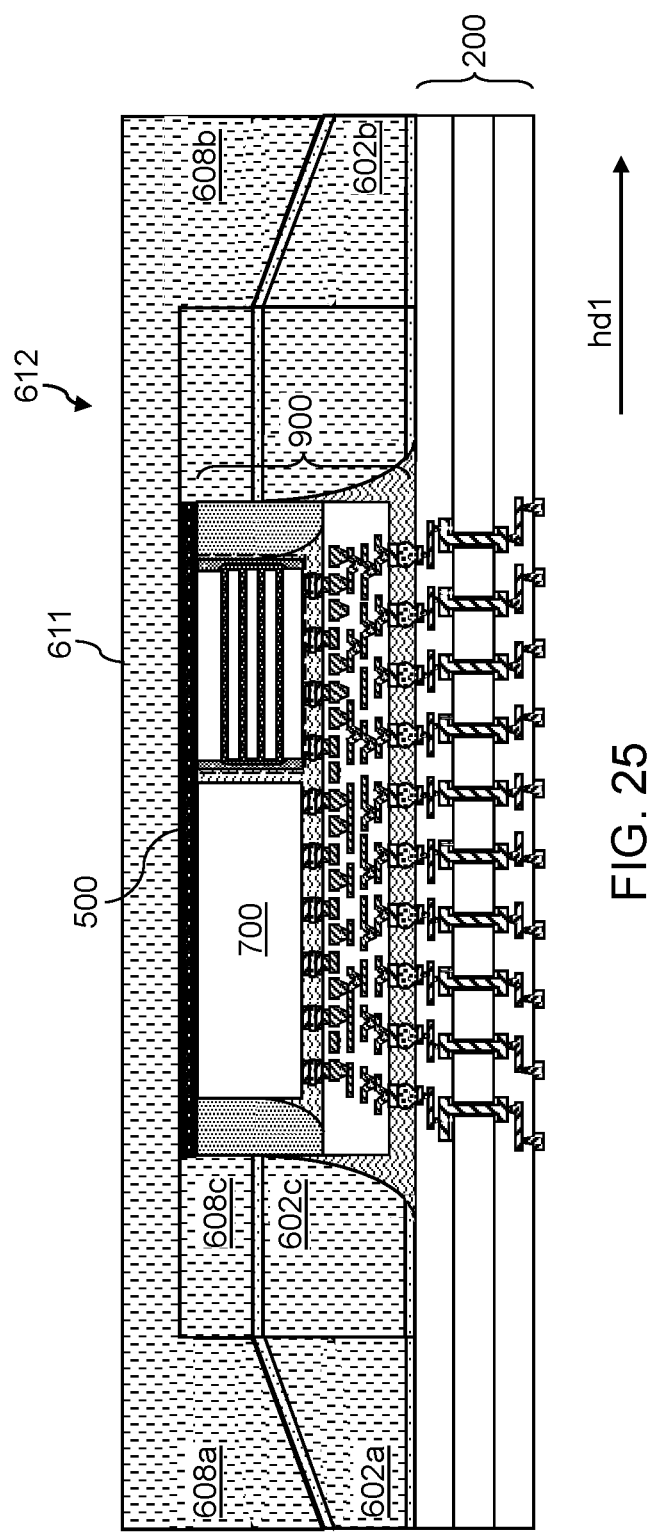
FIG. 25 is a horizontal cross-sectional view of a third alternative structure after attaching a lid-type top portion according to an embodiment of the present disclosure.

FIG. 25 is a horizontal cross-sectional view of a third alternative structure after attaching a lid-type top portion 611 according to an embodiment of the present disclosure. Referring to FIG. 25, a thermal interface material (TIM) 500 may be deposited or otherwise formed on a top surface of the fan-out package 900, including top surfaces of the semiconductor dies (700, 800), the second underfill material portion 292, and the molding compound die frame 910. The TIM 500 may be formed using one or more high thermal conductivity materials, such as polymers including silicon, carbon, and oxygen. In some embodiments, the TIM 500 may include materials such as aluminum oxide (Al2O3) or zinc oxide (ZnO2) mixed with silicone ([R2SiO]n) and other applicable materials. In some embodiments, the thickness of the TIM 500 may be in a range from 10 μm to 300 μm, although lesser or greater thicknesses may be used.

A lid-type top portion 611 may be formed in a similar manner as forming the top portion 608 as described with reference to FIGS. 1A-21, with the addition of a lid portion connecting the sidewalls 608a-608d. The lid-type top portion 611 may be attached to bottom portion 602 via the second adhesive layer 606 to form a stiffener structure 612. A bottom surface of the lid portion of the lid-type top portion 611 may be attached to and in contact with a top surface of the TIM 500, such that heat may be transferred from the semiconductor dies (700, 800) to the lid-type top portion 611 via the TIM 500.

Figure 26A:
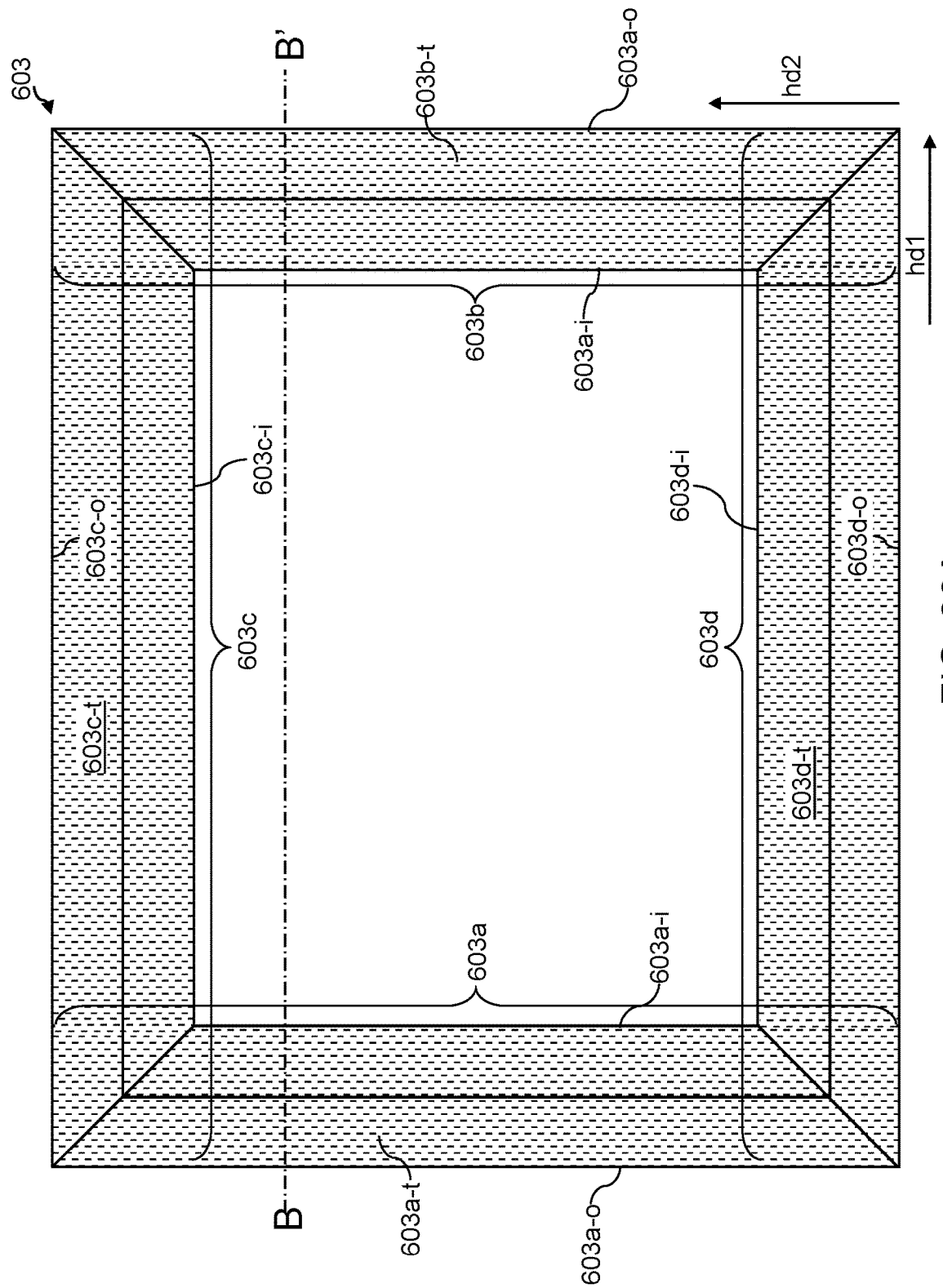
FIGS. 26A and 26B are various views of a fourth alternative structure according to an embodiment of the present disclosure.
Figure 26B:
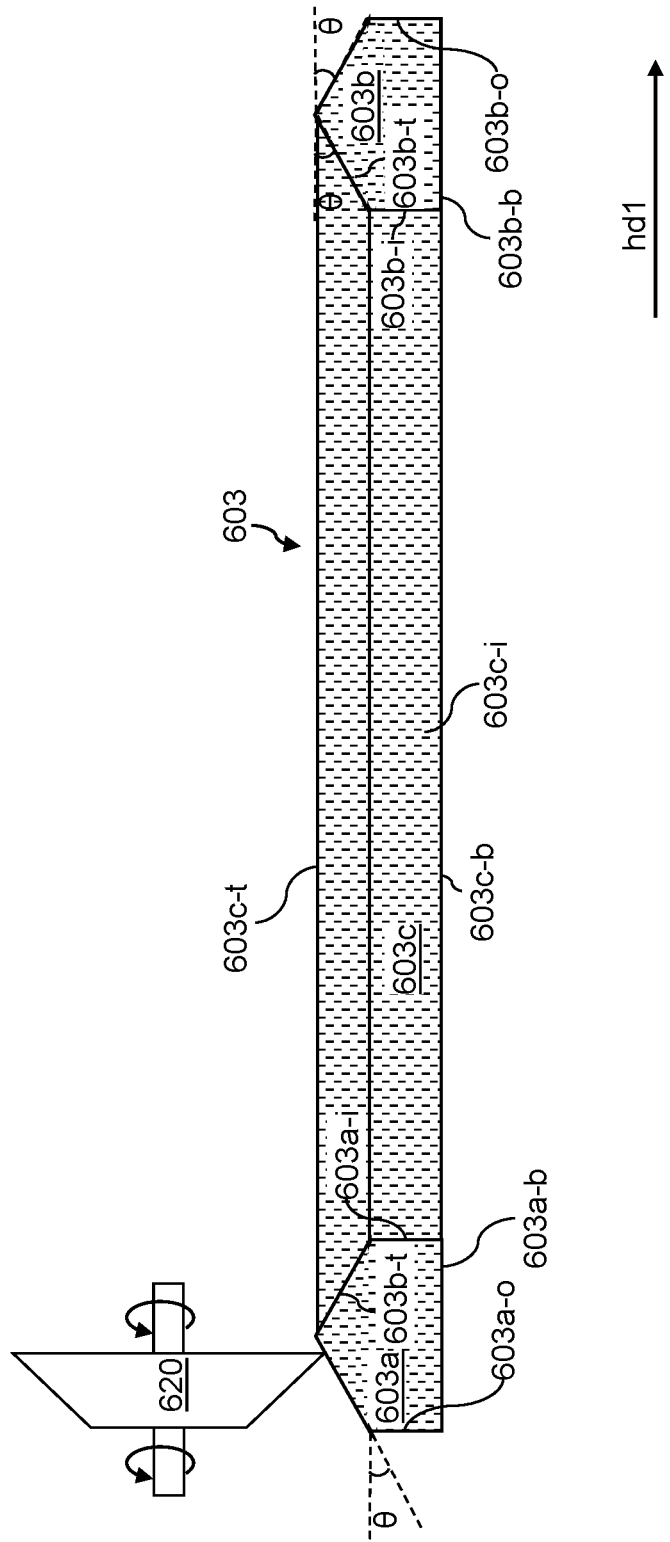

FIGS. 26A and 26B are various views of a fourth alternative structure according to an embodiment of the present disclosure. FIG. 26A is a top-down view of a bottom portion of a stiffener structure according to an embodiment of the present disclosure. FIG. 26B is a vertical cross-sectional view of the bottom portion of the stiffener structure along the vertical plane B-B' of FIG. 26A according to an embodiment of the present disclosure. Referring to FIGS. 26A and 26B, a bottom portion 603 of a beveled stiffener structure is illustrated. Portions of the first wall portion 603a, second wall portion 603b, third wall portion 603c, and fourth wall portion 603d may be cut, drilled, beveled, or milled using a milling apparatus 620 in a similar manner as described with reference to FIGS. 14A-14C to form bottom surfaces 603a-b-603d-b, bottom portion inner sidewalls 603a-i-603d-i, bottom portion outer sidewalls 603a-o-603d-o, and tapered top surfaces 603a-t-603d-t. The tapered top surfaces 603a-t-603d-t may be formed to have two edges, each with a taper angle θ, converge to a point, such that each wall portion 603a-603d has an extruded portion that extends beyond the height of the inner and outer sidewalls.

Figure 27A:
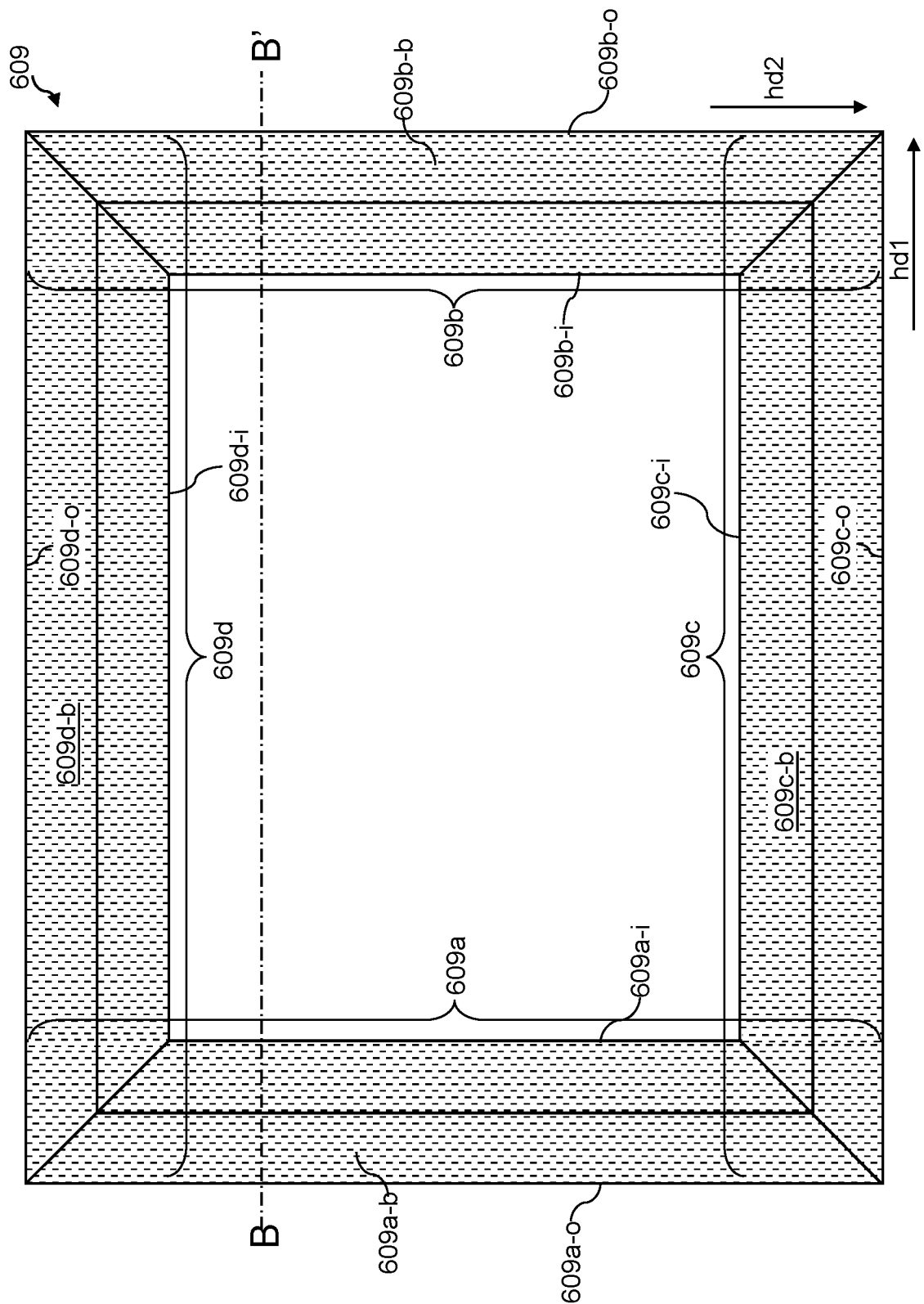
FIGS. 27A and 27B are various views of the fourth alternative structure according to an embodiment of the present disclosure.
Figure 27B:
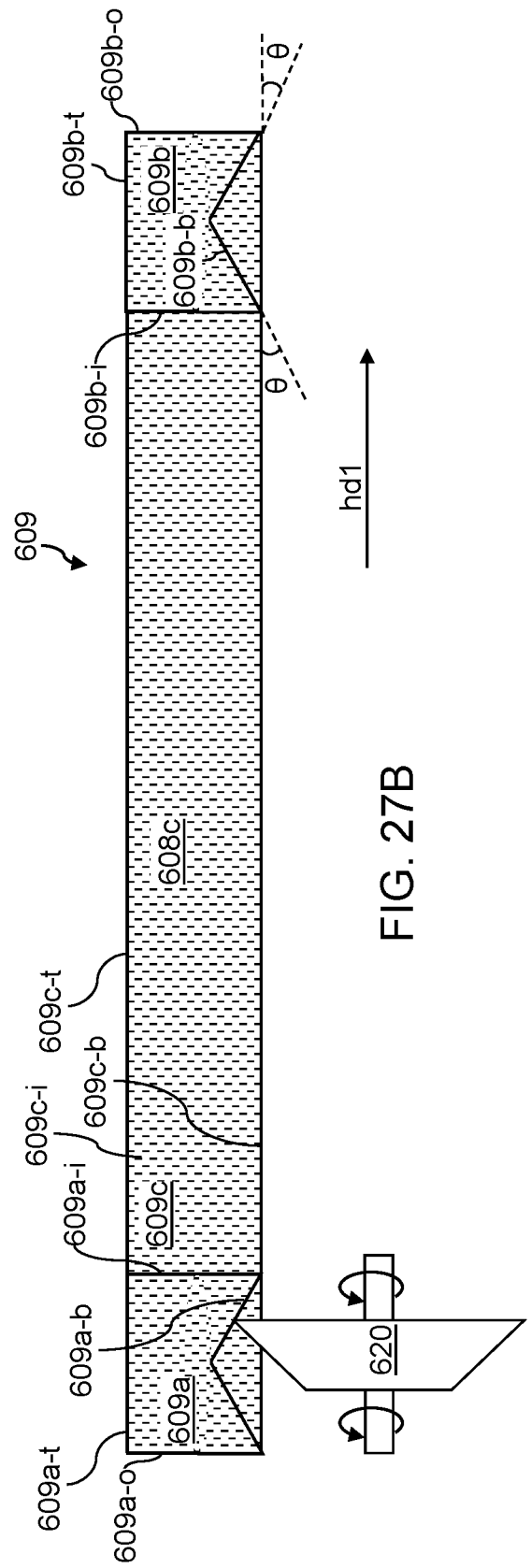

FIGS. 27A and 27B are various views of the fourth alternative structure according to an embodiment of the present disclosure. FIG. 27A is a bottom-up view of a top portion of a stiffener structure according to an embodiment of the present disclosure. FIG. 27B is a vertical cross-sectional view of the top portion of the stiffener structure along the vertical plane B-B' of FIG. 27A according to an embodiment of the present disclosure. Referring to FIGS. 27A and 27B, a top portion 609 of a beveled stiffener structure is illustrated. Portions of the first wall portion 609a, second wall portion 609b, third wall portion 609c, and fourth wall portion 609d may be cut, drilled, beveled, or milled using a milling apparatus 620 in a similar manner as described with reference to FIGS. 16A-16C to form tapered bottom surfaces 609a-b-609d-b, top portion inner sidewalls 609a-i-609d-i, top portion outer sidewalls 609a-o-609d-o, and top surfaces 609a-t-609d-t. The tapered bottom surfaces 609a-b-609d-b may be formed to have two edges, each with a taper angle θ, converge to a point, such that each wall portion 609a-609d has a receptive portion that extends into the wall portions 609a-609d.

Figure 28:
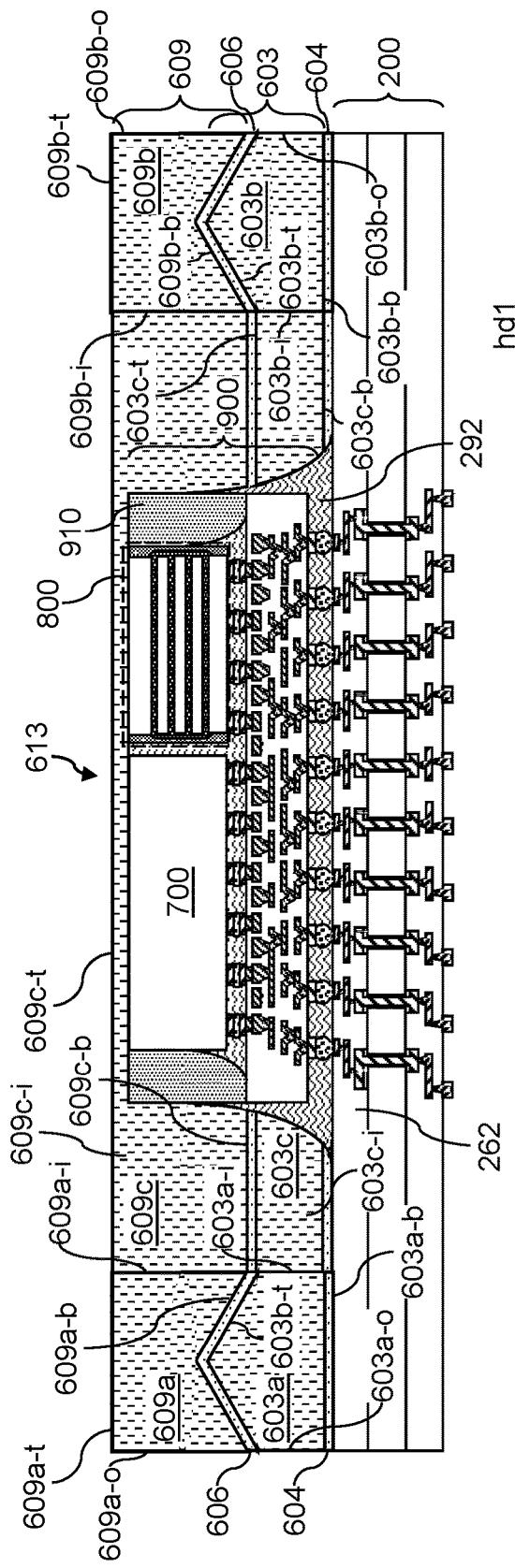
FIG. 28 is a vertical cross-sectional view of the fourth alternative structure after forming and attaching a stiffener structure according to an embodiment of the present disclosure.

FIG. 28 is a vertical cross-sectional view of the fourth alternative structure after forming and attaching a stiffener structure according to an embodiment of the present disclosure. Referring to FIG. 28, a stiffener structure 613 including the bottom portion 603, second adhesive layer 606, and the top portion 609 is attached to the first adhesive layer 604 in a similar manner as described with reference to FIGS. 17A-21. The tapered top surfaces 603a-t-603d-t may form an extruded portion of the wall portion 603a-603d respectively, in which each extruded portion may be received by a receptive portion of the wall portions 609a-609d that are formed by the tapered bottom surfaces 609a-b-609d-b. The tapered bottom surfaces 609a-b-609d-b may be parallel with the tapered top surfaces 603a-t-603d-t such that the depth of the adhesive layer 606 is consistent throughout the space between the tapered bottom surfaces 609a-b-609d-b and the tapered top surfaces 603a-t-603d-t.

Figure 29:
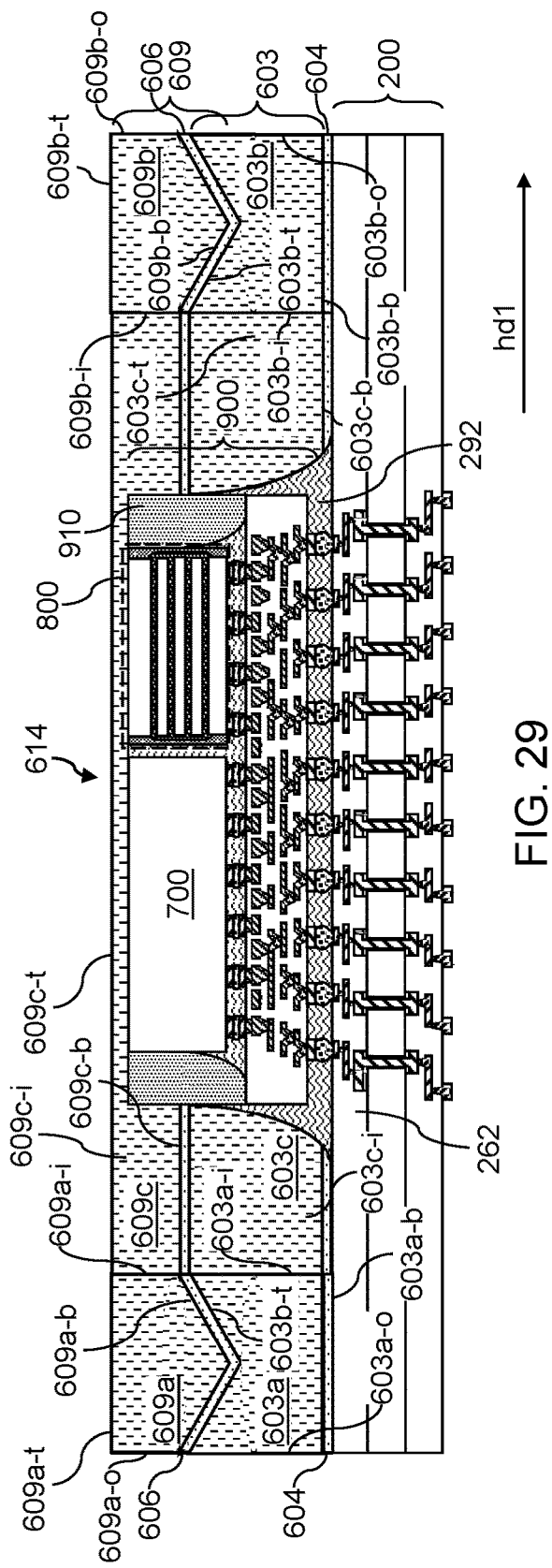
FIG. 29 is a vertical cross-sectional view of the fifth alternative structure after forming and attaching a stiffener structure according to an embodiment of the present disclosure.

FIG. 29 is a vertical cross-sectional view of the fifth alternative structure after forming and attaching a stiffener structure according to an embodiment of the present disclosure. Referring to FIG. 29, a stiffener structure 614 including the bottom portion 603, second adhesive layer 606, and the top portion 609 is attached to the first adhesive layer 604 in a similar manner as described with reference to FIGS. 17A-21 and 26A-28. The tapered top surfaces 603a-t-603d-t may form an extruded portion of the wall portion 603a-603d respectively, in which each extruded portion may be received by a receptive portion of the wall portions 603a-603d that are formed by the tapered top surfaces 603a-t-603d-t. The tapered bottom surfaces 609a-b-609d-b may be parallel with the tapered top surfaces 603a-t-603d-t such that the depth of the adhesive layer 606 is consistent throughout the space between the tapered bottom surfaces 609a-b-609d-b and the tapered top surfaces 603a-t-603d-t. Further embodiments with a plurality of beveled surfaces to increase the surface area of the adhesive layer between a top portion and a bottom portion of the stiffener structure are further contemplated. For example, a jigsaw or sawtooth surface between the top portion and bottom portion of a composite stiffener structure may be contemplated.

Figure 30:
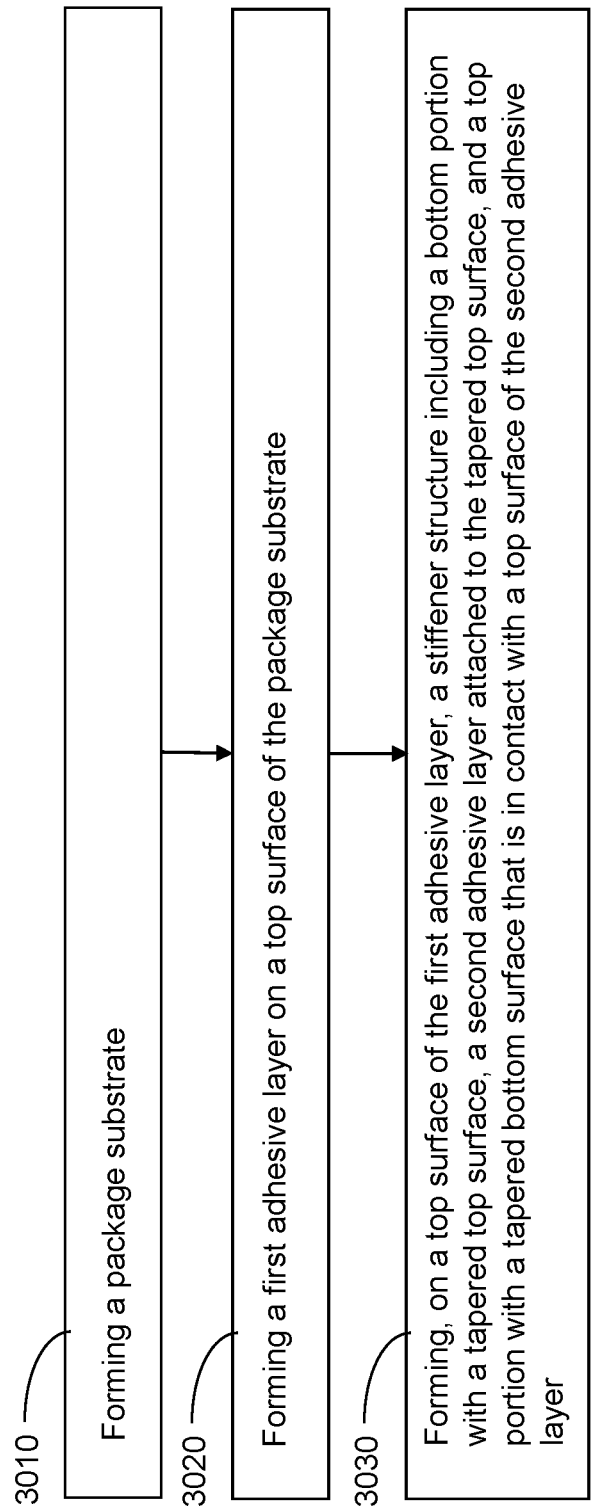
FIG. 30 is a flowchart illustrating steps for forming a structure according to an embodiment of the present disclosure.

Referring to FIG. 30, a flowchart illustrates steps for forming a chip package structure 615 according to an embodiment of the present disclosure.

Referring to step 3010 and FIGS. 1A, 1B, 2A, and 2B, a package substrate 200 may be formed.

Referring to step 3020 and FIGS. 17A and 17B, a first adhesive layer 604 may be formed on a top surface of the package substrate 200.

Referring to step 3030 and FIGS. 18A-29, a stiffener structure (e.g., 610, 612, 613) including a bottom portion (e.g., 602, 603) with a tapered top surface (e.g., 602a-t-602d-t, 603a-t-603d-t), a second adhesive layer 606 attached to the tapered top surface, and a top portion (e.g., 608, 609) with a tapered bottom surface (e.g., 608a-b-608d-b, 609a-b-609d-b) that is in contact with the second adhesive layer 606 may be formed on a top surface of the first adhesive layer 604.

Some embodiments may further include forming a fan-out package 900 on top of the package substrate 200. In some embodiments, forming the stiffener structure (e.g., 610, 612, 613) may include (i) beveling the bottom portion 602 to have a tapered top surface (e.g., 602a-t-602d-t), a bottom portion inner sidewall (e.g., 602a-i-602d-i), and a bottom portion outer sidewall (e.g., 602a-o-602d-o), (ii) attaching a bottom surface of the bottom portion 602 to the top surface of the first adhesive layer 604, in which the bottom portion inner sidewall may be proximate to the fan-out package 900, and the bottom portion outer sidewall may be distal from the fan-out package 900, (iii) depositing the second adhesive layer 606 on the tapered top surface, (iv) beveling the top portion 608 to have a tapered bottom surface (e.g., 608a-b-608d-b), a top portion inner sidewall (e.g., 608a-i-608d-i), and a top portion outer sidewall (e.g., 608a-o-608d-o), and (v) attaching the tapered bottom surface to the top surface of the second adhesive layer 606, in which the top portion inner sidewall is in a same vertical plane as the bottom portion inner sidewall and the top portion outer sidewall is in a same vertical plane as the bottom portion outer sidewall.

Some embodiments may further include forming a fan-out package 900 on top of the package substrate 200. In some embodiments, forming the stiffener structure (e.g., 610, 612, 613) may include (i) beveling the bottom portion 602 to have a tapered top surface (e.g., 602a-t-602d-t), a bottom portion inner sidewall (e.g., 602a-i-602d-i), and a bottom portion outer sidewall (e.g., 602a-o-602d-o), (ii) depositing the second adhesive layer 606 on the tapered top surface, (iii) beveling the top portion 608 to have a tapered bottom surface (e.g., 608a-b-608d-b), a top portion inner sidewall (e.g., 608a-i-608d-i), and a top portion outer sidewall (e.g., 608a-o-608d-o), (iv) attaching the tapered bottom surface to the top surface of the second adhesive layer 606, in which the top portion inner sidewall is in a same vertical plane as the bottom portion inner sidewall and the top portion outer sidewall is in a same vertical plane as the bottom portion outer sidewall, and (v) attaching a bottom surface of the bottom portion 602 to the top surface of the first adhesive layer 604, in which the bottom portion inner sidewall and top portion inner sidewall may be proximate to the fan-out package 900 and the bottom portion outer sidewall and top portion outer sidewall may be distal from the fan-out package 900.

It is to be noted that the order of operations concerning the beveling of the stiffener structure (e.g., 610, 612, 613) is not critical to the implementation of the invention, and the stiffener structure may be formed before or after any of the steps 3010, 3020, and 3030. For example, the various stiffener structures may be formed in large, manufactured batches prior to the formation of any package substrate 200 in preparation of attaching them to chip package structures including a package substrate 200 and fan-out package 900.

Referring to all drawings and according to various embodiments of the present disclosure, a chip package structure 615 is provided, which may include: a package substrate 200; a first adhesive layer 604 attached to a top surface of the package substrate 200; and a beveled stiffener structure (e.g., 610, 612, 613) attached to the package substrate 200, the beveled stiffener structure including: a bottom portion (e.g., 602, 603) including a tapered top surface (e.g., 602a-t-602d-t, 603a-t-603d-t) in which a bottom surface (e.g., 602a-b-602d-b) of the bottom portion is in contact with the first adhesive layer 604, a second adhesive layer 606 attached to the tapered top surface, and a top portion (e.g., 608, 609) including a tapered bottom surface (e.g., 608a-b-608d-b, 609a-b-609d-b), in which the tapered bottom surface is in contact with the second adhesive layer 606.

Some embodiments may further include a fan-out package 900 attached to the package substrate 200, in which the beveled stiffener structure may surround the fan-out package 900. In some embodiments, the bottom portion (e.g., 602, 603) may include a bottom portion inner sidewall (e.g., 602a-i-602d-i, 603a-i-603d-i) proximate to the fan-out package 900, and a bottom portion outer sidewall (e.g., 602a-o-602d-o, 603a-o-603d-o) distal from the fan-out package 900, in which the bottom portion inner sidewall has a first height (e.g., Bi) that is different from a second height (e.g., $B_o$) of the bottom portion outer sidewall. In some embodiments, the top portion (e.g., 608, 609) may include a top portion inner sidewall (e.g., 608a-i-608d-i, 609a-i-609d-i) proximate to the fan-out package 900, and a top portion outer sidewall (e.g., 608a-o-608d-o, 609a-o-609d-o) distal from the fan-out package 900, in which the top portion inner sidewall has a third height (e.g., Ti) that is different from a fourth height (e.g., To) of the top portion outer sidewall. In some embodiments, the first height may be greater than the second height, and the third height may be less than the fourth height. In some embodiments, the first height may be less than the second height, and the third height may be greater than the fourth height. In some embodiments, an inner sidewall total height (e.g., Bi+Ti) of the first height plus the third height is equal to an outer sidewall total height (e.g., Bo+To) of the second height plus the fourth height.

In some embodiments, the bottom portion inner sidewall (e.g., 602a-i-602d-i, 603a-i-603d-i) may be in a same vertical plane as the top portion inner sidewall (e.g., 608a-i-608d-i, 609a-i-609d-i), and the bottom portion outer sidewall (e.g., 602a-o-602d-o, 603a-o-603d-o) may be in a same vertical plane as the top portion outer sidewall (e.g., 608a-o-608d-o, 609a-o-609d-o).

In some embodiments, the tapered top surface (e.g., 602a-t-602d-t, 603a-t-603d-t) may be parallel to the tapered bottom surface (e.g., 608a-b-608d-b, 609a-b-609d-b). In some embodiments, the tapered top surface and the tapered bottom surface may have a taper angle θ in a range between 5 degrees and 60 degrees with respect to a top surface of the package substrate 200. In some embodiments, a coefficient of thermal expansion (CTE) of the bottom portion (e.g., 602, 603) may be different than a CTE of the top portion (e.g., 608, 609).

In some embodiments, the chip package structure 615 may further include a thermal interface material (TIM) 500 deposited on a top surface of a fan-out package 900 surrounded by the beveled stiffener structure. In some embodiments, the top portion (e.g., 608, 609) may further include a lid portion (e.g., lid-type top portion 611) having a bottom surface that is in contact with a top surface of the TIM 500.

In some embodiments, the tapered top surface (e.g., 602a-t-602d-t, 603a-t-603d-t) may have an extruded portion and the tapered bottom surface (e.g., 608a-b-608d-b, 609a-b-609d-b) may have a receptive portion configured to receive the extruded portion. In some embodiments, the tapered bottom surface may have an extruded portion and the tapered top surface may have a receptive portion configured to receive the extruded portion.

According to another aspect of the present disclosure, a stiffener structure for attaching to a top surface of a package substrate 200 is provided, which may include: at least one sidewall including a bottom portion (e.g., 602, 603) including a tapered top surface (e.g., 602a-t-602d-t, 603a-t-603d-t), an adhesive layer 604 attached to the tapered top surface, and a top portion (e.g., 608, 609) including a tapered bottom surface (e.g., 608a-b-608d-b, 609a-b-609d-b), in which the tapered bottom surface is in contact with the adhesive layer 604.

In some embodiments, the at least one sidewall may include a first sidewall including a first bottom portion (e.g., 602, 603) including a first tapered top surface (e.g., 602a-t-602d-t, 603a-t-603d-t) having a first taper angle, the adhesive layer (e.g., 606) attached to the first tapered top surface, and a first top portion (e.g., 608, 609) including a first tapered bottom surface (e.g., 608a-b-608d-b, 609a-b-609d-b) having the first taper angle, in which the first tapered bottom surface is in contact with the top surface of the adhesive layer. The at least one sidewall may further include a second sidewall including a second bottom portion (e.g., 602, 603) including a second tapered top surface (e.g., 602a-t-602d-t, 603a-t-603d-t) having a second taper angle, the adhesive layer attached to the second tapered top surface, and a second top portion (e.g., 608, 609) including a second tapered bottom surface (e.g., 608a-b-608d-b, 609a-b-609d-b) having the second taper angle, in which the second tapered bottom surface is in contact with the top surface of the adhesive layer. In some embodiments, the first taper angle may be a different angle than the second taper angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a chip package structure, comprising:
   forming a package substrate;

forming a first adhesive layer attached to a top surface of the package substrate; and forming, on a top surface of the first adhesive layer, a stiffener structure including a bottom portion with a tapered top surface, a second adhesive layer attached to the tapered top surface, and a top portion with a tapered bottom surface that is in contact with the second adhesive layer, wherein forming the stiffener structure comprises:

attaching a bottom surface of the bottom portion to the top surface of the first adhesive layer, wherein a bottom portion inner sidewall is proximate to the fan-out package and a bottom portion outer sidewall is distal from the fan-out package; and attaching the tapered bottom surface to the top surface of the second adhesive layer, wherein a top portion inner sidewall is in a same vertical plane as the bottom portion inner sidewall and a top portion outer sidewall is in a same vertical plane as the bottom portion outer sidewall.

2. The method of claim 1, further comprising:
forming a fan-out package on top of the package substrate;
wherein forming, on the top surface of the first adhesive layer, the stiffener structure further comprises:
beveling the bottom portion to have the tapered top surface, the bottom portion inner sidewall, and the bottom portion outer sidewall;
depositing the second adhesive layer on the tapered top surface; and
beveling the top portion to have the tapered bottom surface, the top portion inner sidewall, and the top portion outer sidewall.

3. The method of claim 1, further comprising:
forming a fan-out package on top of the package substrate;
wherein forming, on the top surface of the first adhesive layer, the stiffener structure further comprises:
beveling the bottom portion to have the tapered top surface, the bottom portion inner sidewall, and the bottom portion outer sidewall;
depositing the second adhesive layer on the tapered top surface; and
beveling the top portion to have the tapered bottom surface, the top portion inner sidewall, and the top portion outer sidewall;
attaching the bottom surface of the bottom portion to the top surface of the first adhesive layer, such that the top portion inner sidewall is proximate to the fan-out package and the top portion outer sidewall is distal from the fan-out package.

4. The method of claim 1, wherein the tapered top surface and the tapered bottom surface have a taper angle in a range between 5 degrees and 60 degrees with respect to a top surface of the package substrate.

5. The method of claim 1, wherein a coefficient of thermal expansion (CTE) of the bottom portion is different than a CTE of the top portion.

6. The method of claim 1, wherein the tapered top surface has an extruded portion, and the tapered bottom surface has a receptive portion.

7. The method of claim 1, wherein the tapered bottom surface has an extruded portion, and the tapered top surface has a receptive portion.

8. The method of claim 1, further comprising depositing a thermal interface material on a top surface of a fan-out package surrounded by the beveled stiffener structure.

9. The method of claim 8, further comprising forming a lid portion having a bottom surface that is in contact with a top surface of the thermal interface material.

10. A method of forming a chip package structure, comprising:
forming a package substrate;
forming a fan-out package on a portion of a top of the package substrate;
forming a first adhesive layer on a second portion on the top surface of the package substrate; and
forming a stiffener structure on a top surface of the first adhesive layer, comprising:
beveling a bottom portion to have a tapered top surface, a bottom portion inner sidewall, and a bottom portion outer sidewall;
attaching a bottom surface of the bottom portion to the top surface of the first adhesive layer, wherein the bottom portion inner sidewall is proximate to the fan-out package and the bottom portion outer sidewall is distal from the fan-out package;
depositing a second adhesive layer on the tapered top surface;
beveling a top portion to have a tapered bottom surface, a top portion inner sidewall, and a top portion outer sidewall; and
attaching the tapered bottom surface to the top surface of the second adhesive layer, wherein the top portion inner sidewall is in a same vertical plane as the bottom portion inner sidewall and the top portion outer sidewall is in a same vertical plane as the bottom portion outer sidewall.

11. The method of claim 10, wherein the tapered top surface and the tapered bottom surface have a taper angle in a range between 5 degrees and 60 degrees with respect to a top surface of the package substrate.

12. The method of claim 10, further comprising:
depositing a thermal interface material on a top surface of a fan-out package surrounded by the beveled stiffener structure; and
forming a lid portion having a bottom surface that is in contact with a top surface of the thermal interface material.

13. The method of claim 10, wherein a height of the bottom portion inner sidewall is greater than a height of the bottom portion outer sidewall and a height of the top portion inner sidewall is less than a height of the top portion outer sidewall.

14. The method of claim 10, wherein a height of the bottom portion inner sidewall is less than a height of the bottom portion outer sidewall and a height of the top portion inner sidewall is greater than a height of the top portion outer sidewall.

15. A method of forming a chip package structure, comprising:
forming a package substrate;
forming a fan-out package on a portion of a top of the package substrate;
forming a first adhesive layer on a second portion on the top surface of the package substrate; and
forming a stiffener structure on a top surface of the first adhesive layer, comprising:
beveling a bottom portion to have a tapered top surface, a bottom portion inner sidewall, and a bottom portion outer sidewall;
depositing a second adhesive layer on the tapered top surface;

beveling a top portion to have a tapered bottom surface, a top portion inner sidewall, and a top portion outer sidewall;

attaching the tapered bottom surface to the top surface of the second adhesive layer, wherein the top portion inner sidewall is in a same vertical plane as the bottom portion inner sidewall and the top portion outer sidewall is in a same vertical plane as the bottom portion outer sidewall; and attaching a bottom surface of the bottom portion to the top surface of the first adhesive layer, wherein the bottom portion inner sidewall and top portion inner sidewall are proximate to the fan-out package and the bottom portion outer sidewall and top portion outer sidewall are distal from the fan-out package.

16. The method of claim 15, wherein the tapered top surface and the tapered bottom surface have a taper angle in a range between 5 degrees and 60 degrees with respect to a top surface of the package substrate.

17. The method of claim 15, wherein a coefficient of thermal expansion (CTE) of the bottom portion is different than a CTE of the top portion.

18. The method of claim 15, wherein a height of the bottom portion inner sidewall is greater than a height of the bottom portion outer sidewall and a height of the top portion inner sidewall is less than a height of the top portion outer sidewall.

19. The method of claim 15, wherein a height of the bottom portion inner sidewall is less than a height of the bottom portion outer sidewall and a height of the top portion inner sidewall is greater than a height of the top portion outer sidewall.

20. The method of claim 15, further comprising:
depositing a thermal interface material on a top surface of a fan-out package surrounded by the beveled stiffener structure; and
forming a lid portion having a bottom surface that is in contact with a top surface of the thermal interface material.

* * * * *